US009646991B2

(12) United States Patent
Masuoka et al.

(10) Patent No.: US 9,646,991 B2
(45) Date of Patent: May 9, 2017

(54) SEMICONDUCTOR DEVICE WITH SURROUNDING GATE TRANSISTORS IN A NOR CIRCUIT

(71) Applicant: UNISANTIS ELECTRONICS SINGAPORE PTE. LTD., Singapore (SG)

(72) Inventors: Fujio Masuoka, Tokyo (JP); Masamichi Asano, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/932,185

(22) Filed: Nov. 4, 2015

(65) Prior Publication Data

US 2016/0056174 A1    Feb. 25, 2016

Related U.S. Application Data

(63) Continuation of application No. PCT/JP2013/073629, filed on Sep. 3, 2013.

(51) Int. Cl.
*H01L 27/118* (2006.01)
*H01L 27/092* (2006.01)
(Continued)

(52) U.S. Cl.
CPC ......... *H01L 27/11807* (2013.01); *H01L 21/823885* (2013.01); *H01L 27/092* (2013.01);
(Continued)

(58) Field of Classification Search
CPC ......... H01L 21/823885; H01L 29/7827; H01L 29/66666; H01L 27/11807; H02L 29/78642
See application file for complete search history.

(56) References Cited

U.S. PATENT DOCUMENTS 4,756,221 A    7/1988 Nitschmann et al.
5,031,809 A    7/1991 Roberts et al.
(Continued)

FOREIGN PATENT DOCUMENTS

JP    4487221 B1    6/2010
JP    2011108702 A    6/2011
(Continued)

OTHER PUBLICATIONS

Hirokazu Yoshizawa, CMOS OP AMP Kairo Jitsumu Sekkei No Kiso (CMOS OP Amplifier Circuit, Basis of Practical Design), CQ Publishing Co., Ltd., May 15, 2007. p. 23.

*Primary Examiner* — Khiem D Nguyen
(74) *Attorney, Agent, or Firm* — Laurence Greenberg; Werner Stemer; Ralph Locher

(57) ABSTRACT

A semiconductor device employs surrounding gate transistors (SGTs) which are vertical transistors to constitute a CMOS NOR circuit. The NOR circuit is formed by using a plurality of MOS transistors arranged in m rows and n columns. The MOS transistors constituting the NOR circuit are formed on a planar silicon layer disposed on a substrate, and each have a structure in which a drain, a gate, and a source are arranged in a vertical direction, the gate surrounding a silicon pillar. The planar silicon layer includes a first active region having a first conductivity type and a second active region having a second conductivity type. The first active region and the second active region are connected to one another via a silicon layer formed on a surface of the planar silicon layer. This provides for a semiconductor device that constitutes a NOR circuit.

5 Claims, 58 Drawing Sheets

(51) Int. Cl.
*H01L 29/66* (2006.01)
*H01L 29/78* (2006.01)
*H01L 29/786* (2006.01)
*H01L 21/8238* (2006.01)
*H01L 27/12* (2006.01)
*H01L 29/423* (2006.01)

(52) U.S. Cl.
CPC .... *H01L 27/1203* (2013.01); *H01L 29/66666* (2013.01); *H01L 29/7827* (2013.01); *H01L 29/7841* (2013.01); *H01L 29/78642* (2013.01); *H01L 29/42392* (2013.01); *H01L 2027/11866* (2013.01); *H01L 2027/11881* (2013.01)

(56) References Cited

U.S. PATENT DOCUMENTS

| | | | |
|---|---|---|---|
| 5,130,596 | A | 7/1992 | Umeki |
| 8,039,893 | B2 | 10/2011 | Masuoka |
| 8,247,298 | B2 * | 8/2012 | Ohtsuka ............ H01L 21/76232 257/E21.384 |
| 8,901,640 | B2 | 12/2014 | Masuoka et al. |
| 2007/0052012 | A1 * | 3/2007 | Forbes .................. B82Y 10/00 257/328 |
| 2010/0213525 | A1 * | 8/2010 | Masuoka ........ H01L 21/823828 257/306 |
| 2010/0219483 | A1 | 9/2010 | Masuoka et al. |
| 2011/0115011 | A1 * | 5/2011 | Masuoka ........ H01L 21/823431 257/314 |
| 2013/0307083 | A1 * | 11/2013 | Masuoka .............. H01L 27/092 257/369 |

FOREIGN PATENT DOCUMENTS

| | | |
|---|---|---|
| JP | 4756221 B2 | 8/2011 |
| JP | 5031809 B2 | 9/2012 |
| JP | 5130596 B2 | 1/2013 |
| WO | 2009096465 A1 | 8/2009 |
| WO | 2011043402 A1 | 4/2011 |

* cited by examiner

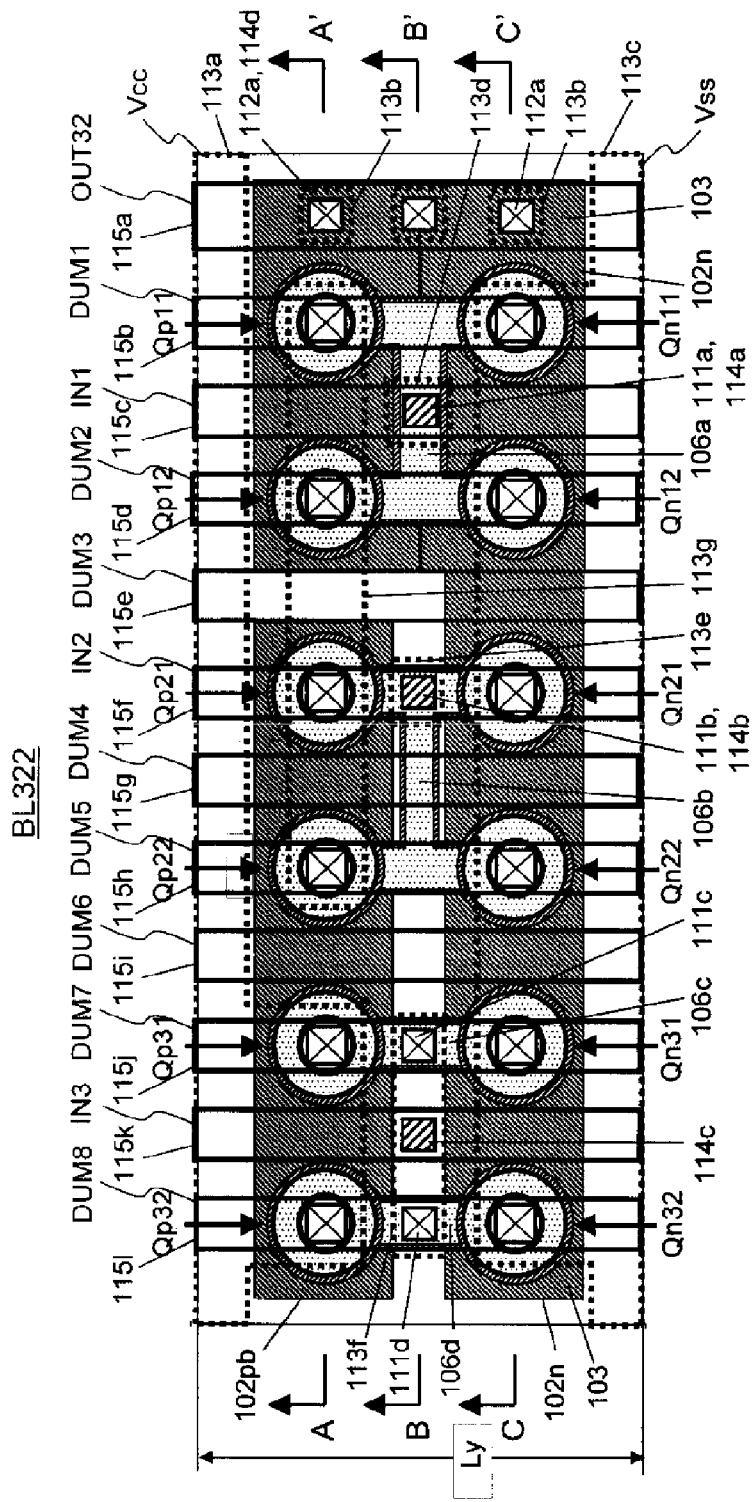

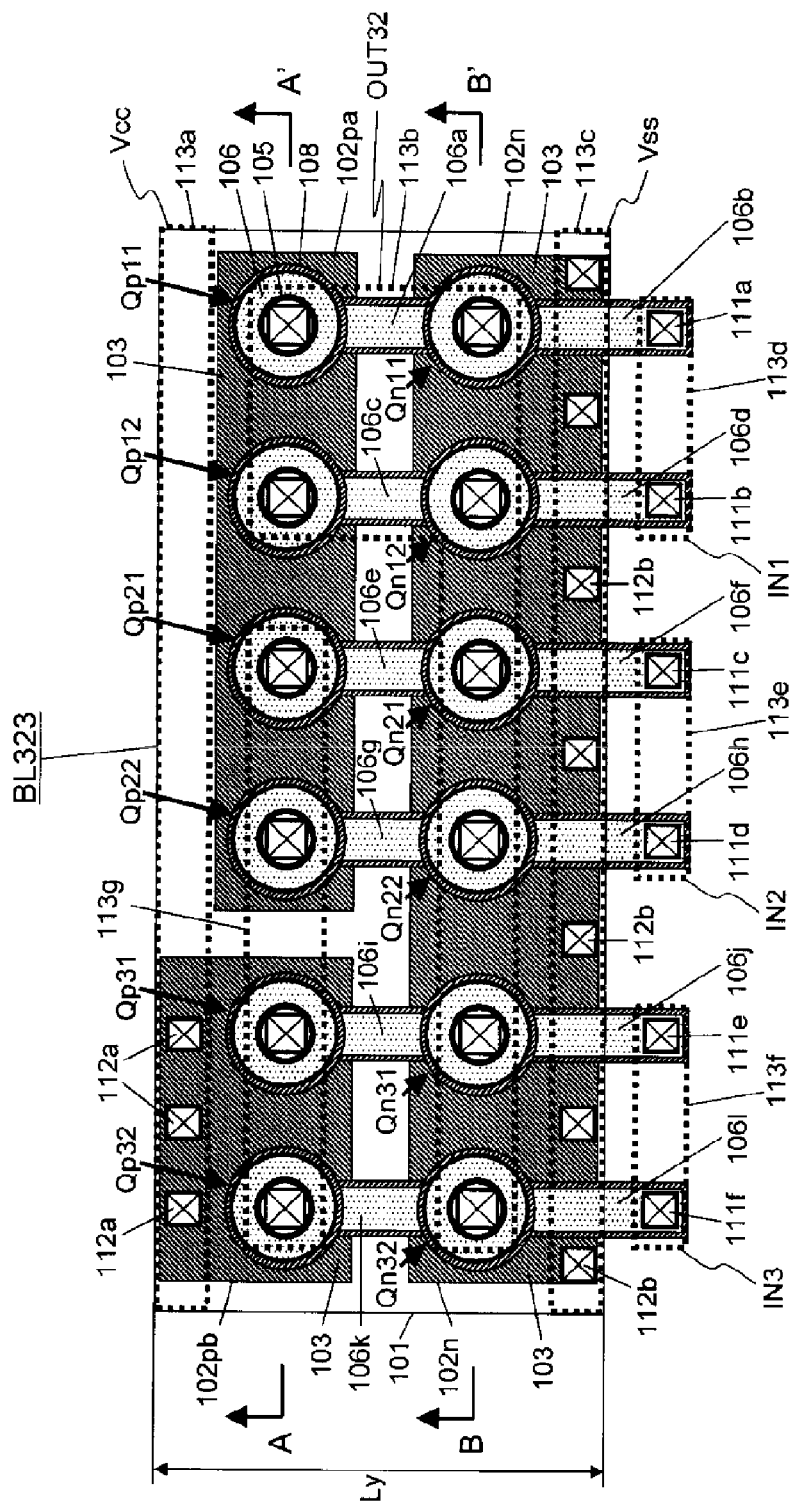

US 9,646,991 B2

SEMICONDUCTOR DEVICE WITH SURROUNDING GATE TRANSISTORS IN A NOR CIRCUIT

CROSS REFERENCE TO RELATED APPLICATIONS

This application is a continuation of international patent application PCT/JP2013/073629, filed Sep. 3, 2013, the entire contents of which are incorporated herein by reference.

BACKGROUND OF THE INVENTION

Field of the Invention

The present invention relates to a semiconductor device.

Description of the Related Art

With the recent increase in the integration of semiconductor integrated circuits, semiconductor chips having as large a number of transistors as 1,000,000,000 (1 Giga (G)), have been developed for state-of-the-art micro-processing units (MPUs). As disclosed by Hirokazu YOSHIZAWA in "Shi mosu opi anpu kairo jitsumu sekkei no kiso (Fundamentals on CMOS OP amp circuit design for practical use)", CQ Publishing Co., Ltd., page 23, conventional transistors formed in a planar manner, called planar transistors, require complete isolation of an n-well region which forms a p-channel metal-oxide semiconductor (PMOS) and a p-type silicon substrate (or p-well region) which forms an n-channel metal-oxide semiconductor (NMOS) from each other. In addition, the n-well region and the p-type silicon substrate require body terminals for applying potentials thereto, which will contribute to a further increase in the area of the transistors.

To address the issues described above, a surrounding gate transistor (SGT) having a structure in which a source, a gate, and a drain are arranged in a direction perpendicular to a substrate and in which the gate surrounds an island-shaped semiconductor layer has been proposed, and a method for manufacturing an SGT and a complementary metal-oxide semiconductor (CMOS) inverter, a NAND circuit, or a static random access memory (SRAM) cell which employs SGTs are disclosed (see, for example, U.S. Pat. No. 8,039,893 B2 and its counterpart Japanese Patent No. 5130596; U.S. Pat. No. 8,901,640 B2 and its counterpart Japanese Patent No. 5031809; Japanese Patent No. 4756221, and published application No. US 2010/0219483 A1 and its counterpart International Publication No. WO2009/096465).

FIG. 19, FIG. 20A, and FIG. 20B illustrate a circuit diagram and layout diagrams of an inverter that employs SGTs.

FIG. 19 is a circuit diagram of the inverter. The symbol Qp denotes a p-channel MOS transistor (hereinafter referred to as a "PMOS transistor"), the symbol Qn denotes an n-channel MOS transistor (hereinafter referred to as an "NMOS transistor"), the symbol IN denotes an input signal, the symbol OUT denotes an output signal, the symbol Vcc denotes a power supply, and the symbol Vss denotes a reference power supply.

FIG. 20A illustrates a plan view of a layout of the inverter illustrated in FIG. 19, which is formed of SGTs, by way of example. FIG. 20B illustrates a cross-sectional view taken along a cut-line A-A' in the plan view of FIG. 20A.

In FIG. 20A and FIG. 20B, an insulating film such as a buried oxide (BOX) film layer 1 disposed on a substrate has formed thereon planar silicon layers 2p and 2n. The planar silicon layers 2p and 2n are formed as a p+ diffusion layer and an n+ diffusion layer, respectively, through impurity implantation or the like. A silicide layer 3 disposed on surfaces of the planar silicon layers (2p and 2n) connects the planar silicon layers 2p and 2n to one another. Reference numeral 4n denotes an n-type silicon pillar, and reference numeral 4p denotes a p-type silicon pillar. Reference numeral 5 denotes a gate insulating film that surrounds each of the silicon pillars 4n and 4p. Reference numeral 6 denotes a gate electrode, and reference numeral 6a denotes a gate line. A p+ diffusion layer 7p and an n+ diffusion layer 7n are formed on top portions of the silicon pillars 4n and 4p, respectively, through impurity implantation or the like. Reference numeral 8 denotes a silicon nitride film for protection of the gate insulating film 5 and the like. Reference numerals 9p and 9n denote silicide layers connected to the p+ diffusion layer 7p and the n+ diffusion layer 7n, respectively. Reference numerals 10p and 10n denote contacts that connect the silicide layers 9p and 9n to metal lines 13a and 13b, respectively. Reference numeral 11 denotes a contact that connects the gate line 6a to a metal line 13c. In the following, the planar silicon layers 2p and 2n are also referred to as the lower diffusion layers 2p and 2n, and the diffusion layers 7p and 7n are also referred to as the upper diffusion layers 7p and 7n.

The silicon pillar 4n, the lower diffusion layer 2p, the upper diffusion layer 7p, the gate insulating film 5, and the gate electrode 6 constitute the PMOS transistor Qp. The silicon pillar 4p, the lower diffusion layer 2n, the upper diffusion layer 7n, the gate insulating film 5, and the gate electrode 6 constitute the NMOS transistor Qn. Each of the upper diffusion layers 7p and 7n serves as a source, and each of the lower diffusion layers 2p and 2n serves as a drain. The metal line 13a is supplied with the power supply Vcc, and the metal line 13b is supplied with the reference power supply Vss. The input signal IN is connected to the metal line 13c. The output signal OUT is output from the silicide layer 3 that connects the lower diffusion layer 2p serving as the drain of the PMOS transistor Qp to the lower diffusion layer 2n serving as the drain of the NMOS transistor Qn.

The inverter that employs SGTs illustrated in FIG. 19, FIG. 20A, and FIG. 20B has a feature of enabling a very compact layout (arrangement) since the PMOS transistor and the NMOS transistor are structurally isolated completely from each other, eliminating the need for isolation of wells unlike planar transistors, and, in addition, since the silicon pillars are used as floating bodies, eliminating the need for any body terminals for supplying potentials to the wells unlike planar transistors.

As described above, the most outstanding feature of SGTs is that it is possible to utilize, in terms of structural principles, a lower-layer line implemented in a silicide layer located close to a substrate below a silicon pillar and an upper line implemented by connection via a contact above the silicon pillar.

SUMMARY OF THE INVENTION

The present invention provides low-cost logic semiconductor devices taking advantage of the features of SGTs described above, in which NOR circuits each having inputs the number of which is equal to g, which are well used in logic circuits, are arranged in m rows and n columns to achieve a compact arrangement with a minimum area.

An embodiment of the present invention provides a semiconductor device including a plurality of transistors arranged in two rows and n columns on a substrate, where n≥2, to constitute a NOR circuit, each of the plurality of transistors having a source, a drain, and a gate arranged in layers in a direction perpendicular to the substrate. Each of the plurality of transistors includes a silicon pillar, an insulator that surrounds a side surface of the silicon pillar, a gate that surrounds the insulator, a source region disposed on an upper portion or a lower portion of the silicon pillar, and a drain region disposed on an upper portion or a lower portion of the silicon pillar, the drain region being located on a side of the silicon pillar opposite to a side of the silicon pillar on which the source region is located. The plurality of transistors include n n-channel MOS transistors arranged in one row and n columns, and n p-channel MOS transistors arranged in one row and n columns. The n n-channel MOS transistors and the n p-channel MOS transistors are arranged such that: an n-channel MOS transistor in a k-th column and a p-channel MOS transistor in the k-th column form a pair, where k=1 to n, the gate of the n-channel MOS transistor in the k-th column and the gate of the p-channel MOS transistor in the k-th column being connected to one another; the drain regions of the n n-channel MOS transistors and the drain region of a p-channel MOS transistor in a first column are located on a side of the silicon pillars close to the substrate, the drain regions of the n n-channel MOS transistors and the drain region of the p-channel MOS transistor in the first column being connected to one another via a silicide region; and the source region of a p-channel MOS transistor in an s-th column and the drain region of a p-channel MOS transistor in an (s+1)-th column are connected to one another, where s=1 to n−1.

In a preferred embodiment of the present invention, in the semiconductor device, the source regions of the n n-channel MOS transistors may be connected to a reference power supply line extending along a row, and the source region of a p-channel MOS transistor in an n-th column may be connected to a power supply line extending along a row.

In another embodiment, in the semiconductor device, the n p-channel MOS transistors may be arranged such that the source region of a p-channel MOS transistor in an even-numbered column is located on the side of the silicon pillar close to the substrate.

In another embodiment, in the semiconductor device, n input signals may be connected to gates of n pairs of transistors whose gates are connected to one another so that each of the n input signals corresponds to gates of one of the n pairs of transistors.

In another embodiment, in the semiconductor device, each of the power supply line and the reference power supply line may be a first metal line, and each of the n input signals may be a second metal line extending in a direction perpendicular to the power supply line and the reference power supply line.

Another preferred embodiment of the present invention provides a semiconductor device including a plurality of transistors arranged in two rows and n columns on a substrate, where n≥4, to constitute a NOR circuit having g input signals, where n=h×g, g and h being each an integer, each of the plurality of transistors having a source, a drain, and a gate arranged in layers in a direction perpendicular to the substrate. Each of the plurality of transistors includes a silicon pillar, an insulator that surrounds a side surface of the silicon pillar, a gate that surrounds the insulator, a source region disposed on an upper portion or a lower portion of the silicon pillar, and a drain region disposed on an upper portion or a lower portion of the silicon pillar, the drain region being located on a side of the silicon pillar opposite to a side of the silicon pillar on which the source region is located. The plurality of transistors include n n-channel MOS transistors arranged in one row and n columns, and n p-channel MOS transistors arranged in one row and n columns. The n n-channel MOS transistors and the n p-channel MOS transistors are arranged such that: an n-channel MOS transistor in a k-th column and a p-channel MOS transistor in the k-th column form a pair, where k=1 to n, the gate of the n-channel MOS transistor in the k-th column and the gate of the p-channel MOS transistor in the k-th column being connected to one another; the drain regions of the n n-channel MOS transistors and the drain regions of h p-channel MOS transistors in first to h-th columns are located on a side of the silicon pillars close to the substrate, and are connected to one another via a silicide region; and the n columns are grouped into g sets each having h columns, and the source regions of p-channel MOS transistors in a g-th set and the drain regions of p-channel MOS transistors in a (g+1)-th set are connected to one another.

In another embodiment, in the semiconductor device, the source regions of the n n-channel MOS transistors may be connected to a reference power supply line extending along a row, and the source regions of h p-channel MOS transistors in a last set among the g sets may be connected to a power supply line extending along a row.

In another embodiment, in the semiconductor device, h p-channel MOS transistors grouped in the g-th set may be arranged such that the source regions of p-channel MOS transistors in an even-numbered set are located on the side of the silicon pillars close to the substrate.

In another embodiment, in the semiconductor device, each of the g input signals may be connected to gates of arbitrary h pairs of transistors among n sets of pairs of transistors whose gates are connected to one another.

In another embodiment, in the semiconductor device, each of the power supply line and the reference power supply line may be a first metal line, and each of the g input signals may be a second metal line extending in a direction perpendicular to the power supply line and the reference power supply line.

Another preferred embodiment of the present invention provides a semiconductor device including a plurality of transistors arranged in m rows and n columns on a substrate, where m≥3 and n≥2, to constitute a NOR circuit, each of the plurality of transistors having a source, a drain, and a gate arranged in layers in a direction perpendicular to the substrate. Each of the plurality of transistors includes a silicon pillar, an insulator that surrounds a side surface of the silicon pillar, a gate that surrounds the insulator, a source region disposed on an upper portion or a lower portion of the silicon pillar, and a drain region disposed on an upper portion or a lower portion of the silicon pillar, the drain region being located on a side of the silicon pillar opposite to a side of the silicon pillar on which the source region is located. The plurality of transistors include i×n n-channel MOS transistors arranged in i rows and n columns, and j×n p-channel MOS transistors arranged in j rows and n columns, where i+j=m. The i×n n-channel MOS transistors and the j×n p-channel MOS transistors are arranged such that: i n-channel MOS transistors in a k-th column and j p-channel MOS transistors in the k-th column form a set, where k=1 to n, the gates of the i n-channel MOS transistors in the k-th column and the gates of the j p-channel MOS transistors in the k-th column being connected to one another; the drain regions of the i×n n-channel MOS transistors and the drain regions of j p-channel MOS transistors in a first column are located on a side of the silicon pillars close to the substrate, the drain regions of the i×n n-channel MOS transistors and the drain regions of the j p-channel MOS transistors in the first column being connected to one another via a silicide region; and the source regions of j p-channel MOS transistors in an s-th column and the drain regions of j p-channel MOS transistors in an (s+1)-th column are connected to one another, where s=1 to n−1.

In another embodiment, in the semiconductor device, the source regions of the i×n n-channel MOS transistors may be connected to a reference power supply line extending along a row, and the source regions of j p-channel MOS transistors in an n-th column may be connected to a power supply line extending along a row.

In another embodiment, in the semiconductor device, the j×n p-channel MOS transistors may be arranged such that the source regions of j p-channel MOS transistors in an even-numbered column are located on the side of the silicon pillars close to the substrate.

In another embodiment, in the semiconductor device, n input signals may be connected to gates of n sets of transistors whose gates are connected to one another so that each of the n input signals corresponds to gates of one of the n sets of transistors.

In another embodiment, in the semiconductor device, each of the power supply line and the reference power supply line may be a first metal line, and each of the n input signals may be a second metal line extending in a direction perpendicular to the power supply line and the reference power supply line.

Another preferred embodiment of the present invention provides a semiconductor device including a plurality of transistors arranged in m rows and n columns on a substrate, where m≥2 and n≥2, to constitute a NOR circuit having g input signals, where n=h×g, g and h being each an integer, each of the plurality of transistors having a source, a drain, and a gate arranged in layers in a direction perpendicular to the substrate. Each of the plurality of transistors includes a silicon pillar, an insulator that surrounds a side surface of the silicon pillar, a gate that surrounds the insulator, a source region disposed on an upper portion or a lower portion of the silicon pillar, and a drain region disposed on an upper portion or a lower portion of the silicon pillar, the drain region being located on a side of the silicon pillar opposite to a side of the silicon pillar on which the source region is located. The plurality of transistors include i×n n-channel MOS transistors arranged in i rows and n columns, and j×n p-channel MOS transistors arranged in j rows and n columns, where i+j=m. The i×n n-channel MOS transistors and the j×n p-channel MOS transistors are arranged such that: i n-channel MOS transistors in a k-th column and j p-channel MOS transistors in the k-th column form a set, where k=1 to n, the gates of the i n-channel MOS transistors in the k-th column and the gates of the j p-channel MOS transistors in the k-th column being connected to one another; the drain regions of the i×n n-channel MOS transistors and the drain regions of j×h p-channel MOS transistors in first to h-th columns are located on a side of the silicon pillars close to the substrate; the drain regions of the i×n n-channel MOS transistors and the drain regions of the j×h p-channel MOS transistors in the first to h-th columns are connected to one another via a silicide region; and the n columns are grouped into g sets each having h columns, and the source regions of p-channel MOS transistors in a g-th set and the drain regions of p-channel MOS transistors in a (g+1)-th set are connected to one another.

In another embodiment, in the semiconductor device, the source regions of the i×n n-channel MOS transistors may be connected to a reference power supply line extending along a row, and the source regions of h p-channel MOS transistors in a last set among the g sets may be connected to a power supply line extending along a row.

In another embodiment, in the semiconductor device, j×n p-channel MOS transistors grouped in the g-th set may be arranged such that the source regions of p-channel MOS transistors in an even-numbered set are located on the side of the silicon pillars close to the substrate.

In another embodiment, in the semiconductor device, each of the g input signals may be connected to gates of arbitrary h sets of transistors among n sets of transistors whose gates are connected to one another, each of the n sets of transistors including i n-channel MOS transistors and j p-channel MOS transistors.

In another embodiment, in the semiconductor device, each of the power supply line and the reference power supply line may be a first metal line, and each of the g input signals may be a second metal line extending in a direction perpendicular to the power supply line and the reference power supply line.

Another preferred embodiment of the present invention provides a semiconductor device including a plurality of transistors arranged in m rows and n columns on a substrate, where m≥2 and n≥2, to constitute a NOR circuit having g input signals, where n=h×g, g and h being each an integer, each of the plurality of transistors having a source, a drain, and a gate arranged in layers in a direction perpendicular to the substrate. Each of the plurality of transistors includes a silicon pillar, an insulator that surrounds a side surface of the silicon pillar, a gate that surrounds the insulator, a source region disposed on an upper portion or a lower portion of the silicon pillar, and a drain region disposed on an upper portion or a lower portion of the silicon pillar, the drain region being located on a side of the silicon pillar opposite to a side of the silicon pillar on which the source region is located. The plurality of transistors include i×n n-channel MOS transistors arranged in i rows and n columns, and j×n p-channel MOS transistors arranged in j rows and n columns, where i+j=m. The i×n n-channel MOS transistors and the j×n p-channel MOS transistors are arranged such that: i n-channel MOS transistors in a k-th column and j p-channel MOS transistors in the k-th column form a set, where k=1 to n, the gates of the i n-channel MOS transistors in the k-th column and the gates of the j p-channel MOS transistors in the k-th column being connected to one another; the source regions of the i×n n-channel MOS transistors and the source regions of j×h p-channel MOS transistors in first to h-th columns are located on a side of the silicon pillars close to the substrate; the drain regions of the i×n n-channel MOS transistors and the drain regions of the j×h p-channel MOS transistors in the first to h-th columns are connected to one another via a contact; and the n columns are grouped into g sets each having h columns, and the source regions of p-channel MOS transistors in a g-th set and the drain regions of p-channel MOS transistors in a (g+1)-th set are connected to one another.

In another embodiment, in the semiconductor device, the source regions of the i×n n-channel MOS transistors may be connected to a reference power supply line extending along a row, and the source regions of h p-channel MOS transistors in a last set among the g sets may be connected to a power supply line extending along a row.

In another embodiment, in the semiconductor device, j×n p-channel MOS transistors grouped in the g-th set may be arranged such that the drain regions of p-channel MOS transistors in an even-numbered set are located on the side of the silicon pillars close to the substrate.

In another embodiment, in the semiconductor device, each of the g input signals may be connected to gates of arbitrary h sets of transistors among n sets of transistors whose gates are connected to one another, each of the n sets of transistors including i n-channel MOS transistors and j p-channel MOS transistors.

In another embodiment, in the semiconductor device, each of the power supply line and the reference power supply line may be a first metal line, and each of the g input signals may be a second metal line extending in a direction perpendicular to the power supply line and the reference power supply line.

Other features which are considered as characteristic for the invention are set forth in the appended claims.

Although the invention is illustrated and described herein as embodied in a semiconductor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 15A is a plan view of a NOR circuit according to a ninth embodiment of the present invention.

FIG. 17A is a plan view of a NOR circuit according to an eleventh embodiment of the present invention.

DESCRIPTION OF THE PREFERRED EMBODIMENTS

First Embodiment

Figure 1:
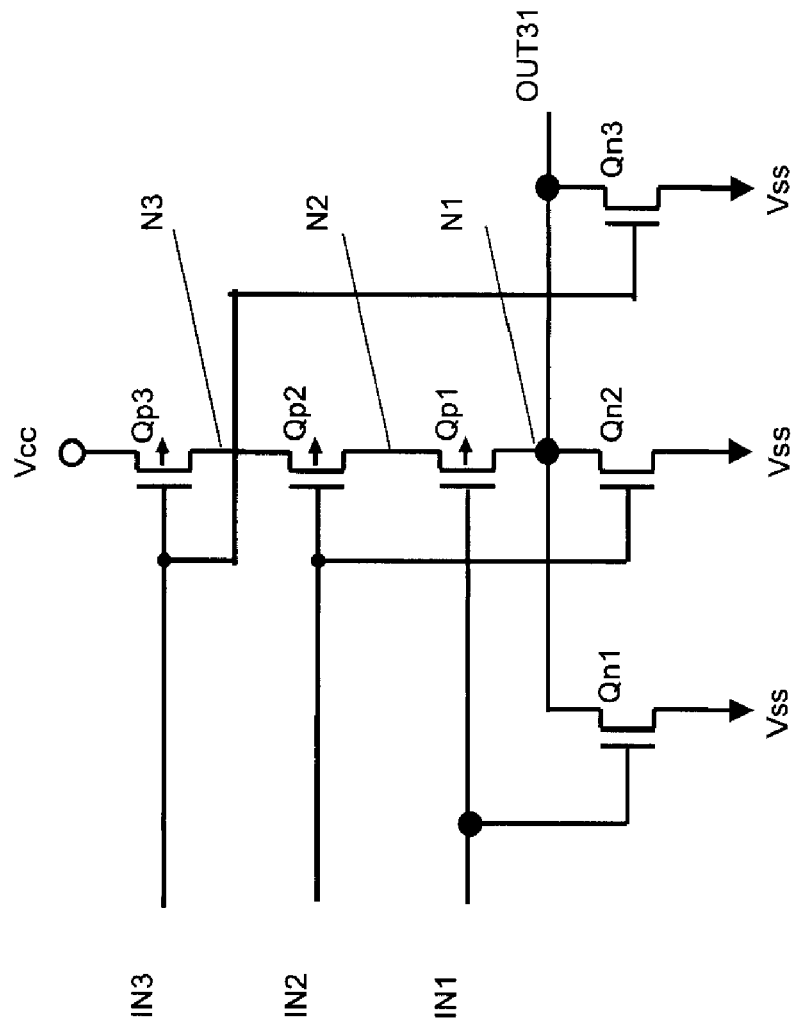
FIG. 1 is an equivalent circuit diagram illustrating a NOR circuit according to embodiments of the present invention.

FIG. 1 is an equivalent circuit diagram of a 3-input NOR circuit used in the present invention. The symbols Qn1, Qn2, and Qn3 denote NMOS transistors formed of SGTs, and the symbols Qp1, Qp2, and Qp3 denote PMOS transistors also formed of SGTs. Sources of the NMOS transistors Qn1, Qn2, and Qn3 are connected to a reference power supply Vss, and drains of the NMOS transistors Qn1, Qn2, and Qn3 are commonly connected to a node N1. The node N1 serves as an output OUT31. A drain of the PMOS transistor Qp1 is connected to the node N1, and a source of the PMOS transistor Qp1 is connected to a drain of the PMOS transistor Qp2 via a node N2. A source of the PMOS transistor Qp2 is connected to a drain of the PMOS transistor Qp3 via a node N3, and a source of the PMOS transistor Qp3 is connected to a power supply Vcc. An input signal IN1 is connected to a gate of the NMOS transistor Qn1 and a gate of the PMOS transistor Qp1, an input signal IN2 is connected to a gate of the NMOS transistor Qn2 and a gate of the PMOS transistor Qp2, and an input signal IN3 is connected to a gate of the NMOS transistor Qn3 and a gate of the PMOS transistor Qp3.

Figure 2A:
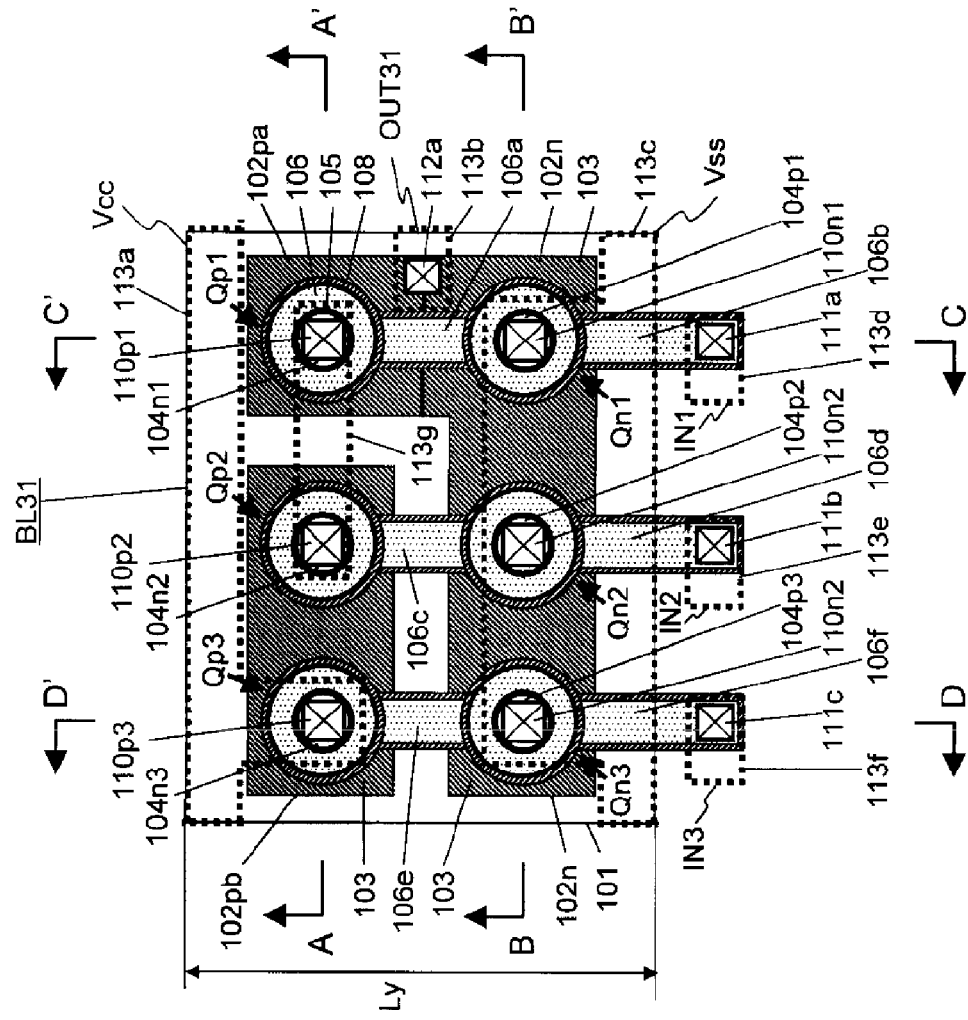
FIG. 2A is a plan view of a NOR circuit according to a first embodiment of the present invention.
Figure 2B:
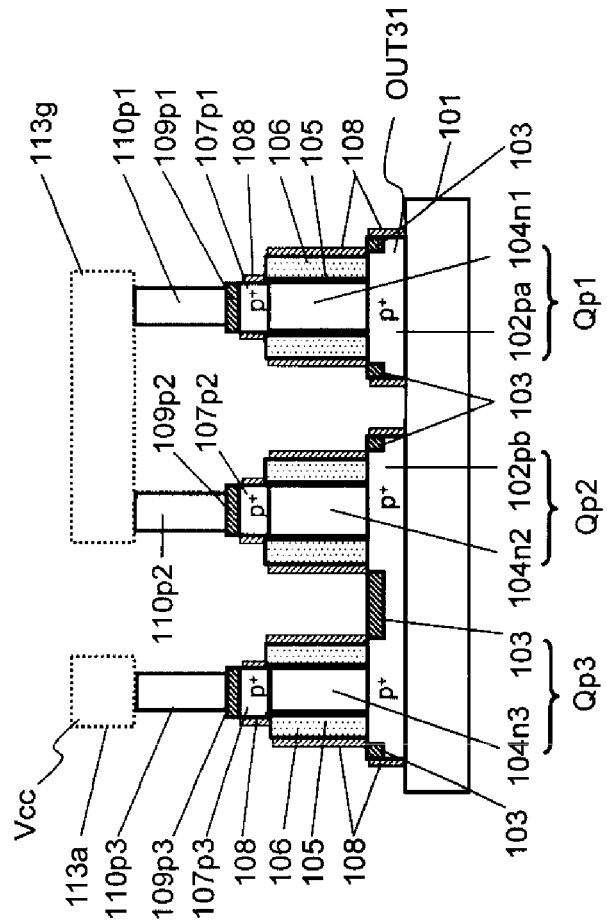
FIG. 2B is a cross-sectional view of the NOR circuit according to the first embodiment of the present invention.
Figure 2C:
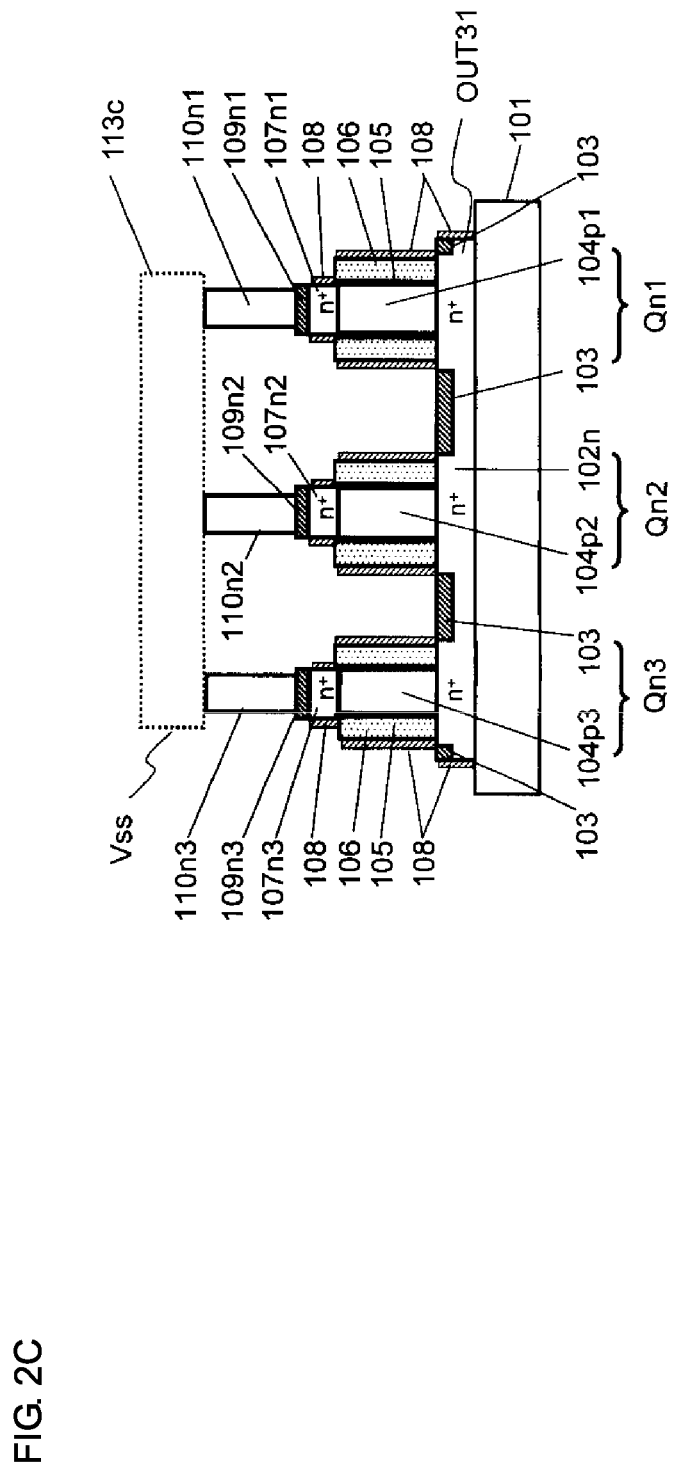
FIG. 2C is a cross-sectional view of the NOR circuit according to the first embodiment of the present invention.
Figure 2D:
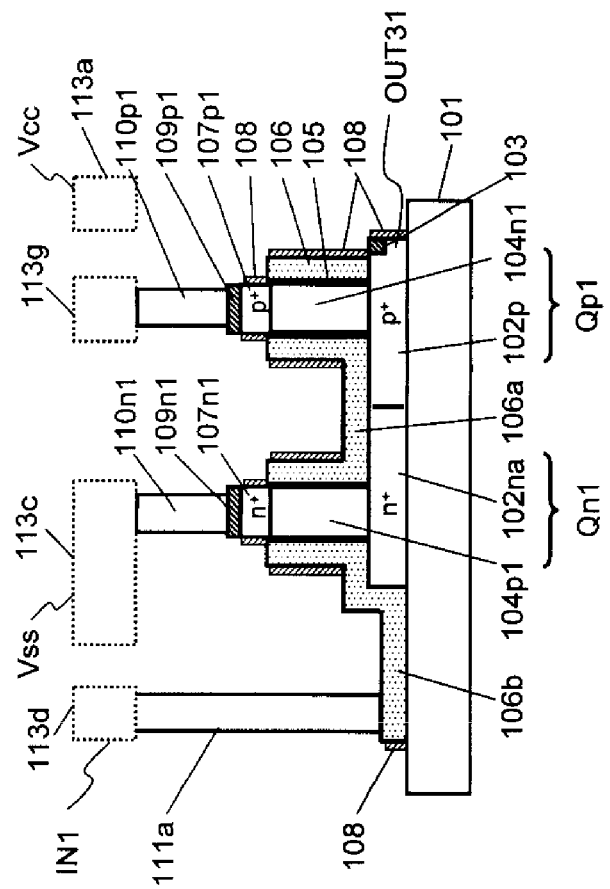
FIG. 2D is a cross-sectional view of the NOR circuit according to the first embodiment of the present invention.
Figure 2E:
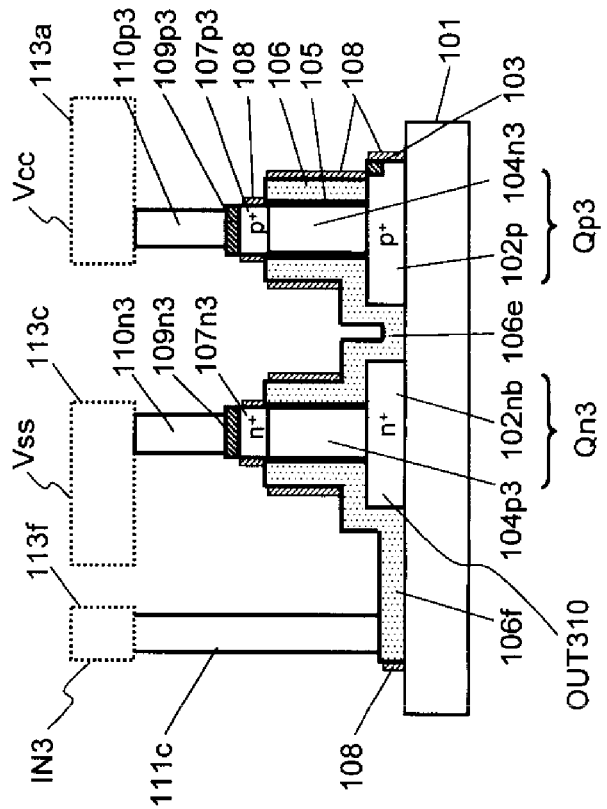
FIG. 2E is a cross-sectional view of the NOR circuit according to the first embodiment of the present invention.

FIG. 2A, FIG. 2B, FIG. 2C, FIG. 2D, and FIG. 2E illustrate a first embodiment. FIG. 2A is a plan view of a layout (arrangement) of a 3-input NOR circuit according to the first embodiment of the present invention, FIG. 2B is a cross-sectional view taken along a cut-line A-A', FIG. 2C is a cross-sectional view taken along a cut-line B-B', FIG. 2D is a cross-sectional view taken along a cut-line C-C', and FIG. 2E is a cross-sectional view taken along a cut-line D-D'.

In FIG. 2A, the NMOS transistors Qn1, Qn2, and Qn3 of the NOR circuit illustrated in FIG. 1 are arranged in the first row (the bottom row in FIG. 2A) in order from right to left in FIG. 2A, and the PMOS transistors Qp1, Qp2, and Qp3 are arranged in the second row (the top row in FIG. 2A) in order from right to left in FIG. 2A.

Figure 20A:
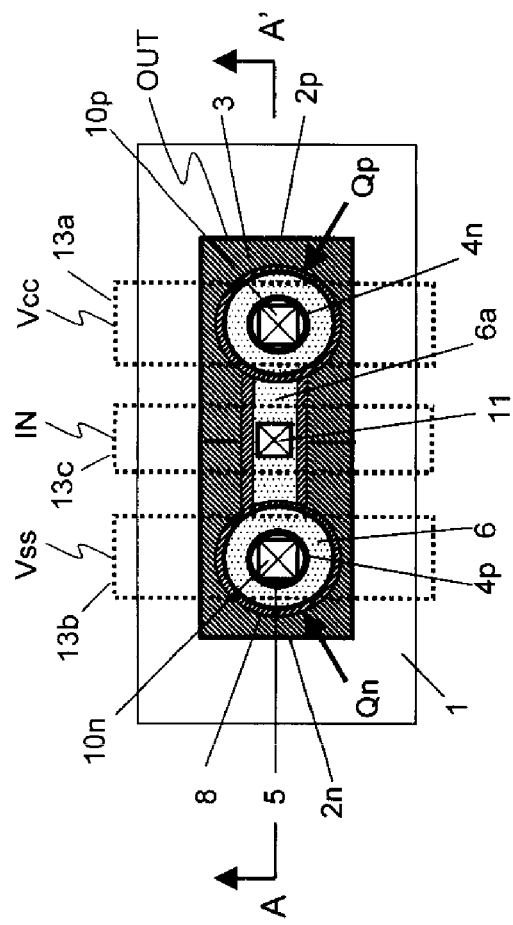
FIG. 20A is a plan view of a prior art inverter.
Figure 20B:
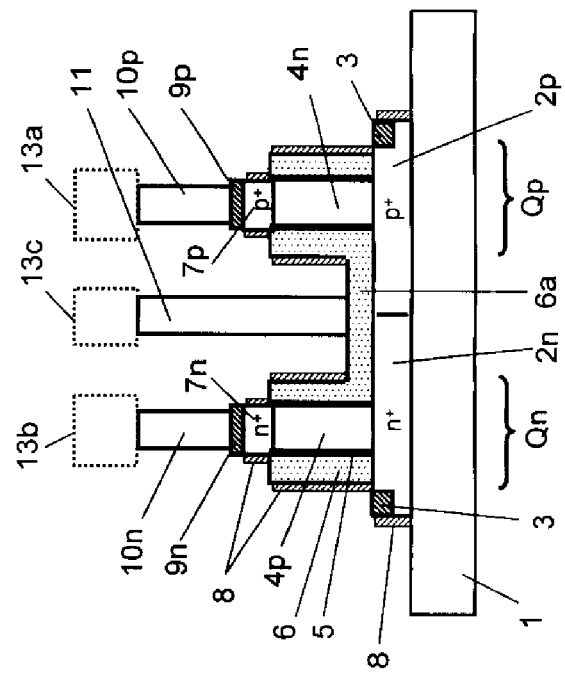
FIG. 20B is a cross-sectional view of the prior art inverter.

In FIG. 2A, FIG. 2B, FIG. 2C, FIG. 2D, and FIG. 2E, the same or substantially the same structures as those illustrated in FIG. 20A and FIG. 20B are denoted by equivalent reference numerals in the 100s.

An insulating film such as a buried oxide (BOX) film layer 101 disposed on a substrate has formed thereon planar silicon layers 102n, 102pa, and 102pb. The planar silicon layers 102n, 102pa, and 102pb are formed as an n+ diffusion layer, a p+ diffusion layer, and a p+ diffusion layer, respectively, through impurity implantation or the like. A silicide layer 103 disposed on surfaces of the planar silicon layers (102n, 102pa, and 102pb) connects the planar silicon layers 102n and 102pa to one another. Reference numerals 104n1, 104n2, and 104n3 denote n-type silicon pillars, and reference numerals 104p1, 104p2, and 104p3 denote p-type silicon pillars. Reference numeral 105 denotes a gate insulating film that surrounds each of the silicon pillars 104n1, 104n2, 104n3, 104p1, 104p2, and 104p3. Reference numeral 106 denotes a gate electrode, and reference numerals 106a, 106b, 106c, 106d, 106e, and 106f denote each a gate line. P+ diffusion layers 107p1, 107p2, and 107p3 are formed on top portions of the silicon pillars 104n1, 104n2, and 104n3, respectively, through impurity implantation or the like, and n+ diffusion layers 107n1, 107n2, and 107n3 are formed on top portions of the silicon pillars 104p1, 104p2, and 104p3, respectively, through impurity implantation or the like. Reference numeral 108 denotes a silicon nitride film for protection of the gate insulating film 105. Reference numerals 109p1, 109p2, 109p3, 109n1, 109n2, and 109n3 denote silicide layers connected to the p+ diffusion layers 107p1, 107p2, and 107p3 and the n+ diffusion layers 107n1, 107n2, and 107n3, respectively. Reference numerals 110p1 and 110p2 denote contacts that connect the silicide layers 109p1 and 109p2 to a first metal line 113g, reference numeral 110p3 denotes a contact that connects the silicide layer 109p3 to a first metal line 113a, and reference numerals 110n1, 110n2, and 110n3 denote contacts that connect the silicide layers 109n1, 109n2, and 109n3 to a first metal line 113c. Reference numeral 111a denotes a contact that connects the gate line 106b to a first metal line 113d, reference numeral 111b denotes a contact that connects the gate line 106d to a first metal line 113e, and reference numeral 111c denotes a contact that connects the gate line 106f to a first metal line 113f. In the following, the planar silicon layers 102n, 102pa, and 102pb are also referred to as the lower diffusion layers 102n, 102pa, and 102pb, and the diffusion layers 107p1, 107p2, 107p3, 107n1, 107n2, and 107n3 are also referred to as the upper diffusion layers 107p1, 107p2, 107p3, 107n1, 107n2, and 107n3.

Further, reference numeral 112a denotes a contact that connects the silicide layer 103 which connects the lower diffusion layer 102n and the lower diffusion layer 102pa to one another to a first metal line 113b.

The silicon pillar 104n1, the lower diffusion layer 102pa, the upper diffusion layer 107p1, the gate insulating film 105, and the gate electrode 106 constitute the PMOS transistor Qp1. The silicon pillar 104n2, the lower diffusion layer 102pb, the upper diffusion layer 107p2, the gate insulating film 105, and the gate electrode 106 constitute the PMOS transistor Qp2. The silicon pillar 104n3, the lower diffusion layer 102pb, the upper diffusion layer 107p3, the gate insulating film 105, and the gate electrode 106 constitute the PMOS transistor Qp3. The silicon pillar 104p1, the lower diffusion layer 102n, the upper diffusion layer 107n1, the gate insulating film 105, and the gate electrode 106 constitute the NMOS transistor Qn1. The silicon pillar 104p2, the lower diffusion layer 102n, the upper diffusion layer 107n2, the gate insulating film 105, and the gate electrode 106 constitute the NMOS transistor Qn2. The silicon pillar 104p3, the lower diffusion layer 102n, the upper diffusion layer 107n3, the gate insulating film 105, and the gate electrode 106 constitute the NMOS transistor Qn3.

In addition, the gate line 106a is connected to the gate electrode 106 of the PMOS transistor Qp1, the gate line 106c is connected to the gate electrode 106 of the PMOS transistor Qp2, and the gate line 106e is connected to the gate electrode 106 of the PMOS transistor Qp3. The gate lines 106a and 106b are connected to the gate electrode 106 of the NMOS transistor Qn1, the gate lines 106c and 106d are connected to the gate electrode 106 of the NMOS transistor Qn2, and the gate lines 106e and 106f are connected to the gate electrode 106 of the NMOS transistor Qn3.

The lower diffusion layers 102n and 102pa serve as a common drain of the NMOS transistors Qn1, Qn2, and Qn3 and the PMOS transistor Qp1 via the silicide layer 103, and are connected to the first metal line 113b via the contact 112a to serve as the output OUT31. The upper diffusion layer 107n1, which is a source of the NMOS transistor Qn1, is connected to the first metal line 113c via the silicide layer 109n1 and the contact 110n1, and the first metal line 113c is supplied with the reference power supply Vss. The upper diffusion layer 107n2, which is a source of the NMOS transistor Qn2, is connected to the first metal line 113c via the silicide layer 109n2 and the contact 110n2. Further, the upper diffusion layer 107n3, which is a source of the NMOS transistor Qn3, is connected to the first metal line 113c via the silicide layer 109n3 and the contact 110n3. The upper diffusion layer 107p1, which is a source of the PMOS transistor Qp1, is connected to the first metal line 113g via the silicide layer 109p1 and the contact 110p1. The upper diffusion layer 107p2, which is a drain of the PMOS transistor Qp2, is connected to the first metal line 113g via the silicide layer 109p2 and the contact 110p2. Here, the source of the PMOS transistor Qp1 and the drain of the PMOS transistor Qp2 are connected to one another via the first metal line 113g. Further, a source of the PMOS transistor Qp2 is connected to a drain of the PMOS transistor Qp3 via the lower diffusion layer 102pb and the silicide layer 103, and a source of the PMOS transistor Qp3 is connected to the first metal line 113a via the contact 110p3. The first metal line 113a is supplied with the power supply Vcc.

The input signal IN1 is supplied to the first metal line 113d, connected to the gate line 106b via the contact 111a, and supplied to the gate electrode 106 of the NMOS transistor Qn1. The input signal IN1 is further supplied to the gate electrode 106 of the PMOS transistor Qp1 via the gate line 106a.

The input signal IN2 is supplied to the first metal line 113e, connected to the gate line 106d via the contact 111b, and supplied to the gate electrode 106 of the NMOS transistor Qn2. The input signal IN2 is further supplied to the gate electrode 106 of the PMOS transistor Qp2 via the gate line 106c.

The input signal IN3 is supplied to the first metal line 113f, connected to the gate line 106f via the contact 111c, and supplied to the gate electrode 106 of the NMOS transistor Qn3. The input signal IN3 is further supplied to the gate electrode 106 of the PMOS transistor Qp3 via the gate line 106e.

In a transistor arrangement method according to this embodiment, a line for the reference power supply Vss (hereinafter referred to as the reference power supply line Vss) (113c), the NMOS transistors Qn1, Qn2, and Qn3 arranged in the first row, the PMOS transistors Qp1, Qp2, and Qp3 arranged in the second row, and a line for the power supply Vcc (hereinafter referred to as the power supply line Vcc) (113a) are arranged in this order from bottom to top in FIG. 2A. The 3-input NOR circuit having the configuration described above, which includes the power supply line Vcc (113a) and the reference power supply line Vss (113c), is defined as a block BL31.

Further, letting the distance between the power supply line 113a and the reference power supply line 113c be Ly (the distance between the power supply line and the reference power supply line (both inclusive)), the standardization is also carried out in the following embodiments with Ly being constant. Such standardization advantageously facilitates connection of a power supply line and a reference power supply line merely by arranging the block BL31 according to this embodiment and other blocks side by side.

This embodiment enables six SGTs constituting a 3-input NOR circuit to be arranged in two rows and three columns, without using any unnecessary lines or contact regions, and can provide a semiconductor device with a reduced area.

Second Embodiment

Figure 3:
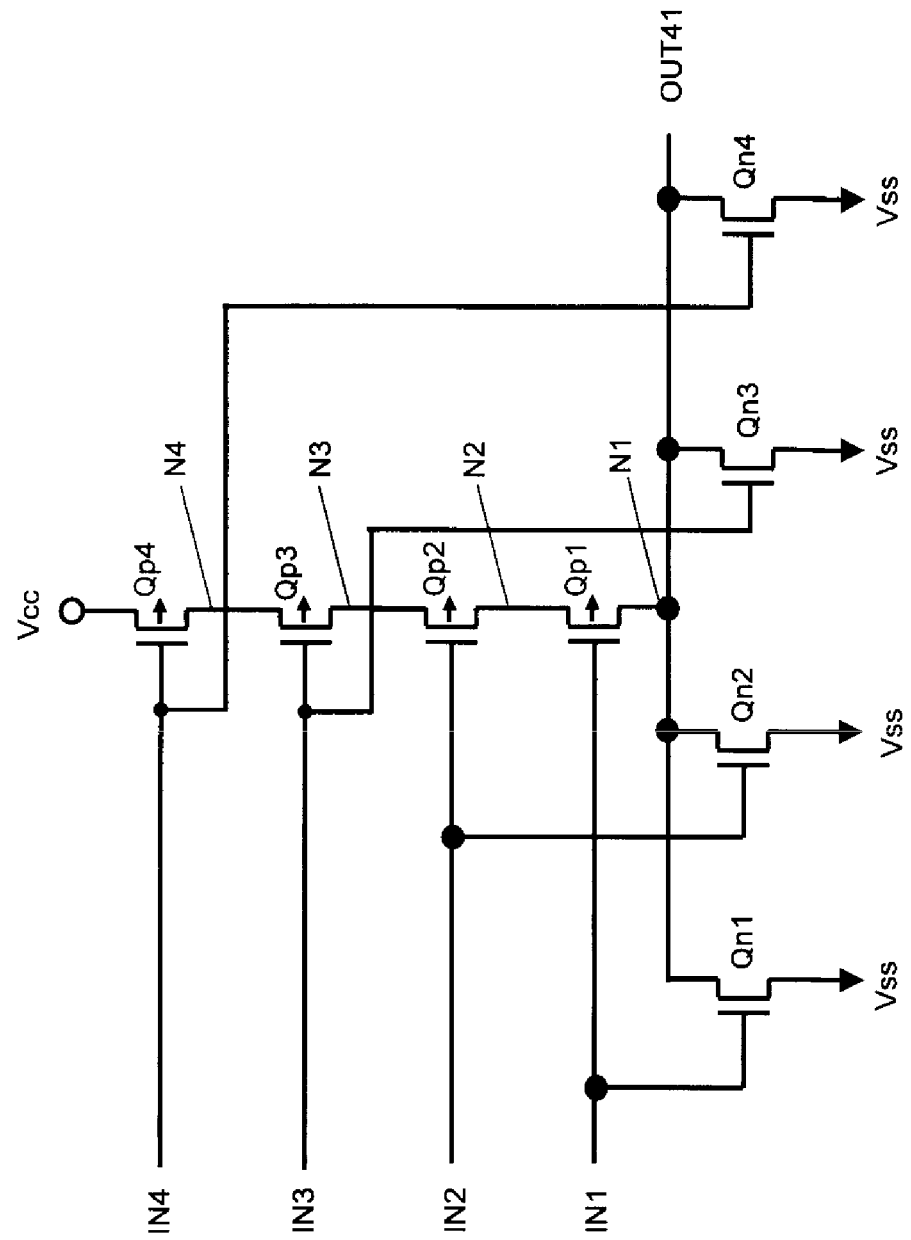
FIG. 3 is an equivalent circuit diagram illustrating a NOR circuit according to an embodiment of the present invention.

FIG. 3 is an equivalent circuit diagram of a 4-input NOR circuit used in the present invention. The symbols Qn1, Qn2, Qn3, and Qn4 denote NMOS transistors formed of SGTs, and the symbols Qp1, Qp2, Qp3, and Qp4 denote PMOS transistors also formed of SGTs. Sources of the NMOS transistors Qn1, Qn2, Qn3, and Qn4 are connected to a reference power supply Vss, and drains of the NMOS transistors Qn1, Qn2, Qn3, and Qn4 are commonly connected to a node N1. The node N1 serves as an output OUT41. A drain of the PMOS transistor Qp1 is connected to the node N1, and a source of the PMOS transistor Qp1 is connected to a drain of the PMOS transistor Qp2 via a node N2. A source of the PMOS transistor Qp2 is connected to a drain of the PMOS transistor Qp3 via a node N3. A source of the PMOS transistor Qp3 is connected to a drain of the PMOS transistor Qp4 via a node N4. A source of the PMOS transistor Qp4 is connected to a power supply Vcc. An input signal IN1 is connected to a gate of the NMOS transistor Qn1 and a gate of the PMOS transistor Qp1, and an input signal IN2 is connected to a gate of the NMOS transistor Qn2 and a gate of the PMOS transistor Qp2. An input signal IN3 is connected to a gate of the NMOS transistor Qn3 and a gate of the PMOS transistor Qp3, and an input signal IN4 is connected to a gate of the NMOS transistor Qn4 and a gate of the PMOS transistor Qp4.

Figure 4A:
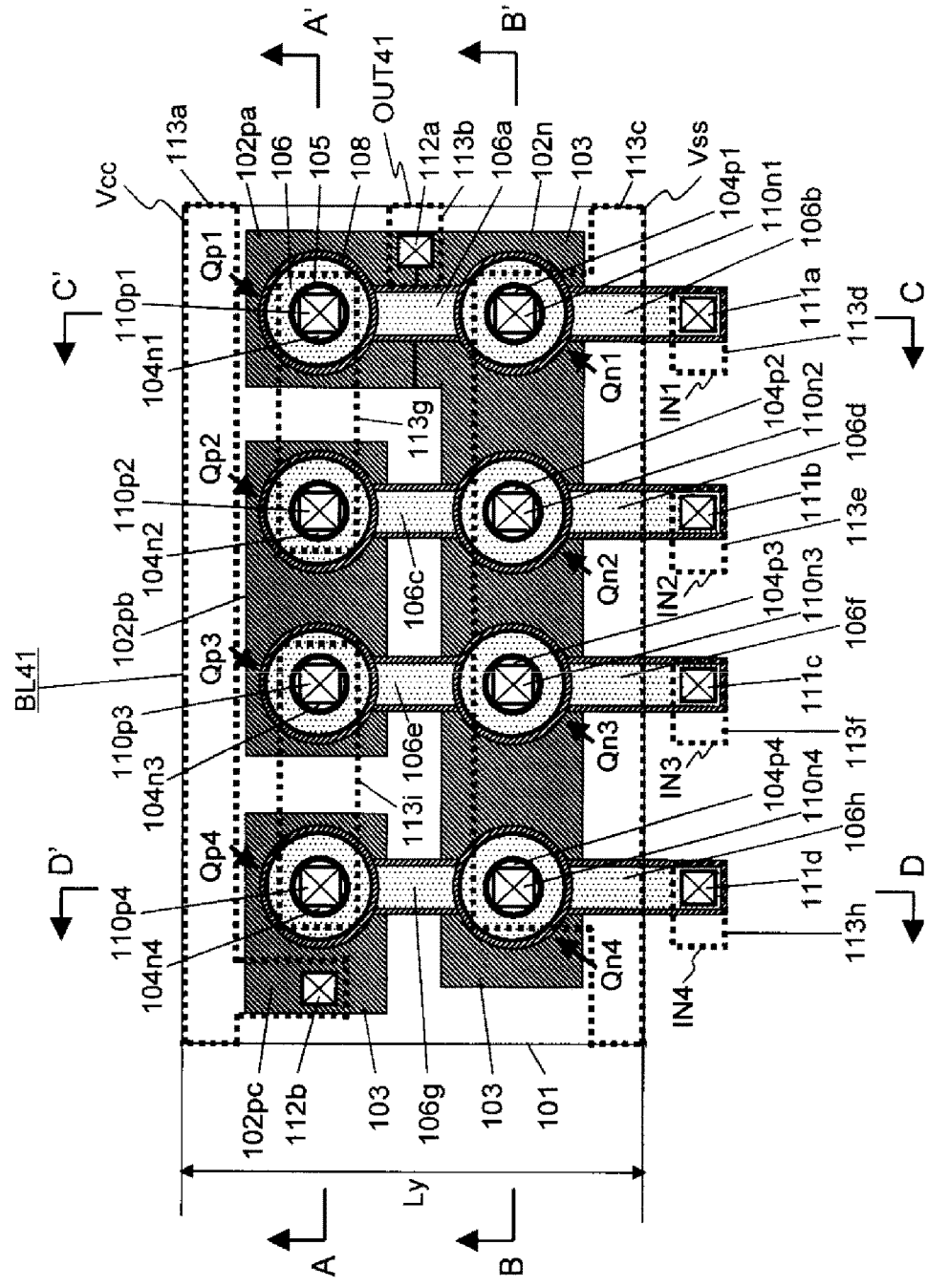
FIG. 4A is a plan view of a NOR circuit according to a second embodiment of the present invention.
Figure 4B:
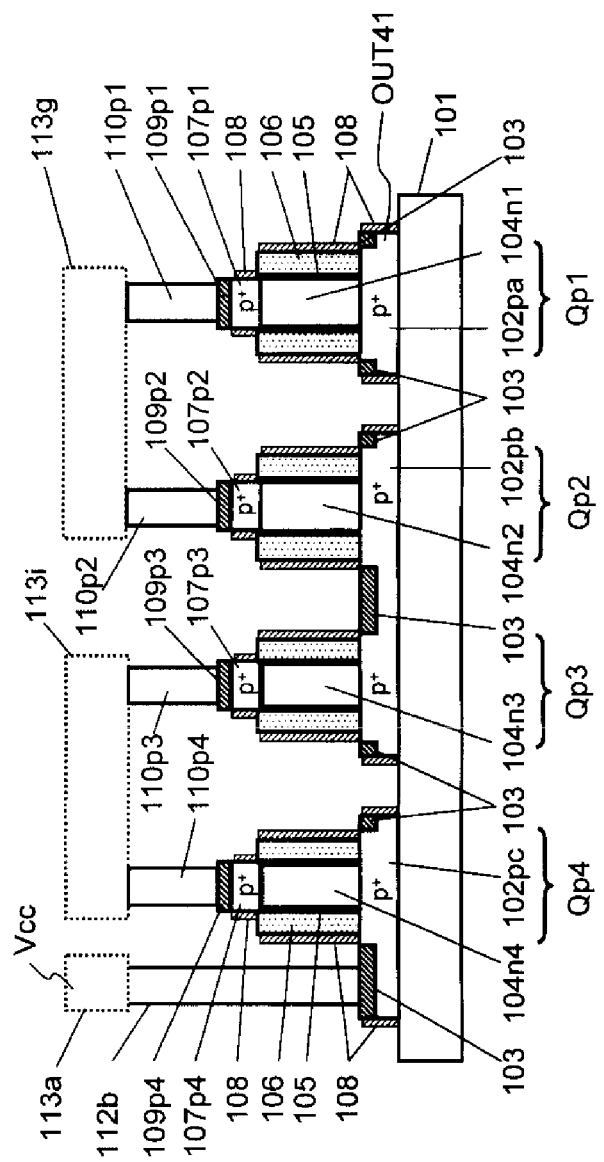
FIG. 4B is a cross-sectional view of the NOR circuit according to the second embodiment of the present invention.
Figure 4C:
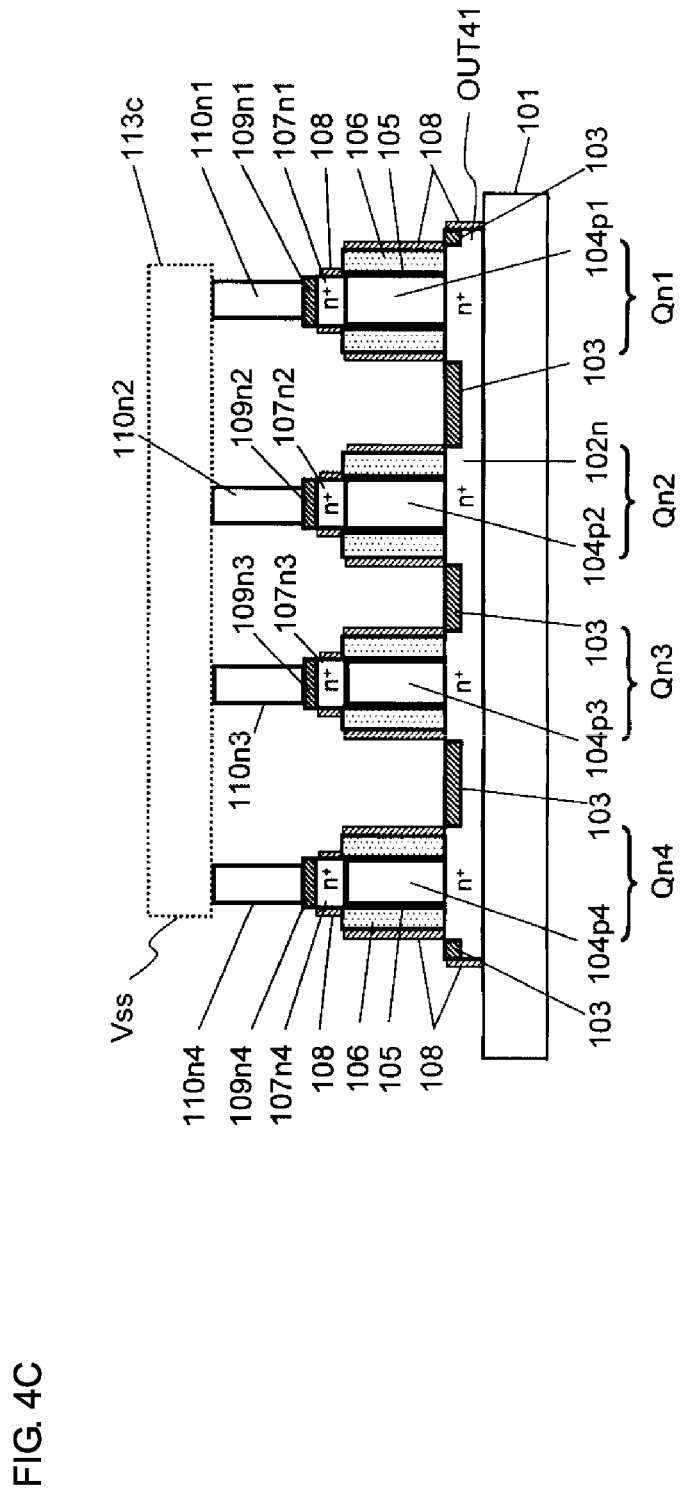
FIG. 4C is a cross-sectional view of the NOR circuit according to the second embodiment of the present invention.
Figure 4D:
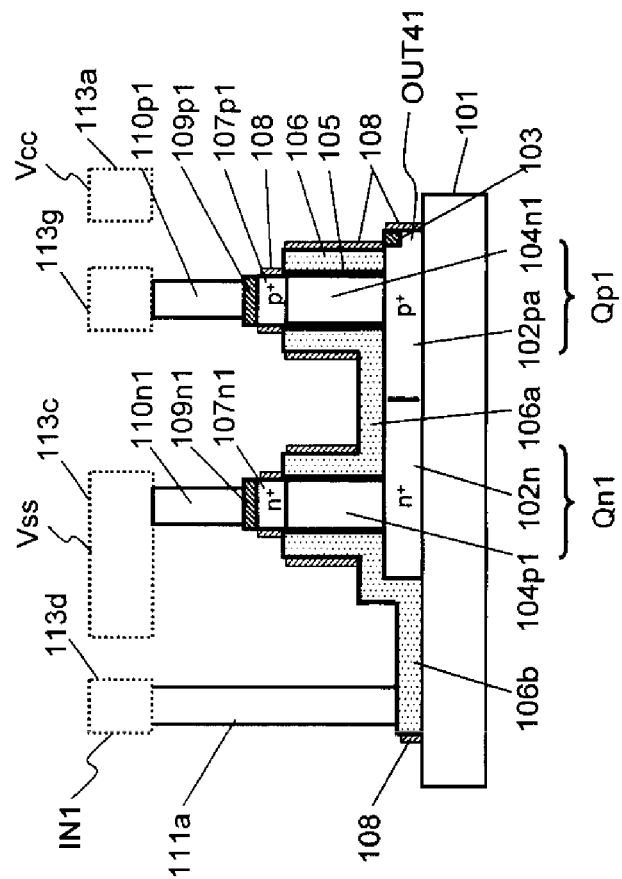
FIG. 4D is a cross-sectional view of the NOR circuit according to the second embodiment of the present invention.

FIG. 4A, FIG. 4B, FIG. 4C, FIG. 4D, and FIG. 4E illustrate a second embodiment. FIG. 4A is a plan view of a layout (arrangement) of a 4-input NOR circuit according to the second embodiment of the present invention, FIG. 4B is a cross-sectional view taken along a cut-line A-A', FIG. 4C is a cross-sectional view taken along a cut-line B-B', FIG.

Figure 4E:
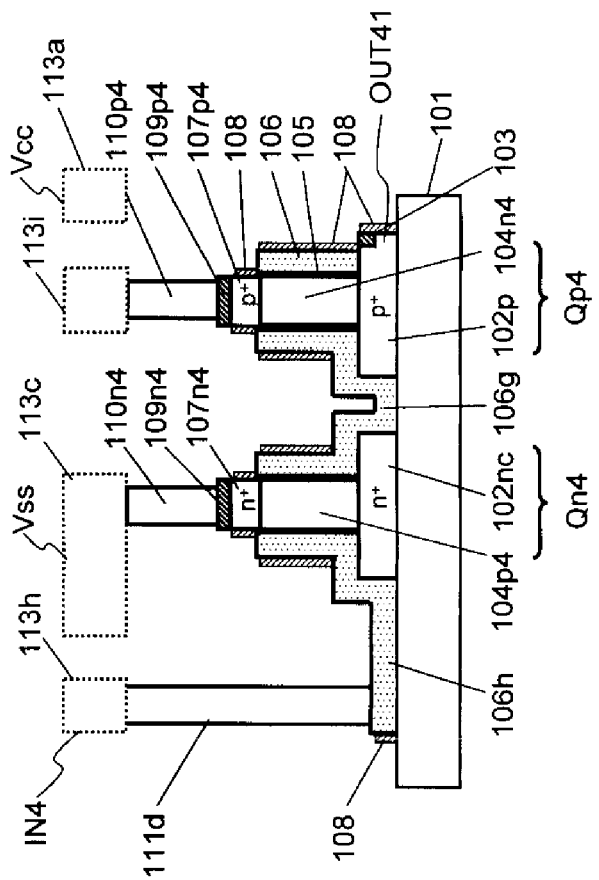
FIG. 4E is a cross-sectional view of the NOR circuit according to the second embodiment of the present invention.

4D is a cross-sectional view taken along a cut-line C-C', and FIG. 4E is a cross-sectional view taken along a cut-line D-D'.

In FIG. 4A, the NMOS transistors Qn1, Qn2, Qn3, and Qn4 of the NOR circuit illustrated in FIG. 3 are arranged in the first row (the bottom row in FIG. 4A) in order from right to left in FIG. 4A, and the PMOS transistors Qp1, Qp2, Qp3 and Qp4 are arranged in the second row (the top row in FIG. 4A) in order from right to left in FIG. 4A.

The difference from FIG. 2A is that the NMOS transistor Qn4 and the PMOS transistor Qp4 are additionally arranged in the left part of the drawing.

In FIG. 4A, FIG. 4B, FIG. 4C, FIG. 4D, and FIG. 4E, the same or substantially the same structures as those illustrated in FIG. 2A, FIG. 2B, FIG. 2C, FIG. 2D, and FIG. 2E are denoted by the same reference numerals in the 100s.

An insulating film such as a buried oxide (BOX) film layer 101 disposed on a substrate has formed thereon planar silicon layers 102n, 102pa, 102pb, and 102pc. The planar silicon layers 102n, 102pa, 102pb, and 102pc are formed as an n+ diffusion layer, a p+ diffusion layer, a p+ diffusion layer, and a p+ diffusion layer, respectively, through impurity implantation or the like. A silicide layer 103 disposed on surfaces of the planar silicon layers (102n, 102pa, 102pb, and 102pc) connects the planar silicon layers 102n and 102pa to one another. Reference numerals 104n1, 104n2, 104n3, and 104n4 denote n-type silicon pillars, and reference numerals 104p1, 104p2, 104p3, and 104p4 denote p-type silicon pillars. Reference numeral 105 denotes a gate insulating film that surrounds each of the silicon pillars 104n1, 104n2, 104n3, 104n4, 104p1, 104p2, 104p3, and 104p4. Reference numeral 106 denotes a gate electrode, and reference numerals 106a, 106b, 106c, 106d, 106e, 106f, 106g, and 106h denote each a gate line. P+ diffusion layers 107p1, 107p2, 107p3, and 107p4 are formed on top portions of the silicon pillars 104n1, 104n2, 104n3, and 104n4, respectively, through impurity implantation or the like, and n+ diffusion layers 107n1, 107n2, 107n3, and 107n4 are formed on top portions of the silicon pillars 104p1, 104p2, 104p3, and 104p4, respectively, through impurity implantation or the like. Reference numeral 108 denotes a silicon nitride film for protection of the gate insulating film 105. Reference numerals 109p1, 109p2, 109p3, 109p4, 109n1, 109n2, 109n3, and 109n4 denote silicide layers connected to the p+ diffusion layers 107p1, 107p2, 107p3, and 107p4 and the n+ diffusion layers 107n1, 107n2, 107n3, and 107n4, respectively. Reference numerals 110p1 and 110p2 denote contacts that connect the silicide layers 109p1 and 109p2 to a first metal line 113g, reference numerals 110p3 and 110p4 denote contacts that connect the silicide layers 109p3 and 109p4 to a first metal line 113i, and reference numerals 110n1, 110n2, 110n3, and 110n4 denote contacts that connect the silicide layers 109n1, 109n2, 109n3, and 109n4 to a first metal line 113c. Reference numeral 111a denotes a contact that connects the gate line 106b to a first metal line 113d, reference numeral 111b denotes a contact that connects the gate line 106d to a first metal line 113e, reference numeral 111c denotes a contact that connects the gate line 106f to a first metal line 113f, and reference numeral 111d denotes a contact that connects the gate line 106h to a first metal line 113h. In the following, the planar silicon layers 102n, 102pa, 102pb, and 102pc are also referred to as the lower diffusion layers 102n, 102pa, 102pb, and 102pc, and the diffusion layers 107p1, 107p2, 107p3, 107p4, 107n1, 107n2, 107n3, and 107n4 are also referred to as the upper diffusion layers 107p1, 107p2, 107p3, 107p4, 107n1, 107n2, 107n3, and 107n4.

Reference numeral 112a denotes a contact that connects the silicide layer 103 which connects the lower diffusion layer 102n and the lower diffusion layer 102pa to one another to a first metal line 113b. Further, reference numeral 112b denotes a contact that connects the silicide layer 103 which covers lower diffusion layer 102pc to a first metal line 113a.

The silicon pillar 104n1, the lower diffusion layer 102pa, the upper diffusion layer 107p1, the gate insulating film 105, and the gate electrode 106 constitute the PMOS transistor Qp1. The silicon pillar 104n2, the lower diffusion layer 102pb, the upper diffusion layer 107p2, the gate insulating film 105, and the gate electrode 106 constitute the PMOS transistor Qp2. The silicon pillar 104n3, the lower diffusion layer 102pb, the upper diffusion layer 107p3, the gate insulating film 105, and the gate electrode 106 constitute the PMOS transistor Qp3. The silicon pillar 104n4, the lower diffusion layer 102pc, the upper diffusion layer 107p4, the gate insulating film 105, and the gate electrode 106 constitute the PMOS transistor Qp4. The silicon pillar 104p1, the lower diffusion layer 102n, the upper diffusion layer 107n1, the gate insulating film 105, and the gate electrode 106 constitute the NMOS transistor Qn1. The silicon pillar 104p2, the lower diffusion layer 102n, the upper diffusion layer 107n2, the gate insulating film 105, and the gate electrode 106 constitute the NMOS transistor Qn2. The silicon pillar 104p3, the lower diffusion layer 102n, the upper diffusion layer 107n3, the gate insulating film 105, and the gate electrode 106 constitute the NMOS transistor Qn3. The silicon pillar 104p4, the lower diffusion layer 102n, the upper diffusion layer 107n4, the gate insulating film 105, and the gate electrode 106 constitute the NMOS transistor Qn4.

In addition, the gate line 106a is connected to the gate electrode 106 of the PMOS transistor Qp1, the gate line 106c is connected to the gate electrode 106 of the PMOS transistor Qp2, the gate line 106e is connected to the gate electrode 106 of the PMOS transistor Qp3, and the gate line 106g is connected to the gate electrode 106 of the PMOS transistor Qp4. The gate lines 106a and 106b are connected to the gate electrode 106 of the NMOS transistor Qn1, the gate lines 106c and 106d are connected to the gate electrode 106 of the NMOS transistor Qn2, the gate lines 106e and 106f are connected to the gate electrode 106 of the NMOS transistor Qn3, and the gate lines 106g and 106h are connected to the gate electrode 106 of the NMOS transistor Qn4.

The lower diffusion layers 102n and 102pa serve as a common drain of the NMOS transistors Qn1, Qn2, Qn3, and Qn4 and the PMOS transistor Qp1, and are connected to the output OUT41.

The upper diffusion layer 107n1, which is a source of the NMOS transistor Qn1, is connected to the first metal line 113c via the silicide layer 109n1 and the contact 110n1, and the first metal line 113c is supplied with the reference power supply Vss. The upper diffusion layer 107n2, which is a source of the NMOS transistor Qn2, is connected to the first metal line 113c via the silicide layer 109n2 and the contact 110n2. The upper diffusion layer 107n3, which is a source of the NMOS transistor Qn3, is connected to the first metal line 113c via the silicide layer 109n3 and the contact 110n3. The upper diffusion layer 107n4, which is a source of the NMOS transistor Qn4, is connected to the first metal line 113c via the silicide layer 109n4 and the contact 110n4. The upper diffusion layer 107p1, which is a source of the PMOS transistor Qp1, is connected to the first metal line 113g via the silicide layer 109p1 and the contact 110p1. The upper diffusion layer 107p2, which is a drain of the PMOS transistor Qp2, is connected to the first metal line 113g via the silicide layer 109p2 and the contact 110p2. Here, the source of the PMOS transistor Qp1 and the drain of the PMOS transistor Qp2 are connected to one another via the first metal line 113g. Further, a source of the PMOS transistor Qp2 is connected to a drain of the PMOS transistor Qp3 via the lower diffusion layer 102pb and the silicide layer 103, and a source of the PMOS transistor Qp3 is connected to the first metal line 113i via the contact 110p3. A drain of the PMOS transistor Qp4 is connected to the first metal line 113i via the contact 110p4. Here, the source of the PMOS transistor Qp3 and the drain of the PMOS transistor Qp4 are connected to one another via the first metal line 113i. A source of the PMOS transistor Qp4 is connected to the lower diffusion layer 102pc via the silicide layer 103, and the lower diffusion layer 102pc is connected to the first metal line 113a via the contact 112b. The first metal line 113a is supplied with the power supply Vcc.

The input signal IN1 is supplied to the first metal line 113d, connected to the gate line 106b via the contact 111a, and supplied to the gate electrode 106 of the NMOS transistor Qn1. The input signal IN1 is further supplied to the gate electrode 106 of the PMOS transistor Qp1 via the gate line 106a.

The input signal IN2 is supplied to the first metal line 113e, connected to the gate line 106d via the contact 111b, and supplied to the gate electrode 106 of the NMOS transistor Qn2. The input signal IN2 is further supplied to the gate electrode 106 of the PMOS transistor Qp2 via the gate line 106c.

The input signal IN3 is supplied to the first metal line 113f, connected to the gate line 106f via the contact 111c, and supplied to the gate electrode 106 of the NMOS transistor Qn3. The input signal IN3 is further supplied to the gate electrode 106 of the PMOS transistor Qp3 via the gate line 106e.

The input signal IN4 is supplied to the first metal line 113h, connected to the gate line 106h via the contact 111d, and supplied to the gate electrode 106 of the NMOS transistor Qn4. The input signal IN4 is further supplied to the gate electrode 106 of the PMOS transistor Qp4 via the gate line 106g.

The 4-input NOR circuit having the configuration described above, which includes the power supply line Vcc (113a) and the reference power supply line Vss (113c), is defined as a block BL41.

Further, as in the first embodiment (FIG. 2A), the distance between the power supply line 113a and the reference power supply line 113c is represented by Ly (the distance between the power supply line and the reference power supply line (both inclusive)).

This embodiment enables eight SGTs constituting a 4-input NOR circuit to be arranged in two rows and four columns, without using any unnecessary lines or contact regions, and can provide a semiconductor device with a reduced area.

Third Embodiment

Figure 5:
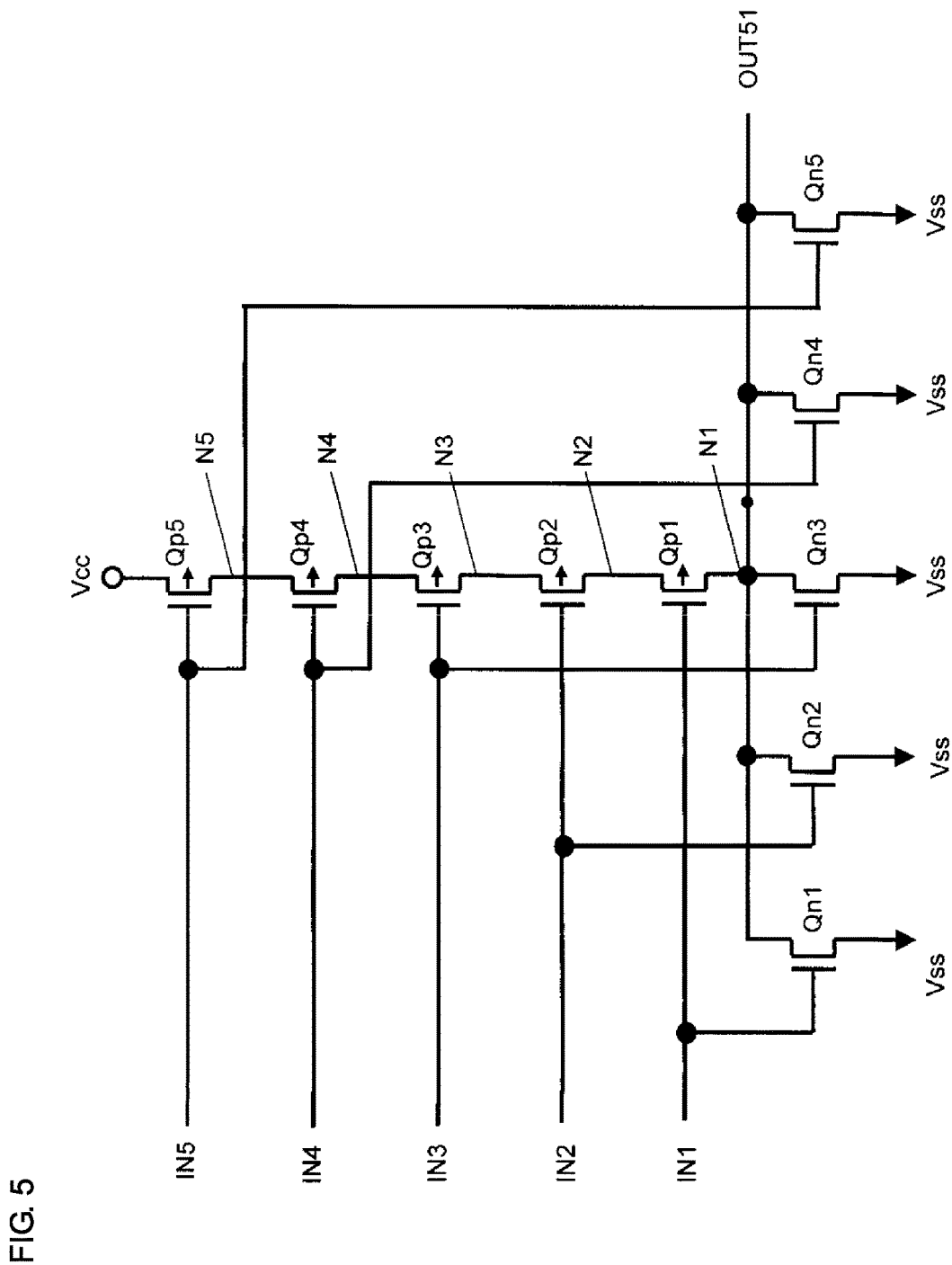
FIG. 5 is an equivalent circuit diagram illustrating a NOR circuit according to an embodiment of the present invention.

FIG. 5 is an equivalent circuit diagram of a 5-input NOR circuit used in the present invention. The symbols Qn1, Qn2, Qn3, Qn4, and Qn5 denote NMOS transistors formed of SGTs, and the symbols Qp1, Qp2, Qp3, Qp4, and Qp5 denote PMOS transistors also formed of SGTs. Sources of the NMOS transistors Qn1, Qn2, Qn3, Qn4, and Qn5 are connected to a reference power supply Vss, and drains of the NMOS transistors Qn1, Qn2, Qn3, Qn4, and Qn5 are commonly connected to a node N1. The node N1 serves as an output OUT51. A drain of the PMOS transistor Qp1 is connected to the node N1, and a source of the PMOS transistor Qp1 is connected to a drain of the PMOS transistor Qp2 via a node N2. A source of the PMOS transistor Qp2 is connected to a drain of the PMOS transistor Qp3 via a node N3, and a source of the PMOS transistor Qp3 is connected to a drain of the PMOS transistor Qp4 via a node N4. A source of the PMOS transistor Qp4 is connected to a drain of the PMOS transistor Qp5 via a node N5. A source of the PMOS transistor Qp5 is connected to a power supply Vcc. An input signal IN1 is connected to a gate of the PMOS transistor Qp1 and a gate of the NMOS transistor Qn1, an input signal IN2 is connected to a gate of the PMOS transistor Qp2 and a gate of the NMOS transistor Qn2, an input signal IN3 is connected to a gate of the PMOS transistor Qp3 and a gate of the NMOS transistor Qn3, an input signal IN4 is connected to a gate of the PMOS transistor Qp4 and a gate of the NMOS transistor Qn4, and an input signal IN5 is connected to a gate of the PMOS transistor Qp5 and a gate of the NMOS transistor Qn5.

Figure 6A:
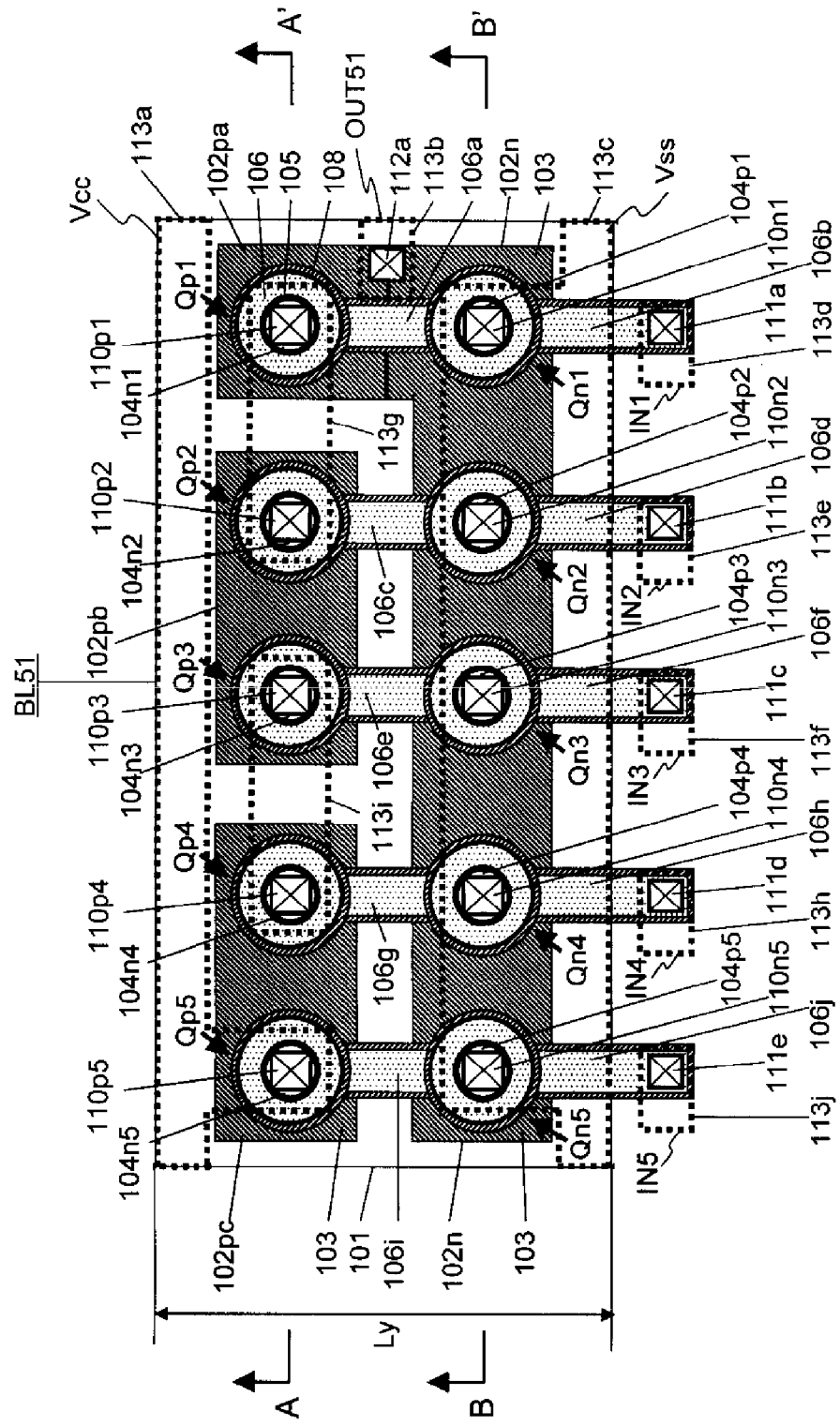
FIG. 6A is a plan view of a NOR circuit according to a third embodiment of the present invention.
Figure 6B:
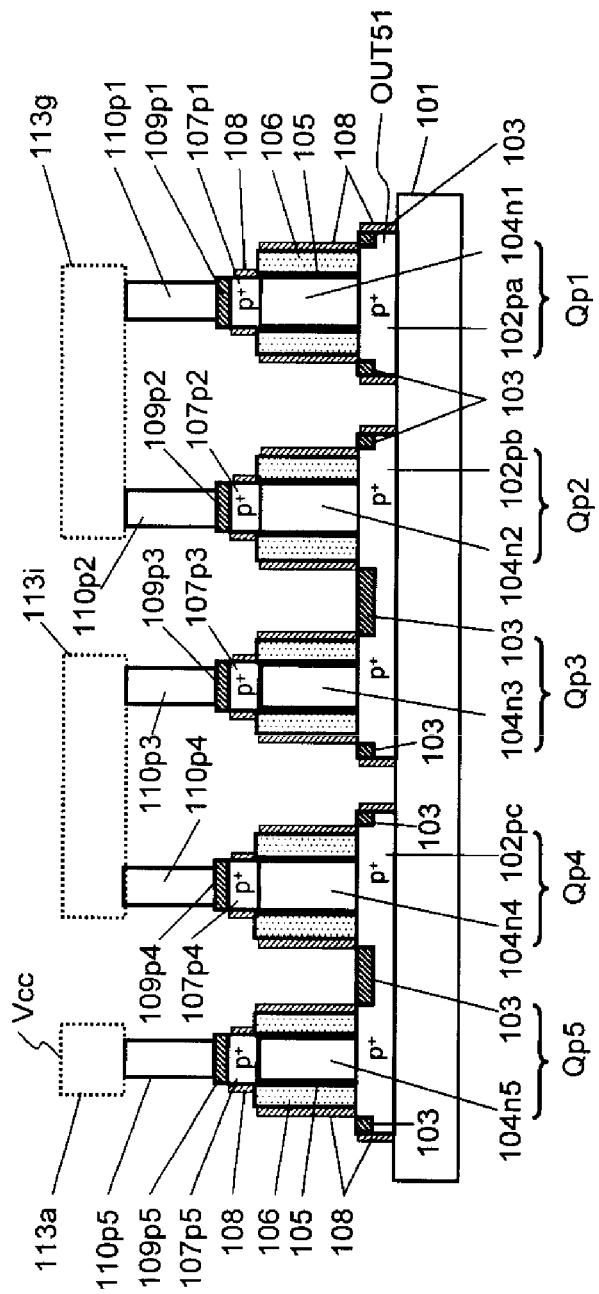
FIG. 6B is a cross-sectional view of the NOR circuit according to the third embodiment of the present invention.
Figure 6C:
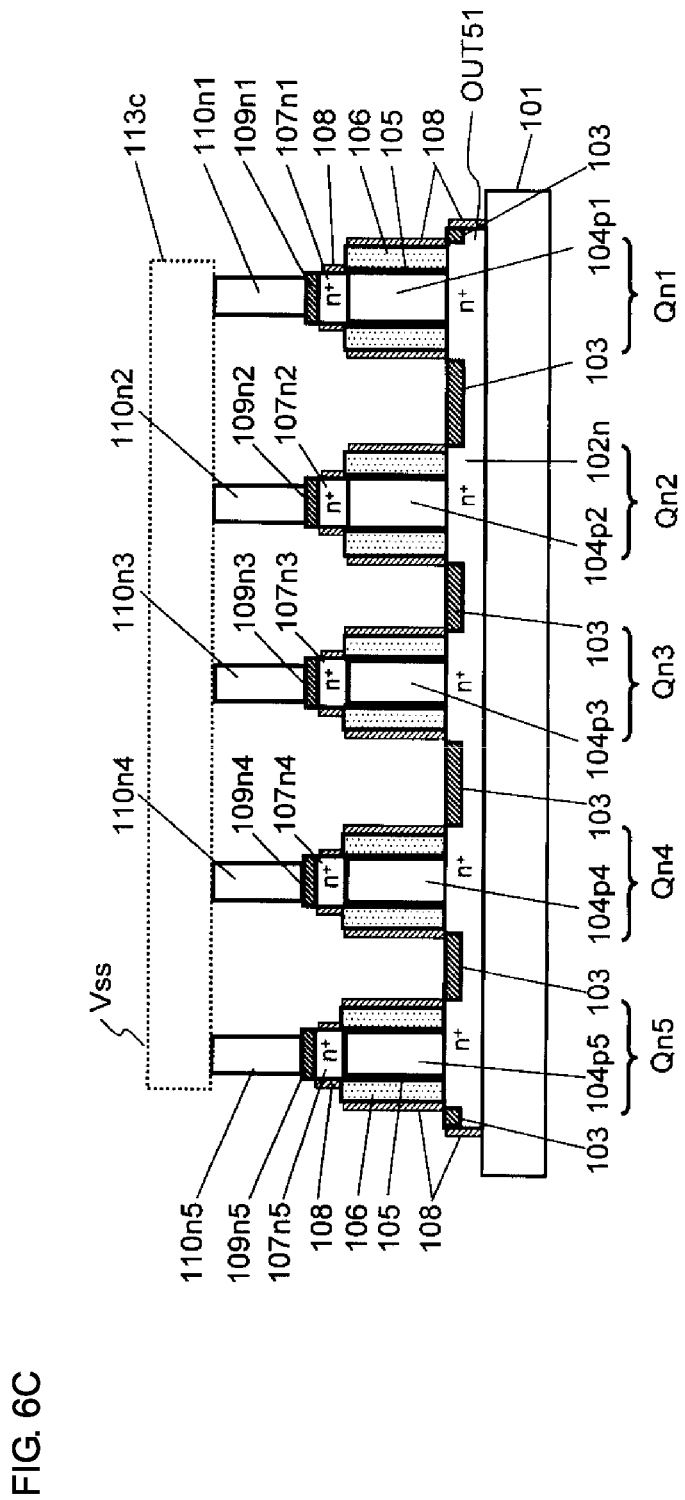
FIG. 6C is a cross-sectional view of the NOR circuit according to the third embodiment of the present invention.

FIG. 6A, FIG. 6B, and FIG. 6C illustrate a third embodiment. FIG. 6A is a plan view of a layout (arrangement) of a 5-input NOR circuit according to the third embodiment of the present invention, FIG. 6B is a cross-sectional view taken along a cut-line A-A', and FIG. 6C is a cross-sectional view taken along a cut-line B-B'. Cross-sectional views taken along vertical lines are substantially the same as those illustrated in FIG. 4D and FIG. 4E, and are not illustrated.

In FIG. 6A, the NMOS transistors Qn1, Qn2, Qn3, Qn4, and Qn5 of the NOR circuit illustrated in FIG. 5 are arranged in the first row (the bottom row in FIG. 6A) in order from right to left in FIG. 6A, and the PMOS transistors Qp1, Qp2, Qp3, Qp4, and Qp5 are arranged in the second row (the top row in FIG. 6A) in order from right to left in FIG. 6A.

The difference from FIG. 4A is that the NMOS transistor Qn5 and the PMOS transistor Qp5 are additionally arranged in the left part of the drawing.

In FIG. 6A, FIG. 6B, and FIG. 6C, the same or substantially the same structures as those illustrated in FIG. 4A, FIG. 4B, and FIG. 4C are denoted by the same reference numerals in the 100s.

An insulating film such as a buried oxide (BOX) film layer 101 disposed on a substrate has formed thereon planar silicon layers 102n, 102pa, 102pb, and 102pc. The planar silicon layers 102n, 102pa, 102pb, and 102pc are formed as an n+ diffusion layer, a p+ diffusion layer, a p+ diffusion layer, and a p+ diffusion layer, respectively, through impurity implantation or the like. A silicide layer 103 disposed on surfaces of the planar silicon layers (102n, 102pa, 102pb, and 102pc) connects the planar silicon layers 102n and 102pa to one another. Reference numerals 104n1, 104n2, 104n3, 104n4, and 104n5 denote n-type silicon pillars, and reference numerals 104p1, 104p2, 104p3, 104p4, and 104p5 denote p-type silicon pillars. Reference numeral 105 denotes a gate insulating film that surrounds each of the silicon pillars 104n1, 104n2, 104n3, 104n4, 104n5, 104p1, 104p2, 104p3, 104p4, and 104p5. Reference numeral 106 denotes a gate electrode, and reference numerals 106a, 106b, 106c, 106d, 106e, 106f, 106g, 106h, 106i, and 106j denote each a gate line. P+ diffusion layers 107p1, 107p2, 107p3, 107p4, and 107p5 are formed on top portions of the silicon pillars 104n1, 104n2, 104n3, 104n4, and 104n5, respectively, through impurity implantation or the like, and n+ diffusion layers 107n1, 107n2, 107n3, 107n4, and 107n5 are formed on top portions of the silicon pillars 104p1, 104p2, 104p3, 104p4, and 104p5, respectively, through impurity implantation or the like. Reference numeral 108 denotes a silicon nitride film for protection of the gate insulating film 105. Reference numerals 109p1, 109p2, 109p3, 109p4, 109p5, 109n1, 109n2, 109n3, 109n4, and 104n5 denote silicide layers connected to the p+ diffusion layers 107p1, 107p2, 107p3, 107p4, and 107p5 and the n+ diffusion layers 107n1, 107n2, 107n3, 107n4, and 107n5, respectively. Reference numerals 110p1 and 110p2 denote contacts that connect the silicide layers 109p1 and 109p2 to a first metal line 113g, reference numerals 110p3 and 110p4 denote contacts that connect the silicide layers 109p3 and 109p4 to a first metal line 113i, reference numeral 110p5 denotes a contact that connects the silicide layer 109p5 to a first metal line 113a, and reference numerals 110n1, 110n2, 110n3, 110n4, and 110n5 denote contacts that connect the silicide layers 109n1, 109n2, 109n3, 109n4, and 109n5 to a first metal line 113c. Reference numeral 111a denotes a contact that connects the gate line 106b to a first metal line 113d, reference numeral 111b denotes a contact that connects the gate line 106d to a first metal line 113e, reference numeral 111c denotes a contact that connects the gate line 106f to a first metal line 113f, reference numeral 111d denotes a contact that connects the gate line 106h to a first metal line 113h, and reference numeral 111e denotes a contact that connects the gate line 106j to a first metal line 113j. In the following, the planar silicon layers 102n, 102pa, 102pb, and 102pc are also referred to as the lower diffusion layers 102n, 102pa, 102pb, and 102pc, and the diffusion layers 107p1, 107p2, 107p3, 107p4, 107p5, 107n1, 107n2, 107n3, 107n4, and 107n5 are also referred to as the upper diffusion layers 107p1, 107p2, 107p3, 107p4, 107p5, 107n1, 107n2, 107n3, 107n4, and 107n5.

Reference numeral 112a denotes a contact that connects the silicide layer 103 which connects the lower diffusion layer 102n and the lower diffusion layer 102pa to one another to a first metal line 113b.

The silicon pillar 104n1, the lower diffusion layer 102pa, the upper diffusion layer 107p1, the gate insulating film 105, and the gate electrode 106 constitute the PMOS transistor Qp1. The silicon pillar 104n2, the lower diffusion layer 102pb, the upper diffusion layer 107p2, the gate insulating film 105, and the gate electrode 106 constitute the PMOS transistor Qp2. The silicon pillar 104n3, the lower diffusion layer 102pb, the upper diffusion layer 107p3, the gate insulating film 105, and the gate electrode 106 constitute the PMOS transistor Qp3. The silicon pillar 104n4, the lower diffusion layer 102pc, the upper diffusion layer 107p4, the gate insulating film 105, and the gate electrode 106 constitute the PMOS transistor Qp4. The silicon pillar 104n5, the lower diffusion layer 102pc, the upper diffusion layer 107p5, the gate insulating film 105, and the gate electrode 106 constitute the PMOS transistor Qp5. The silicon pillar 104p1, the lower diffusion layer 102n, the upper diffusion layer 107n1, the gate insulating film 105, and the gate electrode 106 constitute the NMOS transistor Qn1. The silicon pillar 104p2, the lower diffusion layer 102n, the upper diffusion layer 107n2, the gate insulating film 105, and the gate electrode 106 constitute the NMOS transistor Qn2. The silicon pillar 104p3, the lower diffusion layer 102n, the upper diffusion layer 107n3, the gate insulating film 105, and the gate electrode 106 constitute the NMOS transistor Qn3. The silicon pillar 104p4, the lower diffusion layer 102n, the upper diffusion layer 107n4, the gate insulating film 105, and the gate electrode 106 constitute the NMOS transistor Qn4. The silicon pillar 104p5, the lower diffusion layer 102n, the upper diffusion layer 107n5, the gate insulating film 105, and the gate electrode 106 constitute the NMOS transistor Qn5.

In addition, the gate line 106a is connected to the gate electrode 106 of the PMOS transistor Qp1, the gate line 106c is connected to the gate electrode 106 of the PMOS transistor Qp2, the gate line 106e is connected to the gate electrode 106 of the PMOS transistor Qp3, the gate line 106g is connected to the gate electrode 106 of the PMOS transistor Qp4, and the gate line 106i is connected to the gate electrode 106 of the PMOS transistor Qp5. The gate lines 106a and 106b are connected to the gate electrode 106 of the NMOS transistor Qn1, the gate lines 106c and 106d are connected to the gate electrode 106 of the NMOS transistor Qn2, the gate lines 106e and 106f are connected to the gate electrode 106 of the NMOS transistor Qn3, the gate lines 106g and 106h are connected to the gate electrode 106 of the NMOS transistor Qn4, and the gate lines 106i and 106j are connected to the gate electrode 106 of the NMOS transistor Qn5.

The lower diffusion layers 102n and 102pa serve as a common drain of the NMOS transistors Qn1, Qn2, Qn3, Qn4, and Qn5 and the PMOS transistor Qp1, and are connected to the output OUT51.

The upper diffusion layer 107n1, which is a source of the NMOS transistor Qn1, is connected to the first metal line 113c via the silicide layer 109n1 and the contact 110n1, and the first metal line 113c is supplied with the reference power supply Vss. The upper diffusion layer 107n2, which is a source of the NMOS transistor Qn2, is connected to the first metal line 113c via the silicide layer 109n2 and the contact 110n2. The upper diffusion layer 107n3, which is a source of the NMOS transistor Qn3, is connected to the first metal line 113c via the silicide layer 109n3 and the contact 110n3. The upper diffusion layer 107n4, which is a source of the NMOS transistor Qn4, is connected to the first metal line 113c via the silicide layer 109n4 and the contact 110n4. The upper diffusion layer 107n5, which is a source of the NMOS transistor Qn5, is connected to the first metal line 113c via the silicide layer 109n5 and the contact 110n5. The upper diffusion layer 107p1, which is a source of the PMOS transistor Qp1, is connected to the first metal line 113g via the silicide layer 109p1 and the contact 110p1. The upper diffusion layer 107p2, which is a drain of the PMOS transistor Qp2, is connected to the first metal line 113g via the silicide layer 109p2 and the contact 110p2. Here, the source of PMOS transistor Qp1 and the drain of the PMOS transistor Qp2 are connected to one another via the first metal line 113g. Further, a source of the PMOS transistor Qp2 is connected to a drain of the PMOS transistor Qp3 via the lower diffusion layer 102pb and the silicide layer 103, and a source of the PMOS transistor Qp3 is connected to the first metal line 113i via the contact 110p3. A drain of the PMOS transistor Qp4 is connected to the first metal line 113i via the contact 110p4. Here, the source of the PMOS transistor Qp3 and the drain of the PMOS transistor Qp4 are connected to one another via the first metal line 113i. A source of the PMOS transistor Qp4 is connected to a drain of the PMOS transistor Qp5 via the lower diffusion layer 102pc and the silicide layer 103, and a source of the PMOS transistor Qp5 is connected to the first metal line 113a via the contact 110p5. The first metal line 113a is supplied with the power supply Vcc.

The input signal IN1 is supplied to the first metal line 113d, connected to the gate line 106b via the contact 111a, and supplied to the gate electrode 106 of the NMOS transistor Qn1. The input signal IN1 is further supplied to the gate electrode 106 of the PMOS transistor Qp1 via the gate line 106a.

The input signal IN2 is supplied to the first metal line 113e, connected to the gate line 106d via the contact 111b, and supplied to the gate electrode 106 of the NMOS transistor Qn2. The input signal IN2 is further supplied to the gate electrode 106 of the PMOS transistor Qp2 via the gate line 106c.

The input signal IN3 is supplied to the first metal line 113f, connected to the gate line 106f via the contact 111c, and supplied to the gate electrode 106 of the NMOS transistor Qn3. The input signal IN3 is further supplied to the gate electrode 106 of the PMOS transistor Qp3 via the gate line 106e.

The input signal IN4 is supplied to the first metal line 113h, connected to the gate line 106h via the contact 111d, and supplied to the gate electrode 106 of the NMOS transistor Qn4. The input signal IN4 is further supplied to the gate electrode 106 of the PMOS transistor Qp4 via the gate line 106g.

The input signal IN5 is supplied to the first metal line 113j, connected to the gate line 106j via the contact 111e, and supplied to the gate electrode 106 of the NMOS transistor Qn5. The input signal IN5 is further supplied to the gate electrode 106 of the PMOS transistor Qp5 via the gate line 106i.

The 5-input NOR circuit having the configuration described above, which includes the power supply line Vcc (113a) and the reference power supply line Vss (113c), is defined as a block BL51.

Further, as in the first embodiment (FIG. 2A), the distance between the power supply line 113a and the reference power supply line 113c is represented by Ly (the distance between the power supply line and the reference power supply line (both inclusive)).

This embodiment enables ten SGTs constituting a 5-input NOR circuit to be arranged in two rows and five columns, without using any unnecessary lines or contact regions, and can provide a semiconductor device with a reduced area.

This embodiment is illustrative, and a NOR circuit having a plurality of inputs more than 5 inputs can implement a semiconductor device with a reduced area in a similar way.

Fourth Embodiment

Figure 7:
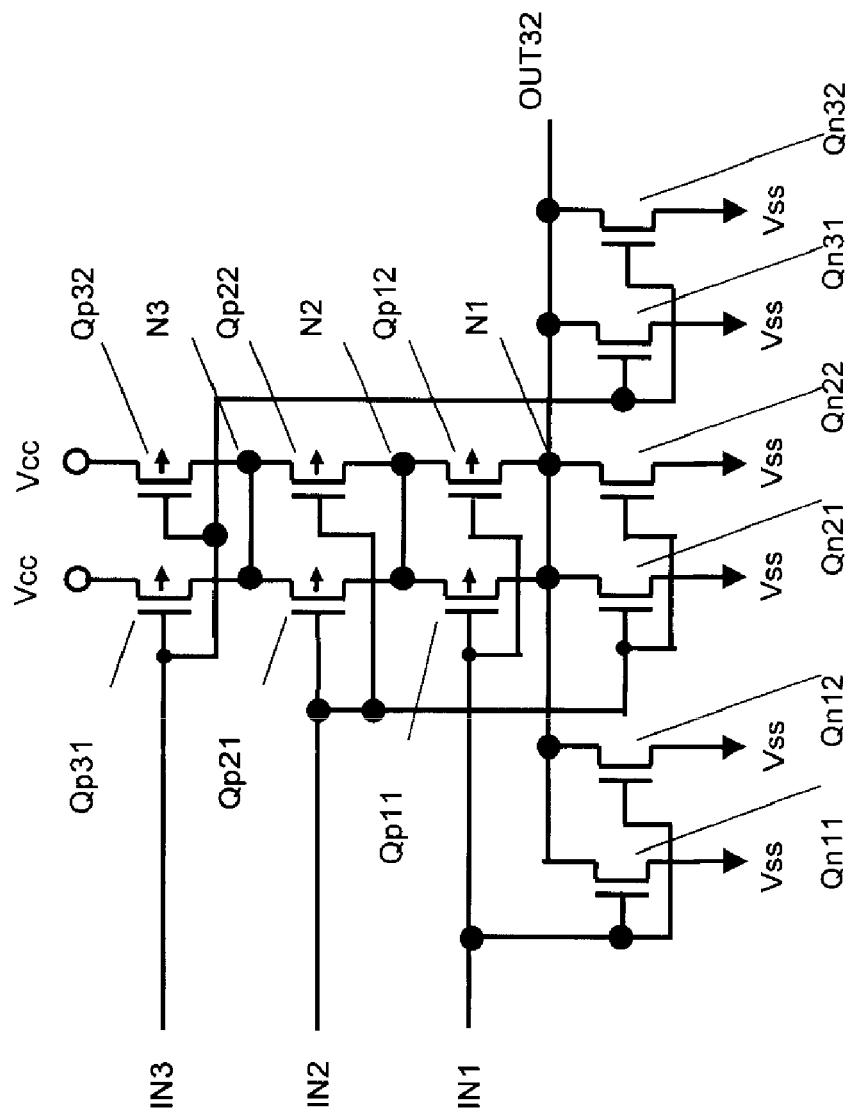
FIG. 7 is an equivalent circuit diagram illustrating a NOR circuit according to embodiments of the present invention.

FIG. 7 is an equivalent circuit diagram of a 3-input NOR circuit used in the present invention. The difference from FIG. 1 is that the 3-input NOR circuit illustrated in FIG. 7 is configured such that two NMOS transistors are connected in parallel and two PMOS transistors are connected in parallel at each input to double the drive current.

The symbols Qn11, Qn12, Qn21, Qn22, Qn31, and Qn32 denote NMOS transistors formed of SGTs, and the symbols Qp11, Qp12, Qp21, Qp22, Qp31, and Qp32 denote PMOS transistors also formed of SGTs. Sources of the NMOS transistors Qn11, Qn12, Qn21, Qn22, Qn31, and Qn32 are connected to a power supply Vss, and drains of the NMOS transistors Qn11, Qn12, Qn21, Qn22, Qn31, and Qn32 are commonly connected to a node N1. The node N1 serves as an output OUT32. Drains of the PMOS transistors Qp11 and Qp12 are each connected to the node N1, and sources of the PMOS transistors Qp11 and Qp12 are connected to drains of the PMOS transistors Qp21 and Qp22 via a node N2, respectively. Sources of the PMOS transistors Qp21 and Qp22 are connected to drains of the PMOS transistors Qp31 and Qp32 via a node N3, respectively. Sources of the PMOS transistors Qp31 and Qp32 are connected to a power supply Vcc. An input signal IN1 is commonly connected to gates of the PMOS transistors Qp11 and Qp12 and gates of the NMOS transistors Qn11 and Qn12, an input signal IN2 is commonly connected to gates of the PMOS transistors Qp21 and Qp22 and gates of the NMOS transistors Qn21 and Qn22, and an input signal IN3 is commonly connected to gates of the PMOS transistors Qp31 and Qp32 and gates of the NMOS transistors Qn31 and Qn32.

Figure 8A:
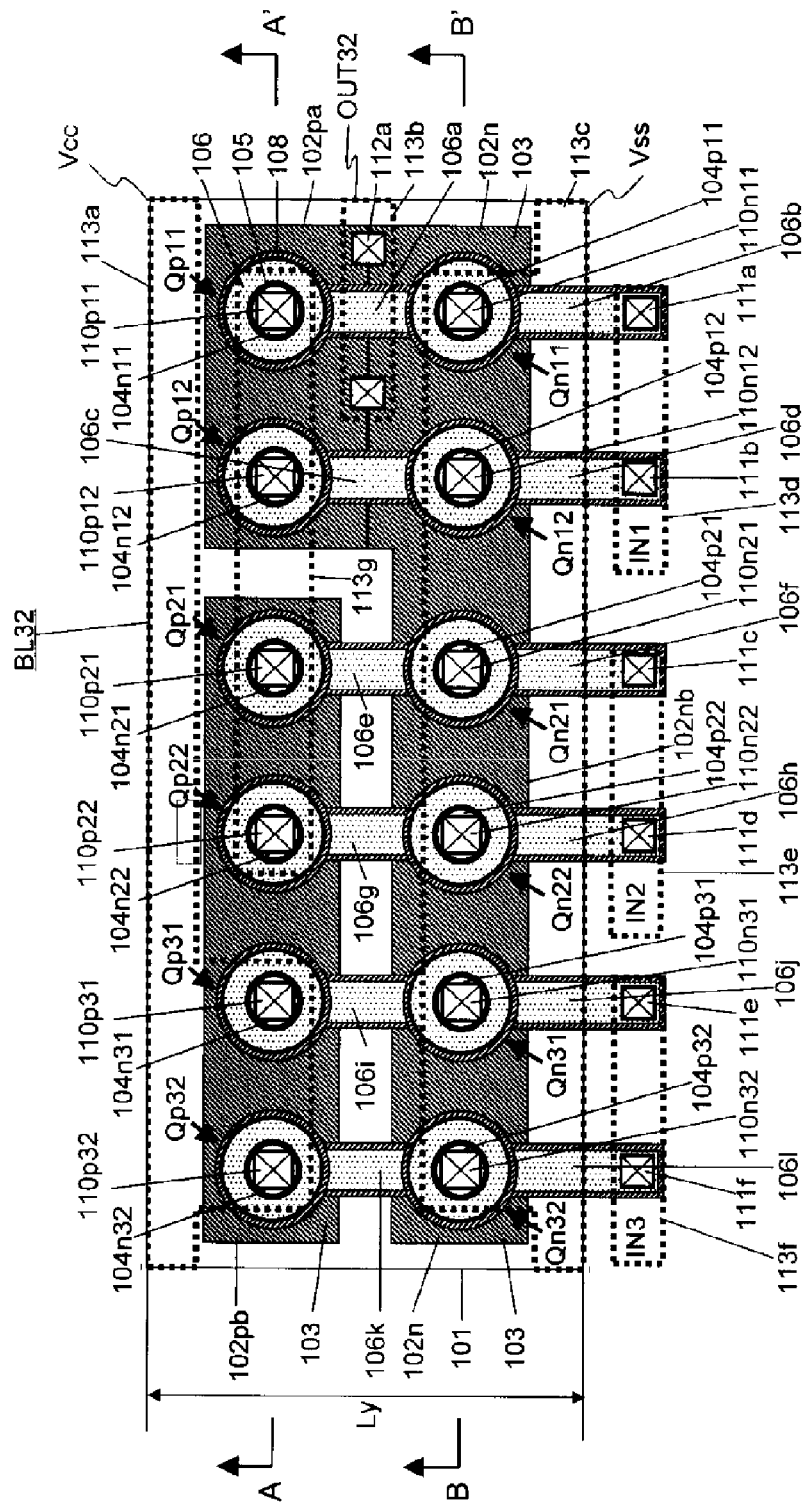
FIG. 8A is a plan view of a NOR circuit according to a fourth embodiment of the present invention.
Figure 8B:
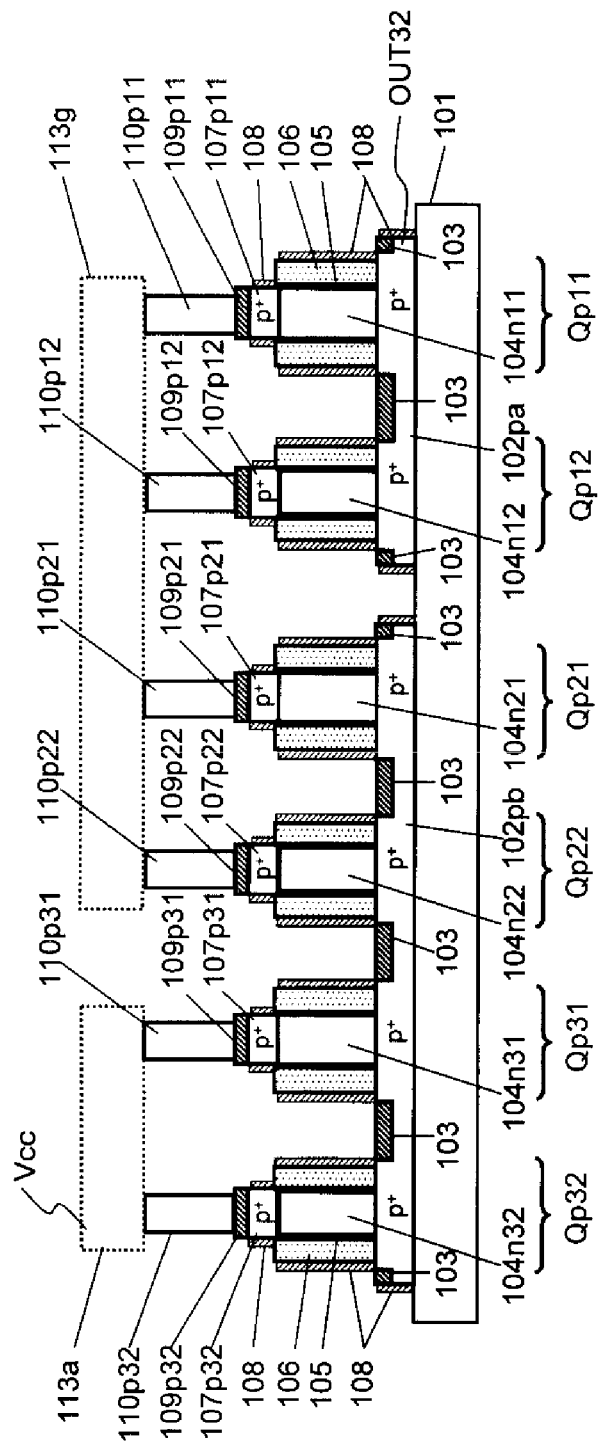
FIG. 8B is a cross-sectional view of the NOR circuit according to the fourth embodiment of the present invention.
Figure 8C:
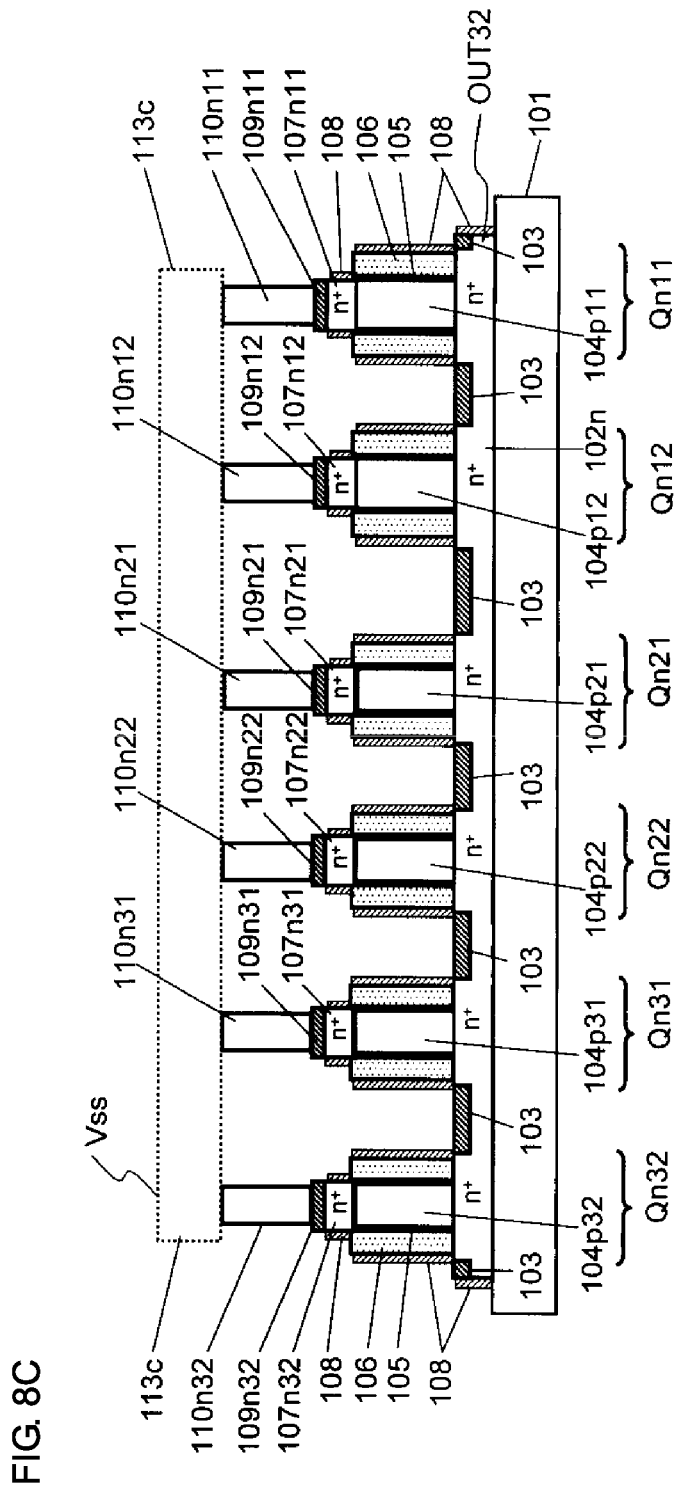
FIG. 8C is a cross-sectional view of the NOR circuit according to the fourth embodiment of the present invention.

FIG. 8A, FIG. 8B, and FIG. 8C illustrate a fourth embodiment. FIG. 8A is a plan view of a layout (arrangement) of a 3-input NOR circuit according to the fourth embodiment of the present invention, FIG. 8B is a cross-sectional view taken along a cut-line A-A', and FIG. 8C is a cross-sectional view taken along a cut-line B-B'. Cross-sectional views taken along vertical lines are substantially the same as those illustrated in FIG. 2D and FIG. 2E, and are not illustrated.

In FIG. 8A, the NMOS transistors Qn11, Qn12, Qn21, Qn22, Qn31, and Qn32 of the NOR circuit illustrated in FIG. 7 are arranged in the first row (the bottom row in FIG. 8A) in order from right to left in FIG. 8A, and the PMOS transistors Qp11, Qp12, Qp21, Qp22, Qp31, and Qp32 are arranged in the second row (the top row in FIG. 8A) in order from right to left in FIG. 8A.

The difference from FIG. 2A is that the PMOS transistors Qp11 and Qp12 connected in parallel are arranged adjacent to one another, and the NMOS transistors Qn11 and Qn12 connected in parallel are also arranged adjacent to one another. The other transistors connected in parallel are also arranged adjacent to one another in a similar manner.

In FIG. 8A, FIG. 8B, and FIG. 8C, the same or substantially the same structures as those illustrated in FIG. 2A, FIG. 2B, and FIG. 2C are denoted by the same reference numerals in the 100s.

An insulating film such as a buried oxide (BOX) film layer 101 disposed on a substrate has formed thereon planar silicon layers 102n, 102pa, and 102pb. The planar silicon layers 102n, 102pa, and 102pb are formed as an n+ diffusion layer, a p+ diffusion layer, and a p+ diffusion layer, respectively, through impurity implantation or the like. A silicide layer 103 disposed on surfaces of the planar silicon layers (102n, 102pa, and 102pb) connects the planar silicon layers 102n and 102pa to one another. Reference numerals 104n11, 104n12, 104n21, 104n22, 104n31, and 104n32 denote n-type silicon pillars, and reference numerals 104p11, 104p12, 104p21, 104p22, 104p31, and 104p32 denote p-type silicon pillars. Reference numeral 105 denotes a gate insulating film that surrounds each of the silicon pillars 104n11, 104n12, 104n21, 104n22, 104n31, 104n32, 104p11, 104p12, 104p21, 104p22, 104p31, and 104p32. Reference numeral 106 denotes a gate electrode, and reference numerals 106a, 106b, 106c, 106d, 106e, 106f, 106g, 106h, 106i, 106j, 106k, and 106l denote each a gate line. P+ diffusion layers 107p11, 107p12, 107p21, 107p22, 107p31, and 107p32 are formed on top portions of the silicon pillars 104n11, 104n12, 104n21, 104n22, 104n31, and 104n32, respectively, through impurity implantation or the like, and n+ diffusion layers 107n11, 107n12, 107n21, 107n22, 107n31, and 107n32 are formed on top portions of the silicon pillars 104p11, 104p12, 104p21, 104p22, 104p31, and 104p32, respectively, through impurity implantation or the like. Reference numeral 108 denotes a silicon nitride film for protection of the gate insulating film 105. Reference numerals 109p11, 109p12, 109p21, 109p22, 109p31, 109p32, 109n11, 109n12, 109n21, 109n22, 109n31, and 109n32 denote silicide layers connected to the p+ diffusion layers 107p11, 107p12, 107p21, 107p22, 107p31, and 107*p*32 and the n+ diffusion layers 107*n*11, 107*n*12, 107*n*21, 107*n*22, 107*n*31, and 107*n*32, respectively. Reference numerals 110*p*11, 110*p*12, 110*p*21, and 110*p*22 denote contact that connects the silicide layers 109*p*11, 109*p*12, 109*p*21, and 109*p*22 to a first metal line 113*g*, reference numerals 110*p*31 and 110*p*32 denote contact that connects the silicide layers 109*p*31 and 109*p*32 to a first metal line 113*a*, and reference numerals 110*n*11, 110*n*12, 110*n*21, 110*n*22, 110*n*31, and 110*n*32 denote contact that connects the silicide layers 109*n*11, 109*n*12, 109*n*21, 109*n*22, 109*n*31, and 109*n*32 to a first metal line 113*c*. Reference numeral 111*a* denotes a contact that connects the gate line 106*b* to a first metal line 113*d*, reference numeral 111*b* denotes a contact that connects the gate line 106*d* to the first metal line 113*d*, reference numeral 111*c* denotes a contact that connects the gate line 106*f* to a first metal line 113*e*, reference numeral 111*d* denotes a contact that connects the gate line 106*h* to the first metal line 113*e*, reference numeral 111*e* denotes a contact that connects the gate line 106*j* to a first metal line 113*f*, and reference numeral 111*f* denotes a contact that connects the gate line 106*l* to the first metal line 113*f*. In the following, the planar silicon layers 102*n*, 102*pa*, and 102*pb* are also referred to as the lower diffusion layers 102*n*, 102*pa*, and 102*pb*, and the diffusion layers 107*p*11, 107*p*12, 107*p*21, 107*p*22, 107*p*31, 107*p*32, 107*n*11, 107*n*12, 107*n*21, 107*n*22, 107*n*31, and 107*n*32 are also referred to as the upper diffusion layers 107*p*11, 107*p*12, 107*p*21, 107*p*22, 107*p*31, 107*p*32, 107*n*11, 107*n*12, 107*n*21, 107*n*22, 107*n*31, and 107*n*32.

Reference numeral 112*a* denotes contacts that connect the silicide layer 103 which connects the lower diffusion layer 102*n* and the lower diffusion layer 102*pa* to one another to a first metal line 113*b*. In FIG. 8A, two contacts 112*a* are used to reduce the effect of silicide resistance.

The silicon pillar 104*n*11, the lower diffusion layer 102*pa*, the upper diffusion layer 107*p*11, the gate insulating film 105, and the gate electrode 106 constitute the PMOS transistor Qp11. The silicon pillar 104*n*12, the lower diffusion layer 102*pa*, the upper diffusion layer 107*p*12, the gate insulating film 105, and the gate electrode 106 constitute the PMOS transistor Qp12. The silicon pillar 104*n*21, the lower diffusion layer 102*pb*, the upper diffusion layer 107*p*21, the gate insulating film 105, and the gate electrode 106 constitute the PMOS transistor Qp21. The silicon pillar 104*n*22, the lower diffusion layer 102*pb*, the upper diffusion layer 107*p*22, the gate insulating film 105, and the gate electrode 106 constitute the PMOS transistor Qp22. The silicon pillar 104*n*31, the lower diffusion layer 102*pb*, the upper diffusion layer 107*p*31, the gate insulating film 105, and the gate electrode 106 constitute the PMOS transistor Qp31. The silicon pillar 104*n*32, the lower diffusion layer 102*pb*, the upper diffusion layer 107*p*32, the gate insulating film 105, and the gate electrode 106 constitute the PMOS transistor Qp32. The silicon pillar 104*p*11, the lower diffusion layer 102*n*, the upper diffusion layer 107*n*11, the gate insulating film 105, and the gate electrode 106 constitute the NMOS transistor Qn11. The silicon pillar 104*p*12, the lower diffusion layer 102*n*, the upper diffusion layer 107*n*12, the gate insulating film 105, and the gate electrode 106 constitute the NMOS transistor Qn12. The silicon pillar 104*p*21, the lower diffusion layer 102*n*, the upper diffusion layer 107*n*21, the gate insulating film 105, and the gate electrode 106 constitute the NMOS transistor Qn21. The silicon pillar 104*p*22, the lower diffusion layer 102*n*, the upper diffusion layer 107*n*22, the gate insulating film 105, and the gate electrode 106 constitute the NMOS transistor Qn22. The silicon pillar 104*p*31, the lower diffusion layer 102*n*, the upper diffusion layer 107*n*31, the gate insulating film 105, and the gate electrode 106 constitute the NMOS transistor Qn31. The silicon pillar 104*p*32, the lower diffusion layer 102*n*, the upper diffusion layer 107*n*32, the gate insulating film 105, and the gate electrode 106 constitute the NMOS transistor Qn32.

In addition, the gate line 106*a* is connected to the gate electrode 106 of the PMOS transistor Qp11, the gate line 106*c* is connected to the gate electrode 106 of the PMOS transistor Qp12, the gate line 106*e* is connected to the gate electrode 106 of the PMOS transistor Qp21, the gate line 106*g* is connected to the gate electrode 106 of the PMOS transistor Qp22, the gate line 106*i* is connected to the gate electrode 106 of the PMOS transistor Qp31, and the gate line 106*k* is connected to the gate electrode 106 of the PMOS transistor Qp32. The gate lines 106*a* and 106*b* are connected to the gate electrode 106 of the NMOS transistor Qn11, the gate lines 106*c* and 106*d* are connected to the gate electrode 106 of the NMOS transistor Qn12, the gate lines 106*e* and 106*f* are connected to the gate electrode 106 of the NMOS transistor Qn21, the gate lines 106*g* and 106*h* are connected to the gate electrode 106 of the NMOS transistor Qn22, the gate lines 106*i* and 106*j* are connected to the gate electrode 106 of the NMOS transistor Qn31, and the gate lines 106*k* and 106*l* are connected to the gate electrode 106 of the NMOS transistor Qn32.

The lower diffusion layers 102*n* and 102*pa* serve as a common drain of the NMOS transistors Qn11, Qn12, Qn21, Qn22, Qn31, and Qn32 and the PMOS transistors Qp11 and Qp12, and are connected to the output OUT32. The upper diffusion layer 107*n*11, which is a source of the NMOS transistor Qn11, is connected to the first metal line 113*c* via the silicide layer 109*n*11 and the contact 110*n*11, and the first metal line 113*c* is supplied with the reference power supply Vss. The upper diffusion layer 107*n*12, which is a source of the NMOS transistor Qn12, is connected to the first metal line 113*c* via the silicide layer 109*n*12 and the contact 110*n*12. The upper diffusion layer 107*n*21, which is a source of the NMOS transistor Qn21, is connected to the first metal line 113*c* via the silicide layer 109*n*21 and the contact 110*n*21. The upper diffusion layer 107*n*22, which is a source of the NMOS transistor Qn22, is connected to the first metal line 113*c* via the silicide layer 109*n*22 and the contact 110*n*22. The upper diffusion layer 107*n*31, which is a source of the NMOS transistor Qn31, is connected to the first metal line 113*c* via the silicide layer 109*n*31 and the contact 110*n*31. The upper diffusion layer 107*n*32, which is a source of the NMOS transistor Qn32, is connected to the first metal line 113*c* via the silicide layer 109*n*32 and the contact 110*n*32. The upper diffusion layer 107*p*11, which is a source of the PMOS transistor Qp11, is connected to the first metal line 113*g* via the silicide layer 109*p*11 and the contact 110*p*11. The upper diffusion layer 107*p*12, which is a source of the PMOS transistor Qp12, is connected to the first metal line 113*g* via the silicide layer 109*p*12 and the contact 110*p*12. The upper diffusion layer 107*p*21, which is a drain of the PMOS transistor Qp21, is connected to the first metal line 113*g* via the silicide layer 109*p*21 and the contact 110*p*21. The upper diffusion layer 107*p*22, which is a drain of the PMOS transistor Qp22, is connected to the first metal line 113*g* via the silicide layer 109*p*22 and the contact 110*p*22. Here, the sources of the PMOS transistors Qp11 and Qp12 and the drains of the PMOS transistors Qp21 and Qp22 are connected to one another via the first metal line 113*g*. Further, sources of the PMOS transistors Qp21 and Qp22 are connected to drains of the PMOS transistors Qp31 and Qp32 via the lower diffusion layer 102*pb* and the silicide layer 103, and sources of the PMOS transistors Qp31 and Qp32 are connected to the first metal line 113a via the contacts 110p31 and 110p32, respectively. The first metal line 113a is supplied with the power supply Vcc.

The input signal IN1 is supplied to the first metal line 113d, connected to the gate lines 106b and 106d via the contacts 111a and 111b, and supplied to the gate electrode 106 of the NMOS transistor Qn11 and the gate electrode 106 of the NMOS transistor Qn12, respectively. The input signal IN1 is further supplied to the gate electrode 106 of the PMOS transistor Qp11 and the gate electrode 106 of the PMOS transistor Qp12 via the gate line 106a and the gate line 106c, respectively.

The input signal IN2 is supplied to the first metal line 113e, connected to the gate lines 106f and 106h via the contacts 111c and 111d, and supplied to the gate electrode 106 of the NMOS transistor Qn21 and the gate electrode 106 of the NMOS transistor Qn22, respectively. The input signal IN2 is further supplied to the gate electrode 106 of the PMOS transistor Qp21 and the gate electrode 106 of the PMOS transistor Qp22 via the gate line 106e and the gate line 106g, respectively.

The input signal IN3 is supplied to the first metal line 113f, connected to the gate lines 106j and 106l via the contacts 111e and 111f, and supplied to the gate electrode 106 of the NMOS transistor Qn31 and the gate electrode 106 of the NMOS transistor Qn32, respectively. The input signal IN3 is further supplied to the gate electrode 106 of the PMOS transistor Qp31 and the gate electrode 106 of the PMOS transistor Qp32 via the gate line 106i and the gate line 106k, respectively.

The 3-input NOR circuit having the configuration described above, which includes the power supply line Vcc (113a) and the reference power supply line Vss (113c), is defined as a block BL32.

Further, as in the first embodiment (FIG. 2A), the distance between the power supply line 113a and the reference power supply line 113c is represented by Ly (the distance between the power supply line and the reference power supply line (both inclusive)).

This embodiment enables twelve SGTs in a 3-input NOR circuit having a configuration in which two NMOS transistors are connected in parallel and two PMOS transistors are connected in parallel at each input to be arranged in two rows and six columns, without using any unnecessary lines or contact regions, and can provide a semiconductor device with a reduced area.

In this embodiment, the numbers of transistors connected in parallel are each two. Alternatively, more than two transistors may be connected in parallel. In a case where, for example, three transistors are connected in parallel, the additional transistor may further be arranged laterally to achieve an arrangement of two rows and nine columns.

Fifth Embodiment

Figure 9:
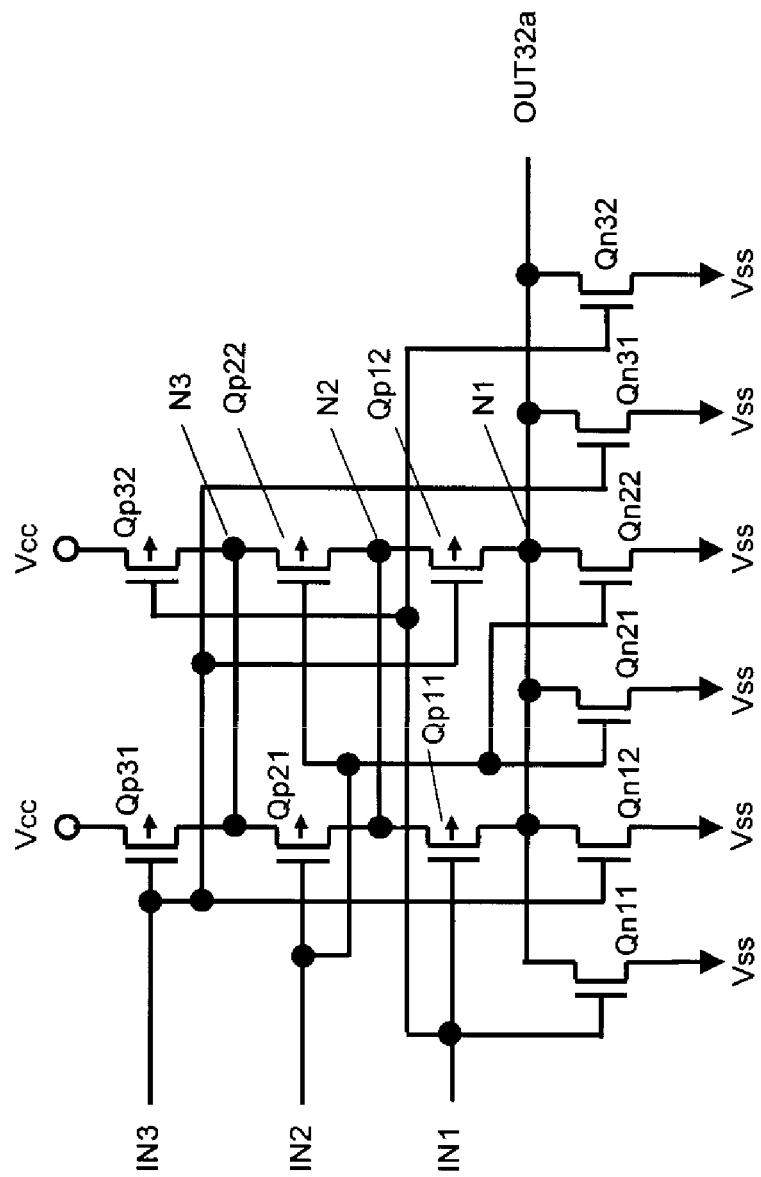
FIG. 9 is an equivalent circuit diagram illustrating a NOR circuit according to an embodiment of the present invention.

FIG. 9 is an equivalent circuit diagram of a circuit that is a 3-input NOR circuit used in the present invention and that is configured such that two NMOS transistors are connected in parallel and two PMOS transistors are connected in parallel at each input to double the drive current. The difference from FIG. 7 is that input signals are supplied to different combinations of two transistors connected in parallel.

In the fourth embodiment (FIG. 8A) with the arrangement in accordance with the circuit diagram illustrated in FIG. 7, the input IN1 is connected to the NMOS transistors Qn11 and Qn12, and a current flows to the output OUT32 through the power supply line 113c (Vss), the contacts 110n11 and 110n12, the NMOS transistors Qn11 and Qn12, the silicide layer 103, the contact 112a, and the first metal line 113b. In this case, the first metal line 113c, the contacts 110n11 and 110n12, the silicide layer 103, the contact 112a, and the first metal line 113b have parasitic wiring resistance; however, the first metal lines 113a and 113b have very low resistance and the contacts 110n11, 110n12, and 112a also have comparatively low resistance, which is not an issue. It is necessary to take the silicide layer 103 into account in terms of parasitic resistance; the illustrated arrangement provides a significantly small silicide region, which is not an issue in terms of parasitic resistance.

In the case of the input IN3, by contrast, in a pathway for the current, the silicide region extending from the drains of the NMOS transistors Qn31 and Qn32 to the contact 112a connected to the first metal line 113b is long, and the parasitic resistance may not be negligible depending on the material of the silicide region.

This embodiment provides improvements in this regard.

Figure 10:
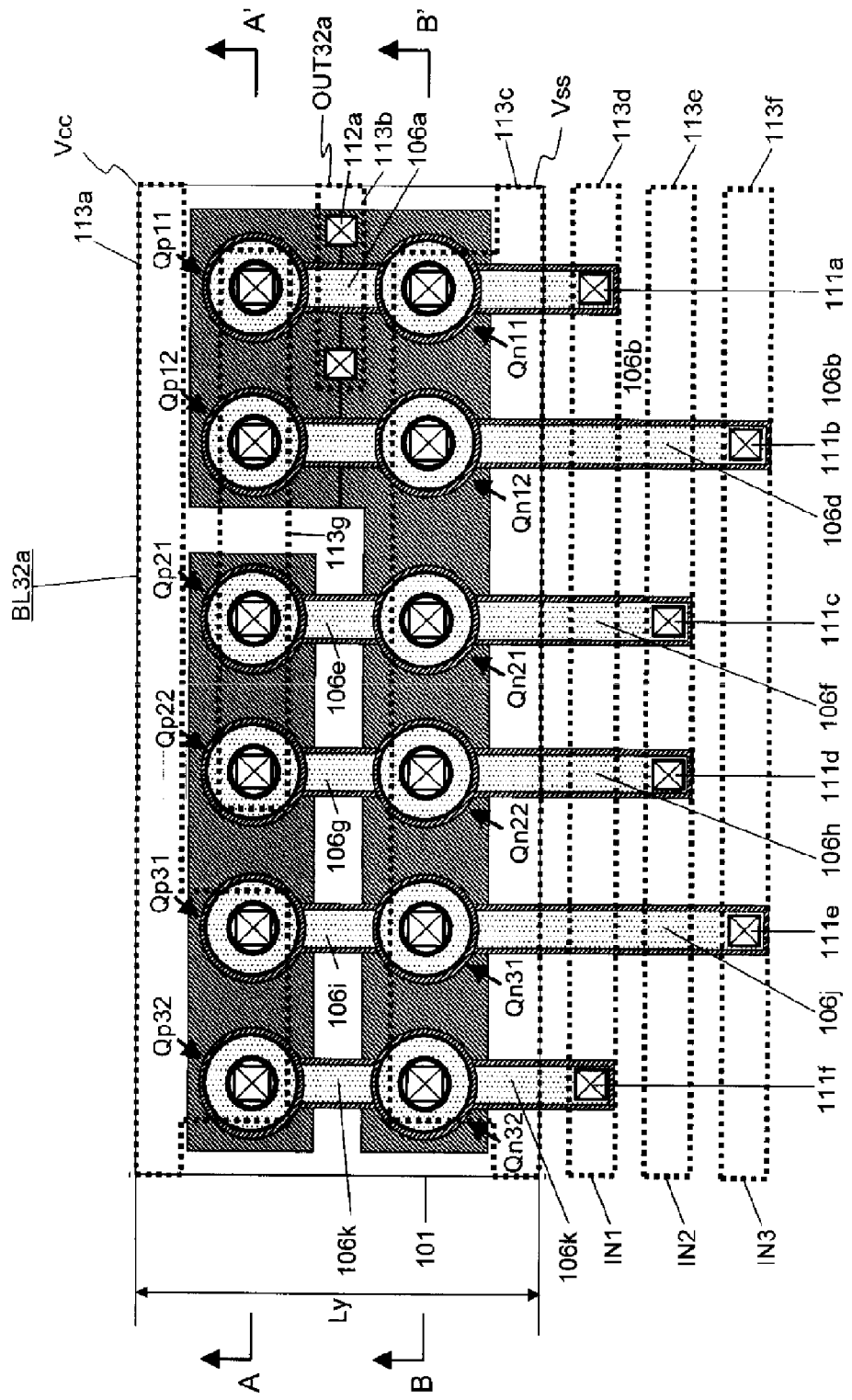
FIG. 10 is a plan view of a NOR circuit according to a fifth embodiment of the present invention.

In FIG. 9, an input signal IN1 is connected to a pair including the NMOS transistor Qn11 and the PMOS transistor Qp11 (in the first column in FIG. 10 described below) and is also connected to a pair including the NMOS transistor Qn32 and the PMOS transistor Qp32 (in the sixth column in FIG. 10). An input signal IN2 is connected to a pair including the NMOS transistor Qn21 and the PMOS transistor Qp21 and a pair including the NMOS transistor Qn22 and the PMOS transistor Qp22 (in the third and fourth columns in FIG. 10). An input signal IN3 is connected to a pair including the NMOS transistor Qn12 and the PMOS transistor Qp12 and a pair including the NMOS transistor Qn31 and the PMOS transistor Qp31 (in the second and fifth columns in FIG. 10).

FIG. 10 illustrates a fifth embodiment. FIG. 10 is a plan view of a layout (arrangement) of a 3-input NOR circuit according to the fifth embodiment of the present invention in which two NMOS transistors are connected in parallel and two PMOS transistors are connected in parallel at each input. The arrangement of the transistors is the same as that illustrated in FIG. 8A, and some of the reference numerals representing the same portions are not given. The difference from FIG. 8A is that the connections of input signals to pairs including NMOS transistors Qnk and PMOS transistors Qpk (k=1 to 6) arranged in the first to sixth columns from the right in FIG. 8A differ.

In FIG. 10, the input signals IN1, IN2, and IN3 are supplied to the first metal lines 113d, 113e, and 113f, respectively.

The input signal IN1 is connected to the gate electrodes 106 of the pair including the NMOS transistor Qn11 and the PMOS transistor Qp11 in the first column via the first metal line 113d, the contact 111a, and the gate lines 106b and 106a.

The input signal IN3 is connected to the gate electrodes 106 of the pair including the NMOS transistor Qn12 and the PMOS transistor Qp12 in the second column via the first metal line 113f, the contact 111b, and the gate lines 106d and 106c.

The input signal IN2 is connected to the gate electrodes 106 of the pair including the NMOS transistor Qn21 and the PMOS transistor Qp21 in the third column via the first metal line 113e, the contact 111c, and the gate lines 106f and 106e.

The input signal IN2 is connected to the gate electrodes 106 of the pair including the NMOS transistor Qn22 and the PMOS transistor Qp22 in the fourth column via the first metal line 113*e*, the contact 111*d*, and the gate lines 106*h* and 106*g*.

The input signal IN3 is connected to the gate electrodes 106 of the pair including the NMOS transistor Qn31 and the PMOS transistor Qp31 in the fifth column via the first metal line 113*f*, the contact 111*e*, and the gate lines 106*j* and 106*i*.

The input signal IN1 is connected to the gate electrodes 106 of the pair including the NMOS transistor Qn32 and the PMOS transistor Qp32 in the sixth column via the first metal line 113*d*, the contact 111*f*, and the gate lines 106*l* and 106*k*.

The input signal IN1 is connected to the pair in the first column (with the shortest silicide region and a low parasitic resistance) and the pair in the sixth column (with the longest silicide region and a high parasitic resistance), the input signal IN2 is connected to the pair in the third column and the pair in the fourth column (with intermediate-length silicide regions and intermediate parasitic resistances), and the input signal IN3 is connected to the pair in the second column (with a short silicide region and a low parasitic resistance) and the pair in the fifth column (with a long silicide region and a high parasitic resistance). The connections described above make the averages of the parasitic resistances of pairs of silicide regions to which the respective input signals are connected equivalent to one another, substantially eliminating any differences in characteristics due to the difference in the positions of the columns.

The 3-input NOR circuit having the configuration described above, which includes the power supply line Vcc (113*a*) and the reference power supply line Vss (113*c*), is defined as a block BL32*a*.

Further, as in the first embodiment (FIG. 2A), the distance between the power supply line 113*a* and the reference power supply line 113*c* is represented by Ly (the distance between the power supply line and the reference power supply line (both inclusive)).

This embodiment enables twelve SGTs in a 3-input NOR circuit having a configuration in which two NMOS transistors are connected in parallel and two PMOS transistors are connected in parallel at each input to be arranged in two rows and six columns, without using any unnecessary lines or contact regions, and can provide a semiconductor device with desired characteristics achieved and with a reduced area.

Sixth Embodiment

Figure 11A:
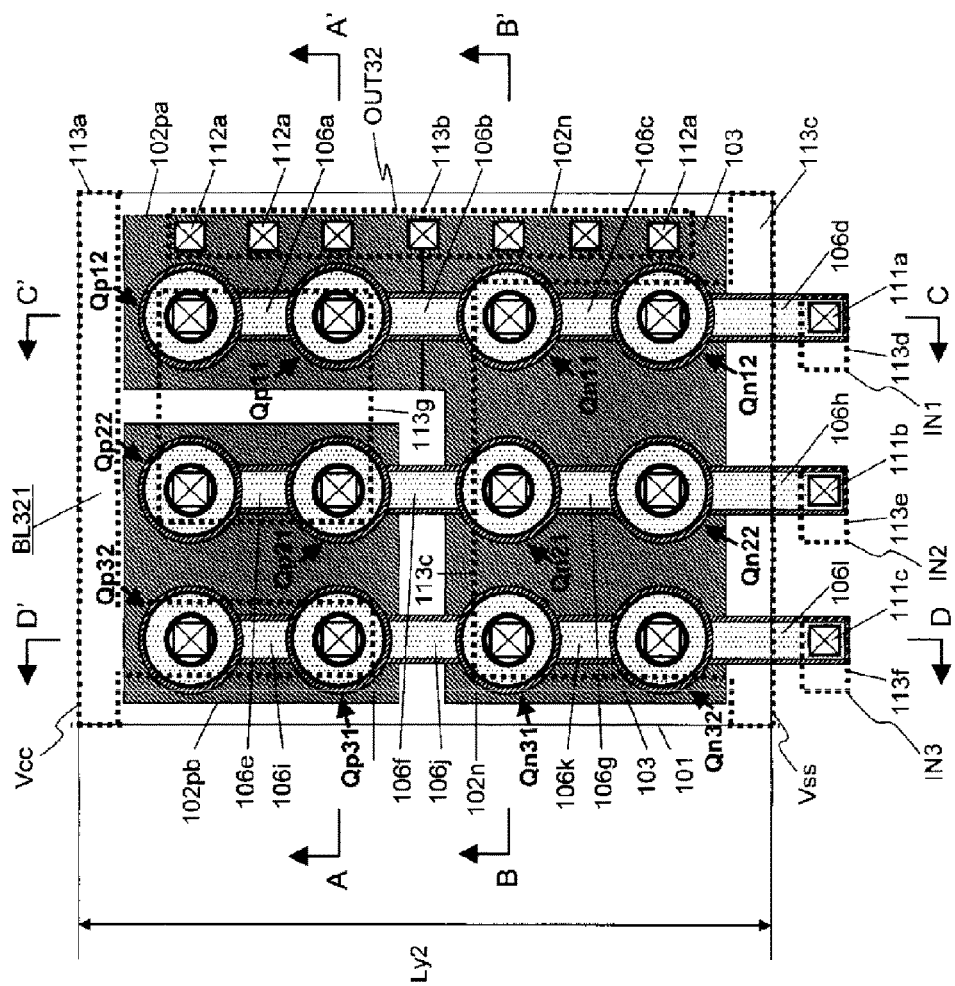
FIG. 11A is a plan view of a NOR circuit according to a sixth embodiment of the present invention.
Figure 11B:
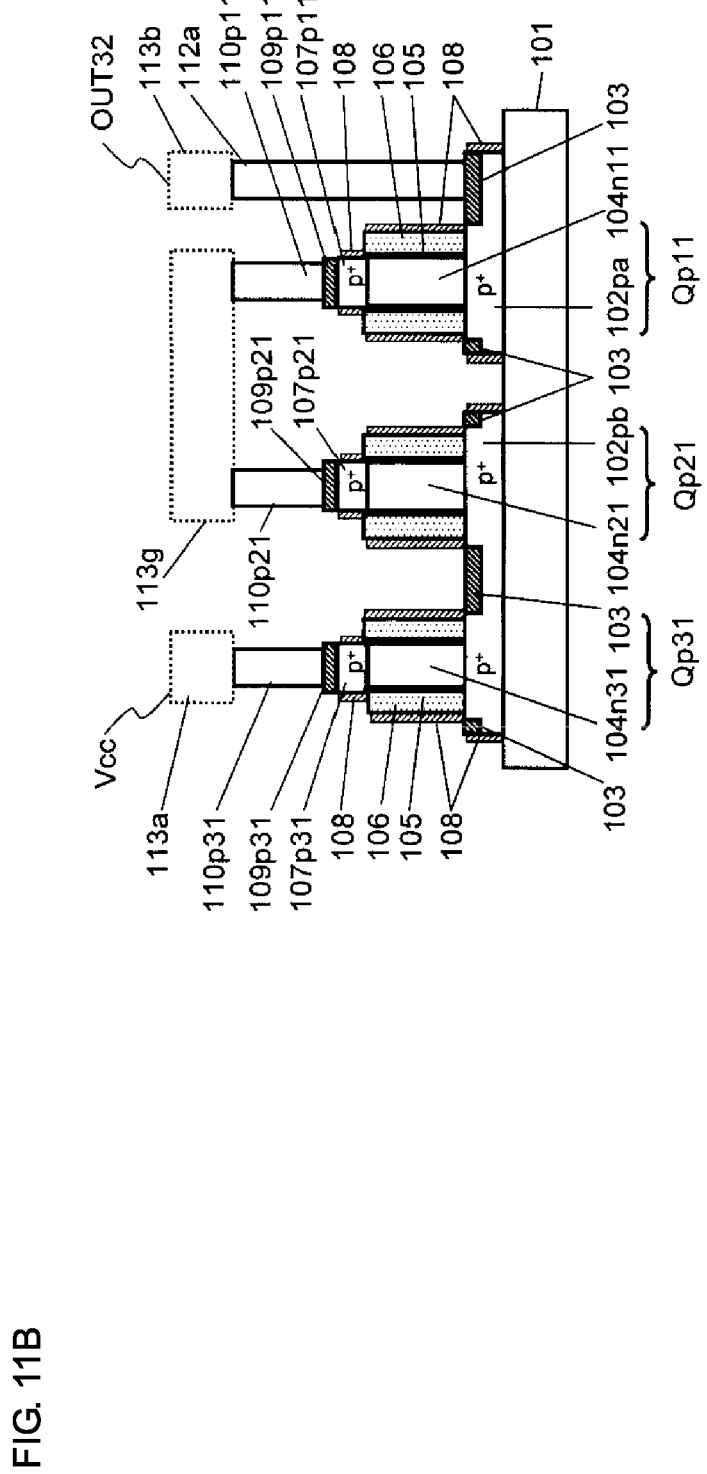
FIG. 11B is a cross-sectional view of the NOR circuit according to the sixth embodiment of the present invention.
Figure 11C:
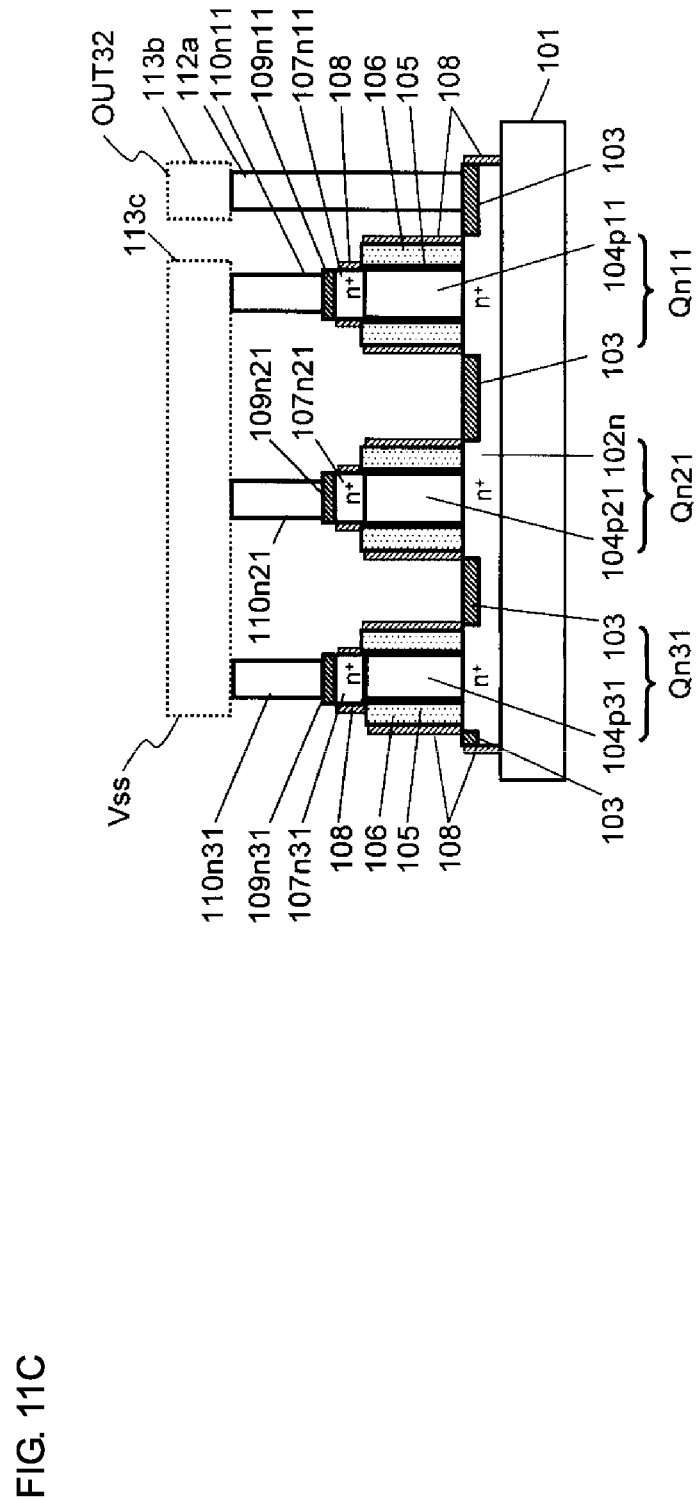
FIG. 11C is a cross-sectional view of the NOR circuit according to the sixth embodiment of the present invention.
Figure 11D:
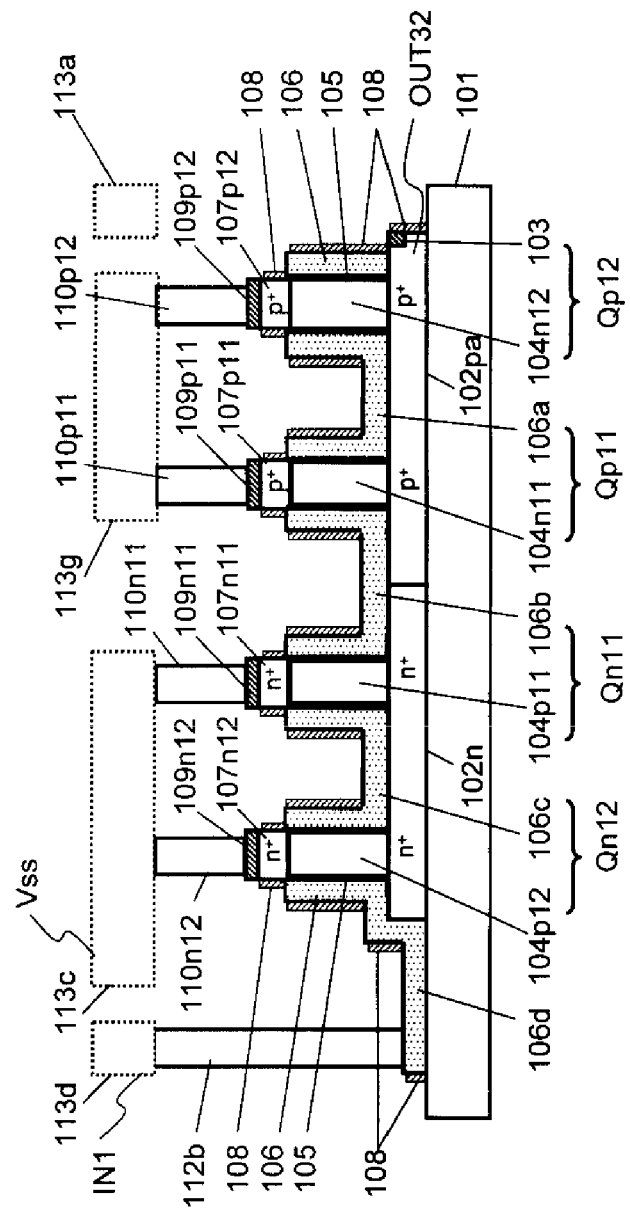
FIG. 11D is a cross-sectional view of the NOR circuit according to the sixth embodiment of the present invention.
Figure 11E:
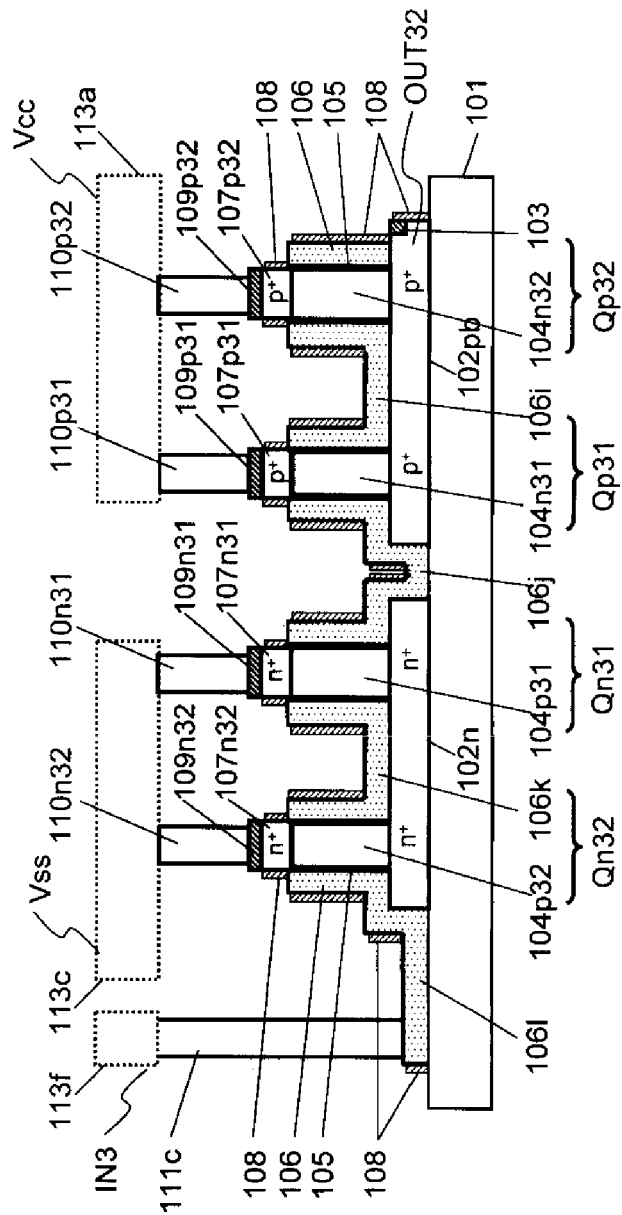
FIG. 11E is a cross-sectional view of the NOR circuit according to the sixth embodiment of the present invention.

FIG. 11A, FIG. 11B, FIG. 11C, FIG. 11D, and FIG. 11E illustrate a sixth embodiment. An equivalent circuit diagram is as illustrated in FIG. 7. FIG. 11A is a plan view of a layout (arrangement) of a 3-input NOR circuit according to the sixth embodiment of the present invention, FIG. 11B is a cross-sectional view taken along a cut-line A-A', FIG. 11C is a cross-sectional view taken along a cut-line B-B', FIG. 11D is a cross-sectional view taken along a cut-line C-C', and FIG. 11E is a cross-sectional view taken along a cut-line D-D'.

The difference from FIG. 8A (the fourth embodiment) is that, whereas FIG. 8A illustrates an arrangement of two rows and six columns, this embodiment provides an arrangement of four rows and three columns.

In FIG. 11A, the NMOS transistors Qn12, Qn22, and Qn32 of the NOR circuit illustrated in FIG. 7 are arranged in the first row (the bottom row in FIG. 11A) in order from right to left in FIG. 11A, the NMOS transistors Qn11, Qn21, and Qn31 are arranged in the second row in order from right to left in FIG. 11A, the PMOS transistors Qp11, Qp21, and Qp31 are arranged in the third row in order from right to left in FIG. 11A, and the PMOS transistors Qp12, Qp22, and Qp32 are arranged in the fourth row in order from right to left in FIG. 11A.

In FIG. 11A, FIG. 11B, and FIG. 11C, the same or substantially the same structures as those illustrated in FIG. 8A, FIG. 8B, and FIG. 8C are denoted by the same reference numerals in the 100s.

An insulating film such as a buried oxide (BOX) film layer 101 disposed on a substrate has formed thereon planar silicon layers 102*n*, 102*pa*, and 102*pb*. The planar silicon layers 102*n*, 102*pa*, and 102*pb* are formed as an n+ diffusion layer, a p+ diffusion layer, and a p+ diffusion layer, respectively, through impurity implantation or the like. A silicide layer 103 disposed on surfaces of the planar silicon layers (102*n*, 102*pa*, and 102*pb*) connects the planar silicon layers 102*n* and 102*pa* to one another. Reference numerals 104*n*11, 104*n*12, 104*n*21, 104*n*22, 104*n*31, and 104*n*32 denote n-type silicon pillars, and reference numerals 104*p*11, 104*p*12, 104*p*21, 104*p*22, 104*p*31, and 104*p*32 denote p-type silicon pillars. Reference numeral 105 denotes a gate insulating film that surrounds each of the silicon pillars 104*n*11, 104*n*12, 104*n*21, 104*n*22, 104*n*31, 104*n*32, 104*p*11, 104*p*12, 104*p*21, 104*p*22, 104*p*31, and 104*p*32. Reference numeral 106 denotes a gate electrode, and reference numerals 106*a*, 106*b*, 106*c*, 106*d*, 106*e*, 106*f*, 106*g*, 106*h*, 106*i*, 106*j*, 106*k*, and 106*l* denote each a gate line. P+ diffusion layers 107*p*11, 107*p*12, 107*p*21, 107*p*22, 107*p*31, and 107*p*32 are formed on top portions of the silicon pillars 104*n*11, 104*n*12, 104*n*21, 104*n*22, 104*n*31, and 104*n*32, respectively, through impurity implantation or the like, and n+ diffusion layers 107*n*11, 107*n*12, 107*n*21, 107*n*22, 107*n*31, and 107*n*32 are formed on top portions of the silicon pillars 104*p*11, 104*p*12, 104*p*21, 104*p*22, 104*p*31, and 104*p*32, respectively, through impurity implantation or the like. Reference numeral 108 denotes a silicon nitride film for protection of the gate insulating film 105. Reference numerals 109*p*11, 109*p*12, 109*p*21, 109*p*22, 109*p*31, 109*p*32, 109*n*11, 109*n*12, 109*n*21, 109*n*22, 109*n*31, and 109*n*32 denote silicide layers connected to the p+ diffusion layers 107*p*11, 107*p*12, 107*p*21, 107*p*22, 107*p*31, and 107*p*32 and the n+ diffusion layers 107*n*11, 107*n*12, 107*n*21, 107*n*22, 107*n*31, and 107*n*32, respectively. Reference numerals 110*p*11, 110*p*12, 110*p*21, and 110*p*22 denote contacts that connect the silicide layers 109*p*11, 109*p*12, 109*p*21, and 109*p*22 to a first metal line 113*g*, reference numerals 110*p*31 and 110*p*32 denote contacts that connect the silicide layers 109*p*31 and 109*p*32 to a first metal line 113*a*, and reference numerals 110*n*11, 110*n*12, 110*n*21, 110*n*22, 110*n*31, and 110*n*32 denote contacts that connect the silicide layers 109*n*11, 109*n*12, 109*n*21, 109*n*22, 109*n*31, and 109*n*32 to a first metal line 113*c*. Reference numeral 111*a* denotes a contact that connects the gate line 106*d* to a first metal line 113*d*, reference numeral 111*b* denotes a contact that connects the gate line 106*h* to a first metal line 113*e*, and reference numeral 111*c* denotes a contact that connects the gate line 106*l* to a first metal line 113*f*. In the following, the planar silicon layers 102*n*, 102*pa*, and 102*pb* are also referred to as the lower diffusion layers 102*n*, 102*pa*, and 102*pb*, and the diffusion layers 107*p*11, 107*p*12, 107*p*21, 107*p*22, 107*p*31, 107*p*32, 107*n*11, 107*n*12, 107*n*21, 107*n*22, 107*n*31, and 107*n*32 are also referred to as the upper diffusion layers 107*p*11, 107*p*12, 107*p*21, 107*p*22, 107*p*31, 107*p*32, 107*n*11, 107*n*12, 107*n*21, 107*n*22, 107*n*31, and 107*n*32.

Reference numeral 112*a* denotes contacts (in FIG. 11A, seven contacts) that connect the silicide layer 103 which connects the lower diffusion layer 102n and the lower diffusion layer 102pa to one another to the first metal line 113b.

The silicon pillar 104n11, the lower diffusion layer 102pa, the upper diffusion layer 107p11, the gate insulating film 105, and the gate electrode 106 constitute the PMOS transistor Qp11. The silicon pillar 104n12, the lower diffusion layer 102pa, the upper diffusion layer 107p12, the gate insulating film 105, and the gate electrode 106 constitute the PMOS transistor Qp12. The silicon pillar 104n21, the lower diffusion layer 102pb, the upper diffusion layer 107p21, the gate insulating film 105, and the gate electrode 106 constitute the PMOS transistor Qp21. The silicon pillar 104n22, the lower diffusion layer 102pb, the upper diffusion layer 107p22, the gate insulating film 105, and the gate electrode 106 constitute the PMOS transistor Qp22. The silicon pillar 104n31, the lower diffusion layer 102pb, the upper diffusion layer 107p31, the gate insulating film 105, and the gate electrode 106 constitute the PMOS transistor Qp31. The silicon pillar 104n32, the lower diffusion layer 102pb, the upper diffusion layer 107p32, the gate insulating film 105, and the gate electrode 106 constitute the PMOS transistor Qp32. The silicon pillar 104p11, the lower diffusion layer 102n, the upper diffusion layer 107n11, the gate insulating film 105, and the gate electrode 106 constitute the NMOS transistor Qn11. The silicon pillar 104p12, the lower diffusion layer 102n, the upper diffusion layer 107n12, the gate insulating film 105, and the gate electrode 106 constitute the NMOS transistor Qn12. The silicon pillar 104p21, the lower diffusion layer 102n, the upper diffusion layer 107n21, the gate insulating film 105, and the gate electrode 106 constitute the NMOS transistor Qn21. The silicon pillar 104p22, the lower diffusion layer 102n, the upper diffusion layer 107n22, the gate insulating film 105, and the gate electrode 106 constitute the NMOS transistor Qn22. The silicon pillar 104p31, the lower diffusion layer 102n, the upper diffusion layer 107n31, the gate insulating film 105, and the gate electrode 106 constitute the NMOS transistor Qn31. The silicon pillar 104p32, the lower diffusion layer 102n, the upper diffusion layer 107n32, the gate insulating film 105, and the gate electrode 106 constitute the NMOS transistor Qn32.

In addition, the gate lines 106a and 106b are connected to the gate electrode 106 of the PMOS transistor Qp11, and the gate line 106a is connected to the gate electrode 106 of the PMOS transistor Qp12. The gate lines 106e and 106f are connected to the gate electrode 106 of the PMOS transistor Qp21, and the gate line 106e is connected to the gate electrode 106 of the PMOS transistor Qp22. The gate lines 106i and 106j are connected to the gate electrode 106 of the PMOS transistor Qp31, and the gate line 106i is connected to the gate electrode 106 of the PMOS transistor Qp32. The gate lines 106b and 106c are connected to the gate electrode 106 of the NMOS transistor Qn11, the gate lines 106c and 106d are connected to the gate electrode 106 of the NMOS transistor Qn12, the gate lines 106f and 106g are connected to the gate electrode 106 of the NMOS transistor Qn21, the gate lines 106g and 106h are connected to the gate electrode 106 of the NMOS transistor Qn22, the gate lines 106j and 106k are connected to the gate electrode 106 of the NMOS transistor Qn31, and the gate lines 106k and 106l are connected to the gate electrode 106 of the NMOS transistor Qn32.

The lower diffusion layers 102n and 102pa serve as a common drain of the NMOS transistors Qn11, Qn12, Qn21, Qn22, Qn31, and Qn32 and the PMOS transistors Qp11 and Qp12, and are connected to the output OUT32. The upper diffusion layer 107n11, which is a source of the NMOS transistor Qn11, is connected to the first metal line 113c via the silicide layer 109n11 and the contact 110n11, and the first metal line 113c is supplied with the reference power supply Vss. The upper diffusion layer 107n12, which is a source of the NMOS transistor Qn12, is connected to the first metal line 113c via the silicide layer 109n12 and the contact 110n12. The upper diffusion layer 107n21, which is a source of the NMOS transistor Qn21, is connected to the first metal line 113c via the silicide layer 109n21 and the contact 110n21. The upper diffusion layer 107n22, which is a source of the NMOS transistor Qn22, is connected to the first metal line 113c via the silicide layer 109n22 and the contact 110n22. The upper diffusion layer 107n31, which is a source of the NMOS transistor Qn31, is connected to the first metal line 113c via the silicide layer 109n31 and the contact 110n31. The upper diffusion layer 107n32, which is a source of the NMOS transistor Qn32, is connected to the first metal line 113c via the silicide layer 109n32 and the contact 110n32. The upper diffusion layer 107p11, which is a source of the PMOS transistor Qp11, is connected to the first metal line 113g via the silicide layer 109p11 and the contact 110p11. The upper diffusion layer 107p12, which is a source of the PMOS transistor Qp12, is connected to the first metal line 113g via the silicide layer 109p12 and the contact 110p12. The upper diffusion layer 107p21, which is a drain of the PMOS transistor Qp21, is connected to the first metal line 113g via the silicide layer 109p21 and the contact 110p21. The upper diffusion layer 107p22, which is a drain of the PMOS transistor Qp22, is connected to the first metal line 113g via the silicide layer 109p22 and the contact 110p22. Here, the sources of the PMOS transistors Qp11 and Qp12 and the drains of the PMOS transistors Qp21 and Qp22 are connected to one another via the first metal line 113g. Further, sources of the PMOS transistors Qp21 and Qp22 are connected to drains of the PMOS transistors Qp31 and Qp32 via the lower diffusion layer 102pb and the silicide layer 103, and sources of the PMOS transistors Qp31 and Qp32 are connected to the first metal line 113a via the contacts 110p31 and 110p32, respectively. The first metal line 113a is supplied with the power supply Vcc.

The first metal line 113d is supplied with the input signal IN1. The input signal IN1 is connected to the gate line 106d via the contact 111a, and supplied to the gate electrode 106 of the NMOS transistor Qn12. The input signal IN1 is further supplied to the gate electrode 106 of the NMOS transistor Qn11 and the gate electrodes 106 of the PMOS transistors Qp11 and Qp12 via the gate lines 106c, 106b, and 106a, respectively.

The first metal line 113e is supplied with the input signal IN2. The input signal IN2 is connected to the gate line 106h via the contact 111b, and supplied to the gate electrode 106 of the NMOS transistor Qn22. The input signal IN2 is further supplied to the gate electrode 106 of the NMOS transistor Qn21 and the gate electrodes 106 of the PMOS transistors Qp21 and Qp22 via the gate lines 106g, 106f, and 106e, respectively.

The first metal line 113f is supplied with the input signal IN3. The input signal IN3 is connected to the gate line 106l via the contact 111c, and supplied to the gate electrode 106 of the NMOS transistor Qn32. The input signal IN3 is further supplied to the gate electrode 106 of the NMOS transistor Qn31 and the gate electrodes 106 of the PMOS transistors Qp31 and Qp32 via the gate lines 106k, 106j and 106i, respectively.

This embodiment is advantageous in that an arrangement of four rows and three columns can reduce the parasitic resistance in the silicide layer, which is a challenging issue discussed in FIG. 8A. In a pathway for the current, the parasitic resistance of the silicide layer is the largest at a location in which the reference power supply Vss supplied to the first metal line 113c flows to the first metal line 113b through the NMOS transistors Qn31 and Qn32, the silicide layer 103, and the contact 112a. As compared to FIG. 8A, the length of the silicide region is reduced to one-half, and the width of the silicide region is increased almost twofold, resulting in the resistance value being reduced to a quarter (¼), which leads to a large effect.

The 3-input NOR circuit having the configuration described above, which includes the power supply line Vcc (113a) and the reference power supply line Vss (113c), is defined as a block BL321.

Further, the distance between the power supply line 113a and the reference power supply line 113c is represented by Ly2 (the distance between the power supply line and the reference power supply line (both inclusive)). Since implementations of an arrangement of four rows, as in this embodiment, are common, Ly2, which is different from Ly illustrated in FIG. 2A according to the first embodiment, may be used as a standard of an arrangement of four rows and n columns.

This embodiment enables twelve SGTs in a 3-input NOR circuit having a configuration in which two NMOS transistors are connected in parallel and two PMOS transistors are connected in parallel at each input to be arranged in four rows and three columns, without using any unnecessary lines or contact regions, and can provide a semiconductor device with desired characteristics achieved and with a reduced area.

While two transistors connected in parallel are used in this embodiment, a plurality of transistors more than two transistors may be connected in parallel in order to obtain a larger current. For example, in the case of three transistors connected in parallel, an arrangement of six rows and three columns is also achievable easily.

In order to further increase the number of transistors connected in parallel, this embodiment and the fourth embodiment (FIG. 8A) may be used in combination. For example, for the construction of a 3-input NAND circuit with a parallel connection of four transistors, an arrangement of four rows and six columns provides a semiconductor device with desired characteristics and a reduced area.

Seventh Embodiment

Figure 12:
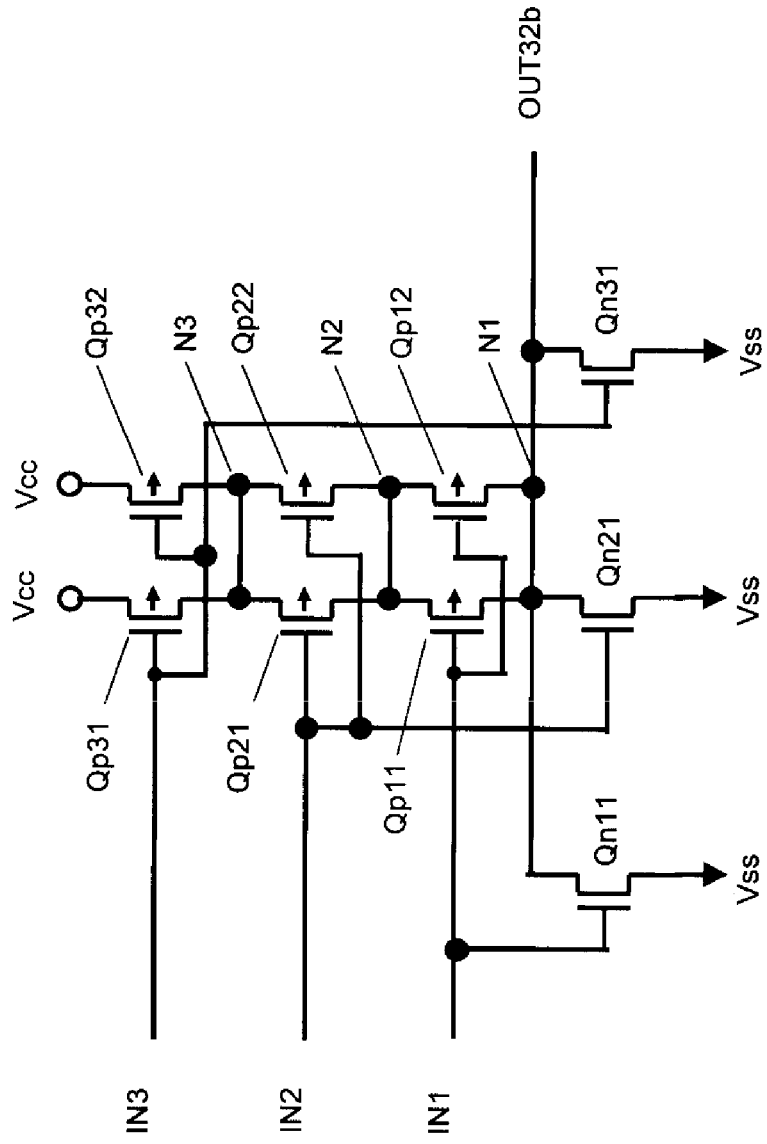
FIG. 12 is an equivalent circuit diagram illustrating a NOR circuit according to an embodiment of the present invention.

FIG. 12 is an equivalent circuit diagram of a 3-input NOR circuit used in the present invention. The difference from FIG. 9 is that the 3-input NOR circuit illustrated in FIG. 12 is configured such that two PMOS transistors are connected in parallel at each input to double the PMOS-side drive current.

In a NOR circuit, a series connection of PMOS transistors causes a reduction in current, which is not generally a significant issue. However, an increase in the number of NOR stages may cause an imbalance in magnitude between the current flowing through NMOS transistors and the current flowing through PMOS transistors connected in series, and, in some cases, a plurality of PMOS transistors may be connected in parallel in order to make a charge current (a current flowing through PMOS transistors) and a discharge current (a current flowing through NMOS transistors) equal as much as possible or in order to achieve rapid discharging.

In this embodiment, a description will be given of a case where two PMOS transistors are connected in parallel.

The symbols Qn11, Qn21, and Qn31 denote NMOS transistors formed of SGTs, and the symbols Qp11, Qp12, Qp21, Qp22, Qp31, and Qp32 denote PMOS transistors also formed of SGTs. Sources of the NMOS transistors Qn11, Qn21, and Qn31 are connected to a reference power supply Vss, and drains of the NMOS transistors Qn11, Qn21, and Qn31 are commonly connected to a node N1. The node N1 serves as an output OUT32b. Drains of the PMOS transistors Qp11 and Qp12 are each connected to the node N1, and sources of the PMOS transistors Qp11 and Qp12 are connected to drains of the PMOS transistors Qp21 and Qp22 via a node N2, respectively. Sources of the PMOS transistors Qp21 and Qp22 are connected to drains of the PMOS transistors Qp31 and Qp32 via a node N3, respectively. Sources of the PMOS transistors Qp31 and Qp32 are connected to a power supply Vcc. An input signal IN1 is commonly connected to a gate of the NMOS transistor Qn11 and gates of the PMOS transistors Qp11 and Qp12, an input signal IN2 is commonly connected to a gate of the NMOS transistor Qn21 and gates of the PMOS transistors Qp21 and Qp22, and an input signal IN3 is commonly connected to a gate of the NMOS transistor Qn31 and gates of the PMOS transistors Qp31 and Qp32.

Figure 13A:
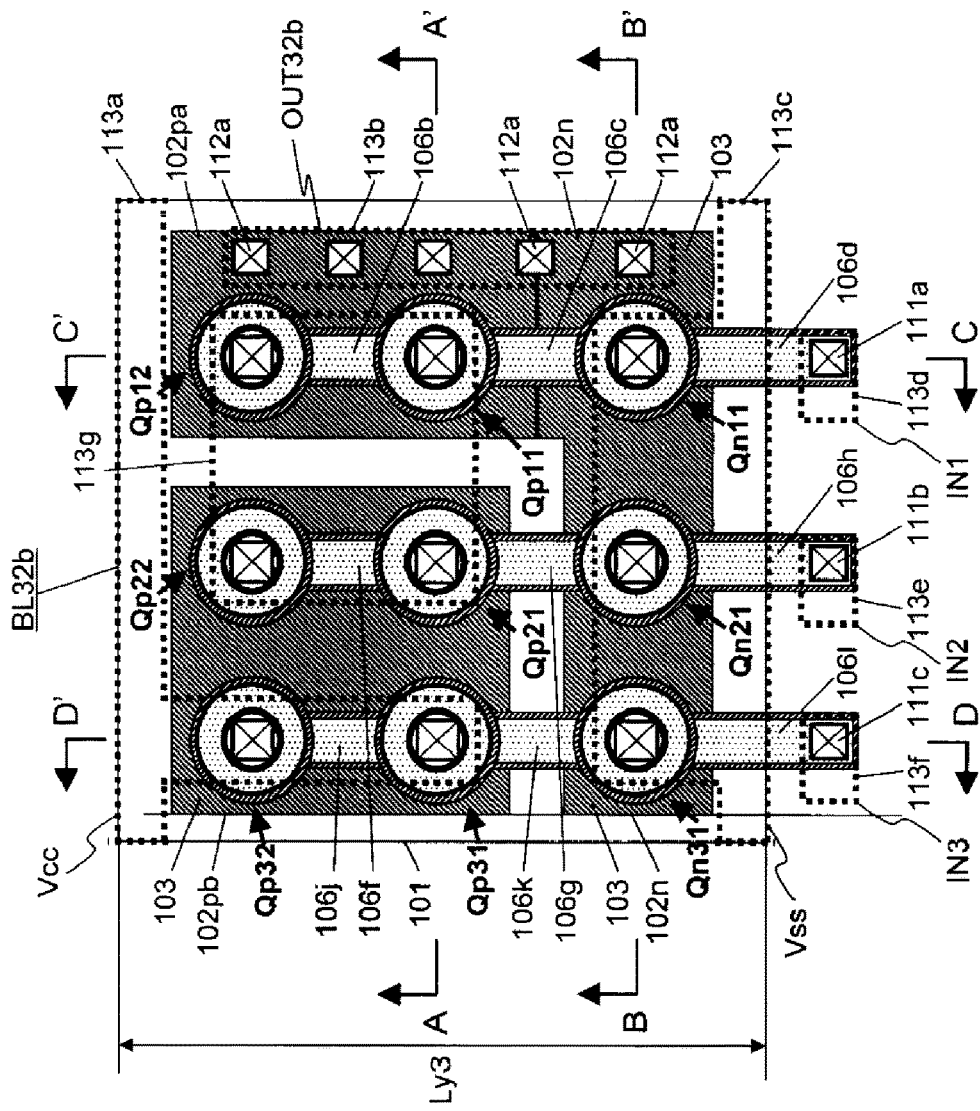
FIG. 13A is a plan view of a NOR circuit according to a seventh embodiment of the present invention.
Figure 13B:
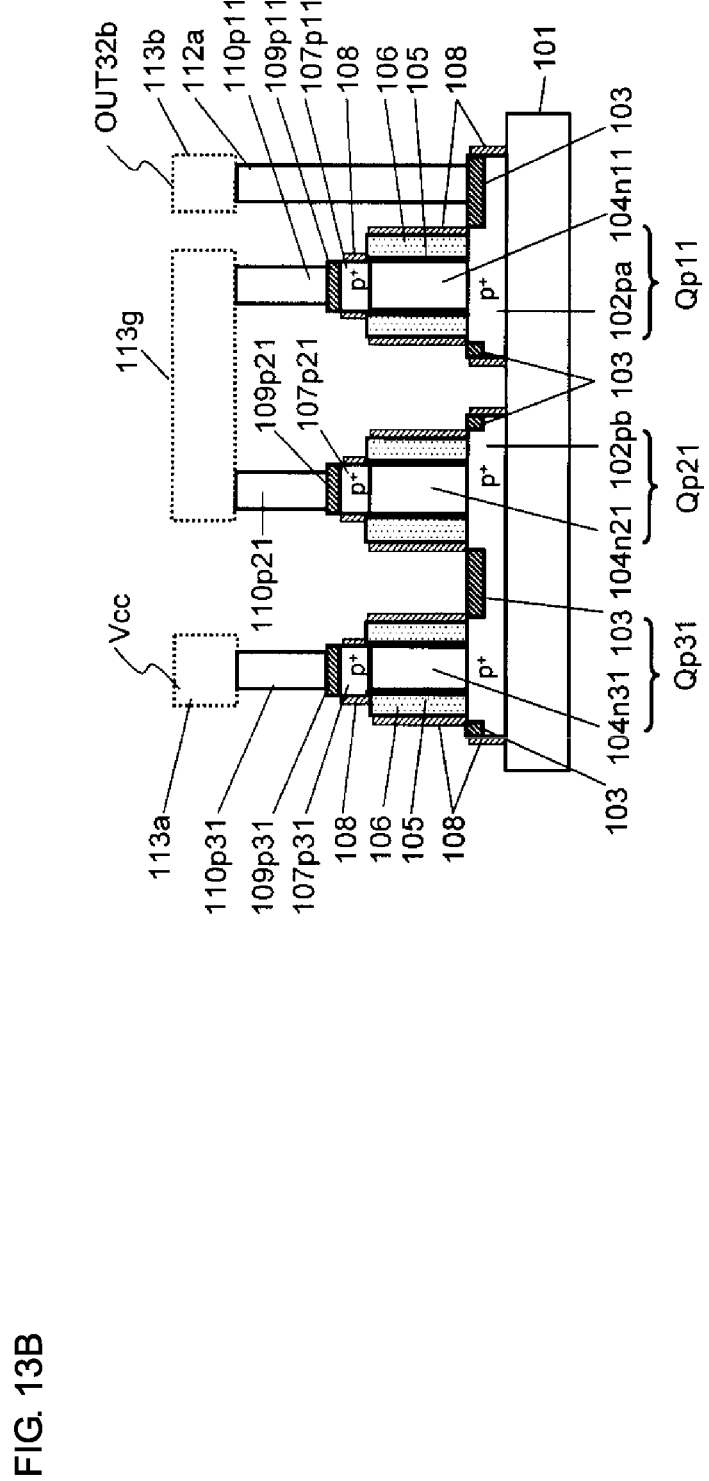
FIG. 13B is a cross-sectional view of the NOR circuit according to the seventh embodiment of the present invention.
Figure 13C:
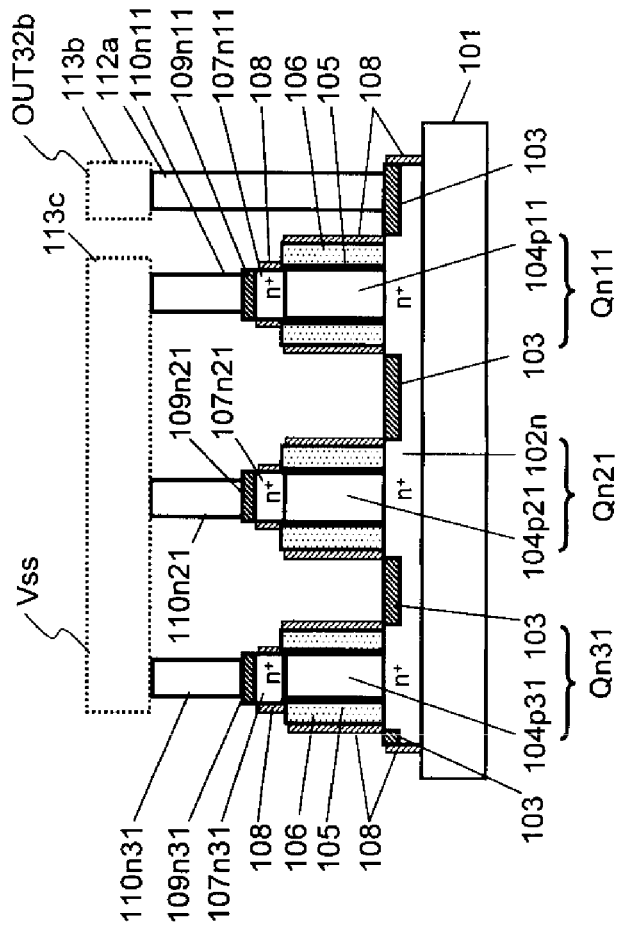
FIG. 13C is a cross-sectional view of the NOR circuit according to the seventh embodiment of the present invention.
Figure 13D:
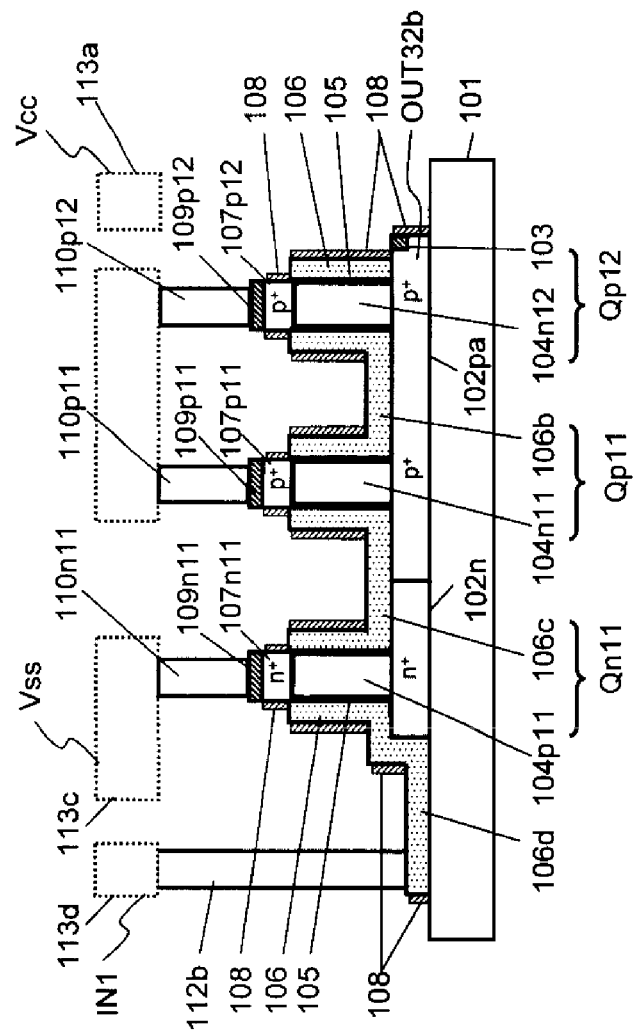
FIG. 13D is a cross-sectional view of the NOR circuit according to the seventh embodiment of the present invention.
Figure 13E:
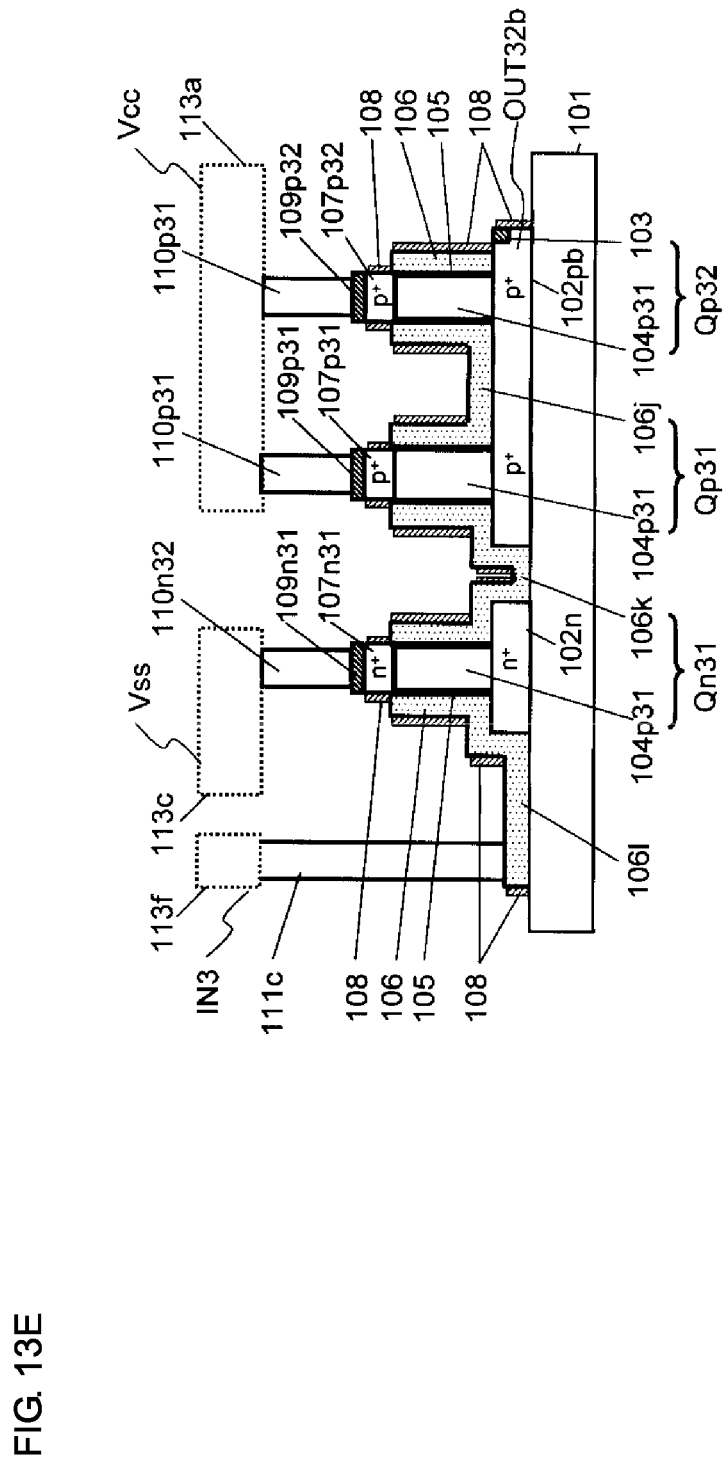
FIG. 13E is a cross-sectional view of the NOR circuit according to the seventh embodiment of the present invention.

FIG. 13A, FIG. 13B, FIG. 13C, FIG. 13D, and FIG. 13E illustrate a seventh embodiment. FIG. 13A is a plan view of a layout (arrangement) of a 3-input NOR circuit according to the seventh embodiment of the present invention, FIG. 13B is a cross-sectional view taken along a cut-line A-A', FIG. 13C is a cross-sectional view taken along a cut-line B-B', FIG. 13D is a cross-sectional view taken along a cut-line C-C', and FIG. 13E is a cross-sectional view taken along a cut-line D-D'.

The difference from FIG. 11A (the sixth embodiment) is that, whereas FIG. 11A illustrates an arrangement of four rows and three columns, this embodiment provides an arrangement of three rows and three columns.

In FIG. 13A, the NMOS transistors Qn11, Qn21, and Qn31 of the NOR circuit illustrated in FIG. 12 are arranged in the first row (the bottom row in FIG. 13A) in order from right to left in FIG. 13A, the PMOS transistors Qp11, Qp21, and Qp31 are arranged in the second row in order from right to left in FIG. 13A, and the PMOS transistors Qp12, Qp22, and Qp32 are arranged in the third row in order from right to left in FIG. 13A.

In FIG. 13A, FIG. 13B, FIG. 13C, FIG. 13D, and FIG. 13E, the same or substantially the same structures as those illustrated in FIG. 11A, FIG. 11B, FIG. 11C, FIG. 11D, and FIG. 11E are denoted by the same reference numerals in the 100s.

An insulating film such as a buried oxide (BOX) film layer 101 disposed on a substrate has formed thereon planar silicon layers 102n, 102pa, and 102pb. The planar silicon layers 102n, 102pa, and 102pb are formed as an n+ diffusion layer, a p+ diffusion layer, and a p+ diffusion layer, respectively, through impurity implantation or the like. A silicide layer 103 disposed on surfaces of the planar silicon layers (102n, 102pa, and 102pb) connects the planar silicon layers 102n and 102pa to one another. Reference numerals 104p11, 104p21, 104p31 denote p-type silicon pillars, and reference numerals 104n11, 104n12, 104n21, 104n22, 104n31, and 104n32 denote n-type silicon pillars. Reference numeral 105 denotes a gate insulating film that surrounds each of the silicon pillars 104p11, 104p21, 104p31, 104n11, 104n12, 104n21, 104n22, 104n31, and 104n32. Reference numeral 106 denotes a gate electrode, and reference numerals 106b, 106c, 106d, 106f, 106g, 106h, 106j, 106k, and 106l denote each a gate line. N+ diffusion layer 107n11, 107n21, and 107n31 are formed on top portions of the silicon pillars 104p11, 104p21, and 104p31, respectively, through impurity implantation or the like, and p+ diffusion layers 107p11, 107p12, 107p21, 107p22, 107p31, and 107p32 are formed on top portions of the silicon pillars 104n11, 104n12, 104n21, 104n22, 104n31, and 104n32, respectively, through impurity implantation or the like. Reference numeral 108 denotes a silicon nitride film for protection of the gate insulating film 105. Reference numerals 109n11, 109n21, 109n31, 109p11, 109p12, 109p21, 109p22, 109p31, and 109p32 denote silicide layers connected to the n+ diffusion layers 107n11, 107n21, and 107n31 and the p+ diffusion layers 107p11, 107p12, 107p21, 107p22, 107p31, and 107p32, respectively. Reference numerals 110n11, 110n21, and 110n31 denote contacts that connect the silicide layers 109n11, 109n21, and 109n31 to a first metal line 113c, reference numerals 110p11, 110p12, 110p21, and 110p22 denote contacts that connect the silicide layers 109p11, 109p12, 109p21, and 109p22 to a first metal line 113g, and reference numerals 110p31 and 110p32 denote contacts that connect the silicide layers 109p31 and 109p32 to a first metal line 113a. Reference numeral 111a denotes a contact that connects the gate line 106d to a first metal line 113d, reference numeral 111b denotes a contact that connects the gate line 106h to a first metal line 113e, and reference numeral 111c denotes a contact that connects the gate line 106l to a first metal line 113f. In the following, the planar silicon layers 102n, 102pa, and 102pb are also referred to as the lower diffusion layers 102n, 102pa, and 102pb, and the diffusion layers 107n11, 107n21, 107n31, 107p11, 107p12, 107p21, 107p22, 107p31, and 107p32 are also referred to as the upper diffusion layers 107n11, 107n21, 107n31, 107p11, 107p12, 107p21, 107p22, 107p31, and 107p32.

Reference numeral 112A denotes contacts (in FIG. 13A, five contacts) that connect the silicide layer 103 which connects the lower diffusion layer 102n and the lower diffusion layer 102pa to one another to a first metal line 113b.

The silicon pillar 104p11, the lower diffusion layer 102n, the upper diffusion layer 107n11, the gate insulating film 105, and the gate electrode 106 constitute the NMOS transistor Qn11. The silicon pillar 104p21, the lower diffusion layer 102n, the upper diffusion layer 107n21, the gate insulating film 105, and the gate electrode 106 constitute the NMOS transistor Qn21. The silicon pillar 104p31, the lower diffusion layer 102n, the upper diffusion layer 107n31, the gate insulating film 105, and the gate electrode 106 constitute the NMOS transistor Qn31. The silicon pillar 104n11, the lower diffusion layer 102pa, the upper diffusion layer 107p11, the gate insulating film 105, and the gate electrode 106 constitute the PMOS transistor Qp11. The silicon pillar 104n12, the lower diffusion layer 102pa, the upper diffusion layer 107p12, the gate insulating film 105, and the gate electrode 106 constitute the PMOS transistor Qp12. The silicon pillar 104n21, the lower diffusion layer 102pb, the upper diffusion layer 107p21, the gate insulating film 105, and the gate electrode 106 constitute the PMOS transistor Qp21. The silicon pillar 104n22, the lower diffusion layer 102pb, the upper diffusion layer 107p22, the gate insulating film 105, and the gate electrode 106 constitute the PMOS transistor Qp22. The silicon pillar 104n31, the lower diffusion layer 102pb, the upper diffusion layer 107p31, the gate insulating film 105, and the gate electrode 106 constitute the PMOS transistor Qp31. The silicon pillar 104n32, the lower diffusion layer 102pb, the upper diffusion layer 107p32, the gate insulating film 105, and the gate electrode 106 constitute the PMOS transistor Qp32.

In addition, the gate line 106b is connected to the gate electrode 106 of the PMOS transistor Qp12, the gate lines 106b and 106c are connected to the gate electrode 106 of the PMOS transistor Qp11, and the gate lines 106c and 106d are connected to the gate electrode 106 of the NMOS transistor Qn11. The gate line 106f is connected to the gate electrode 106 of the PMOS transistor Qp22, the gate lines 106f and 106g are connected to the gate electrode 106 of the PMOS transistor Qp21, and the gate lines 106g and 106h are connected to the gate electrode 106 of the NMOS transistor Qn21. The gate line 106j is connected to the gate electrode 106 of the PMOS transistor Qp32, the gate lines 106j and 106k are connected to the gate electrode 106 of the PMOS transistor Qp31, and the gate lines 106k and 106l are connected to the gate electrode 106 of the NMOS transistor Qn31.

The lower diffusion layers 102n and 102pa serve as a common drain of the NMOS transistors Qn11, Qn21, and Qn31 and the PMOS transistors Qp11 and Qp12, and are connected to the output OUT32b.

The upper diffusion layer 107n11, which is a source of the NMOS transistor Qn11, is connected to the first metal line 113c via the silicide layer 109n11 and the contact 110n11, and the first metal line 113c is supplied with the reference power supply Vss. The upper diffusion layer 107n21, which is a source of the NMOS transistor Qn21, is connected to the first metal line 113c via the silicide layer 109n21 and the contact 110n21. The upper diffusion layer 107n31, which is a source of the NMOS transistor Qn31, is connected to the first metal line 113c via the silicide layer 109n31 and the contact 110n31. The upper diffusion layer 107p11, which is a source of the PMOS transistor Qp11, is connected to the first metal line 113g via the silicide layer 109p11 and the contact 110p11. The upper diffusion layer 107p12, which is a source of the PMOS transistor Qp12, is connected to the first metal line 113g via the silicide layer 109p12 and the contact 110p12. The upper diffusion layer 107p21, which is a drain of the PMOS transistor Qp21, is connected to the first metal line 113g via the silicide layer 109p21 and the contact 110p21. The upper diffusion layer 107p22, which is a drain of the PMOS transistor Qp22, is connected to the first metal line 113g via the silicide layer 109p22 and the contact 110p22. Here, the sources of the PMOS transistors Qp11 and Qp12 and the drains of the PMOS transistors Qp21 and Qp22 are connected to one another via the first metal line 113g. Further, sources of the PMOS transistors Qp21 and Qp22 are connected to drains of the PMOS transistors Qp31 and Qp32 via the lower diffusion layer 102pb and the silicide layer 103, and sources of the PMOS transistors Qp31 and Qp32 are connected to the first metal line 113a via the contacts 110p31 and 110p32, respectively. The first metal line 113a is supplied with the power supply Vcc.

The first metal line 113d is supplied with the input signal IN1. The input signal IN1 is connected to the gate line 106d via the contact 111a, and supplied to the gate electrode 106 of the NMOS transistor Qn11. The input signal IN1 is further supplied to the gate electrode 106 of the PMOS transistor Qp11 and the gate electrode 106 of the PMOS transistor Qp12 via the gate lines 106c and 106b, respectively.

The first metal line 113e is supplied with the input signal IN2. The input signal IN2 is connected to the gate line 106h via the contact 111b, and supplied to the gate electrode 106 of the NMOS transistor Qn21. The input signal IN2 is further supplied to the gate electrode 106 of the PMOS transistor Qp21 and the gate electrode 106 of the PMOS transistor Qp22 via the gate lines 106g and 106f, respectively.

The first metal line 113f is supplied with the input signal IN3. The input signal IN3 is connected to the gate line 106l via the contact 111c, and supplied to the gate electrode 106 of the NMOS transistor Qn31. The input signal IN3 is further supplied to the gate electrode 106 of the PMOS transistor Qp31 and the gate electrode 106 of the PMOS transistor Qp32 via the gate lines 106k and 106j, respectively.

This embodiment is advantageous in that, as in the sixth embodiment (FIG. 11A), an arrangement of three rows and three columns can reduce the parasitic resistance in the silicide layer, which is a challenging issue discussed in FIG. 8A. In addition, a parallel connection of a plurality of (in this embodiment, two) PMOS transistors, which are connected in series in a NOR circuit configuration, provides a balance between the current flow on the PMOS circuit side and the current flow on the NMOS circuit side, achieving optimum characteristics. In addition, an increase in area can be minimized.

The 3-input NOR circuit having the configuration described above, which includes the power supply line Vcc (113a) and the reference power supply line Vss (113c), is defined as a block BL32b.

Further, the distance between the power supply line 113a and the reference power supply line 113c is represented by Ly3 (the distance between the power supply line and the reference power supply line (both inclusive)). Since implementations of an arrangement of three rows, as in this embodiment, are common, Ly3, which is different from Ly illustrated in FIG. 2A according to the first embodiment, may be used as a standard of an arrangement of three rows and n columns.

This embodiment enables nine SGTs in a 3-input NOR circuit having a configuration in which two PMOS transistors are connected in parallel at each input to be arranged in three rows and three columns, without using any unnecessary lines or contact regions, and can provide a semiconductor device with desired characteristics achieved and with a reduced area.

While two transistors connected in parallel are used in this embodiment, a plurality of transistors more than two transistors may be connected in parallel in order to obtain a larger current. For example, parallel connections of three PMOS transistors provide a configuration of four rows and three columns, and parallel connections of three PMOS transistors and parallel connections of two NMOS transistors provide a configuration of five rows and three columns.

Eighth Embodiment

Figure 14A:
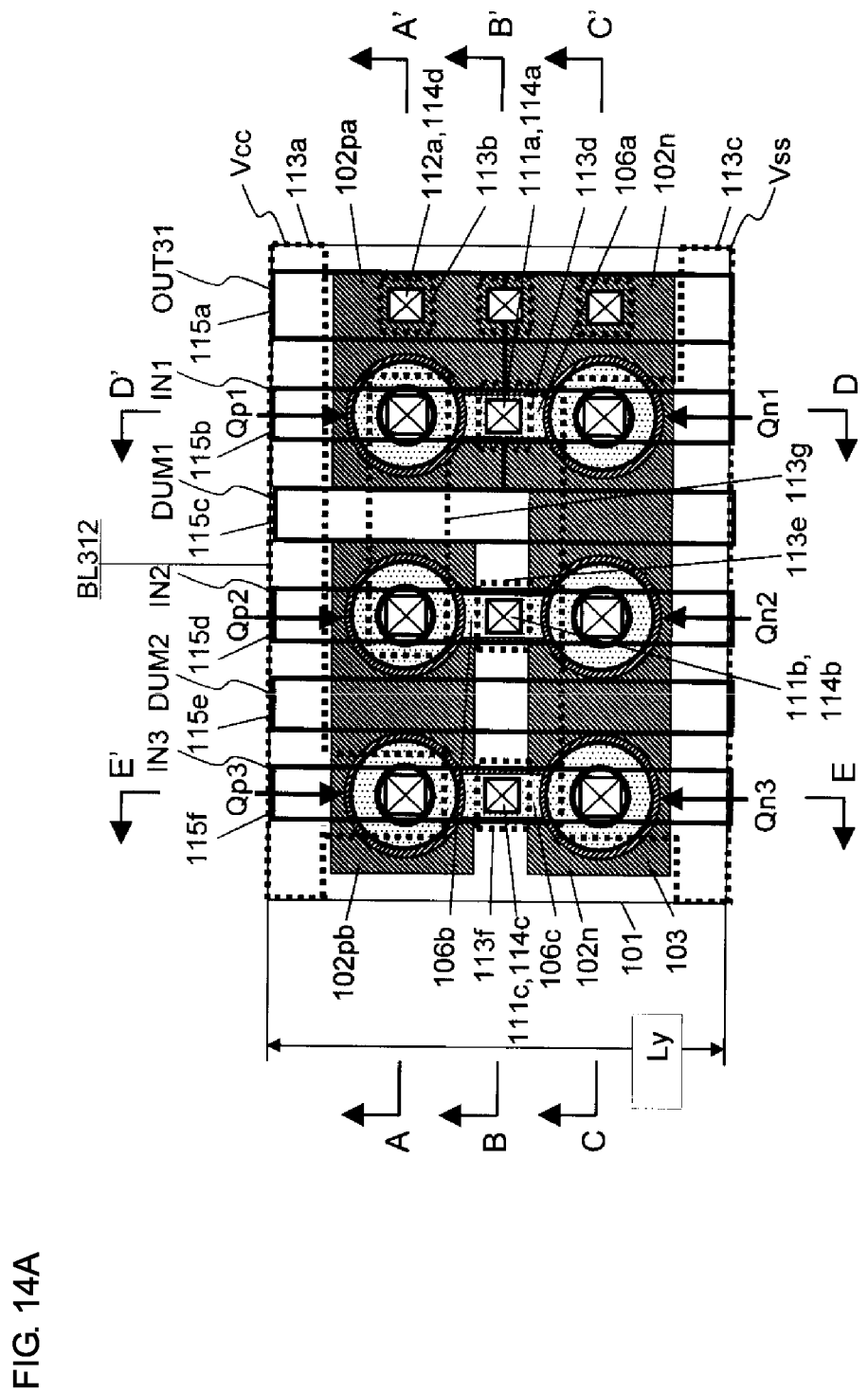
FIG. 14A is a plan view of a NOR circuit according to an eighth embodiment of the present invention.
Figure 14B:
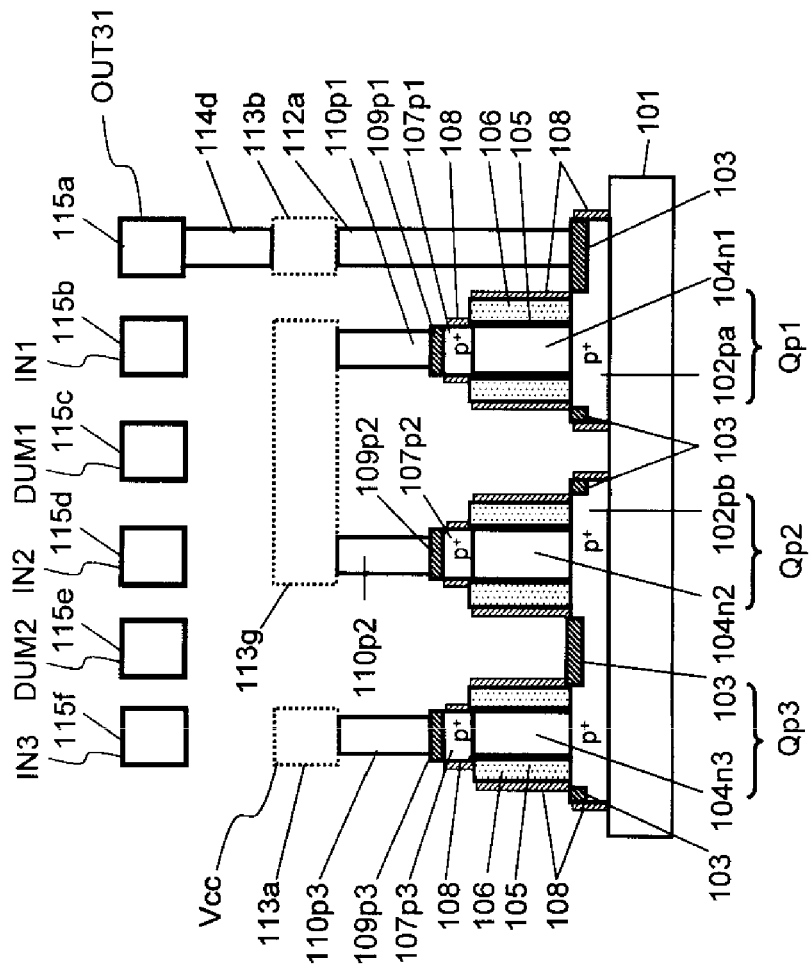
FIG. 14B is a cross-sectional view of the NOR circuit according to the eighth embodiment of the present invention.
Figure 14C:
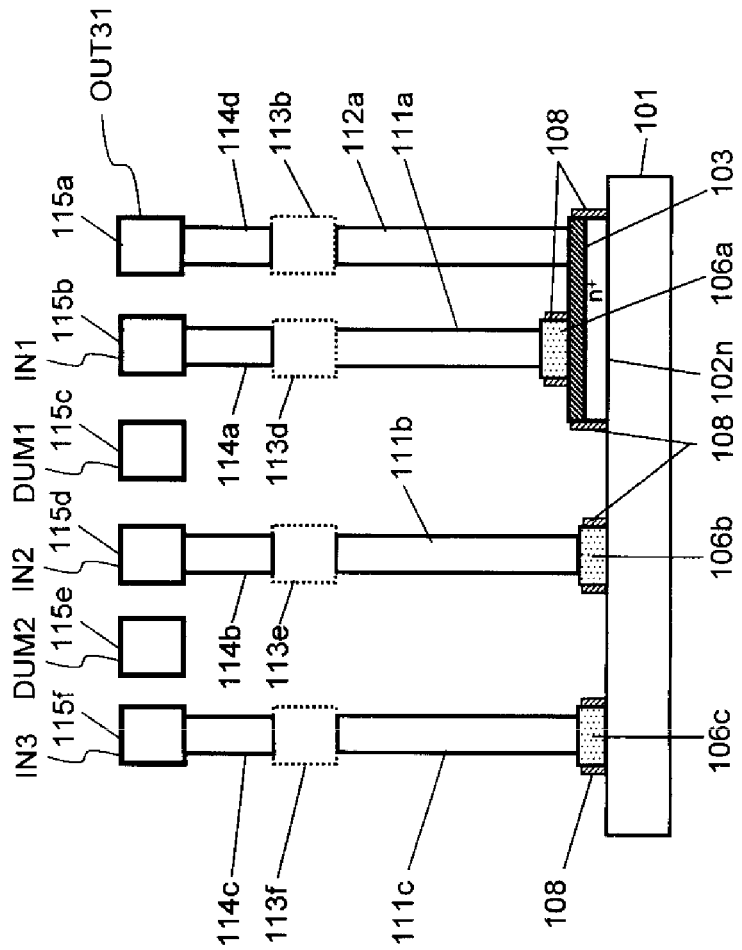
FIG. 14C is a cross-sectional view of the NOR circuit according to the eighth embodiment of the present invention.
Figure 14D:
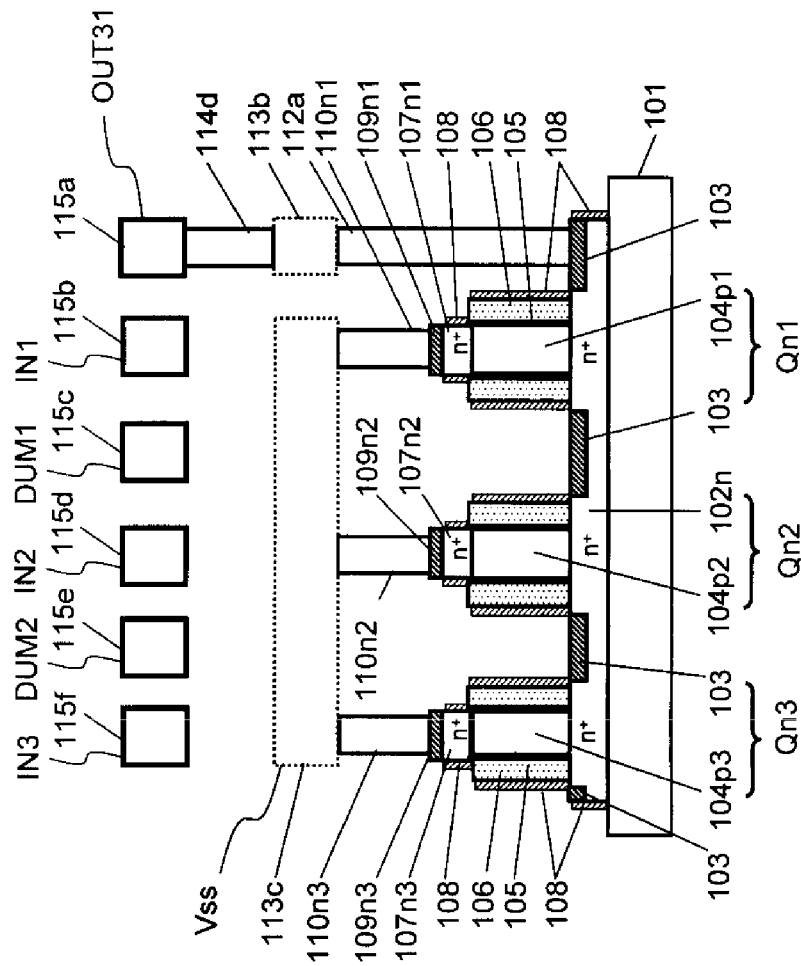
FIG. 14D is a cross-sectional view of the NOR circuit according to the eighth embodiment of the present invention.
Figure 14E:
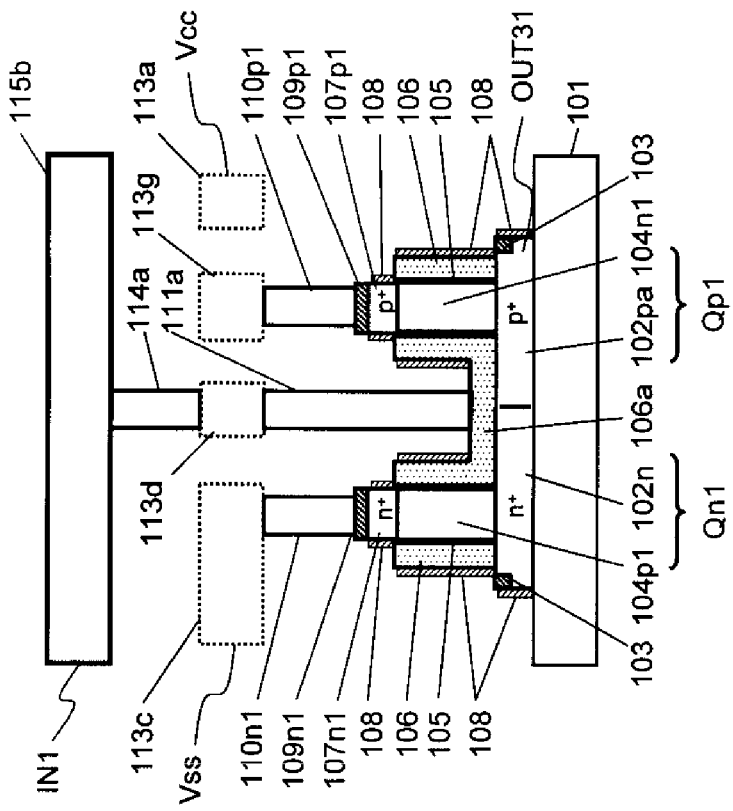
FIG. 14E is a cross-sectional view of the NOR circuit according to the eighth embodiment of the present invention.
Figure 14F:
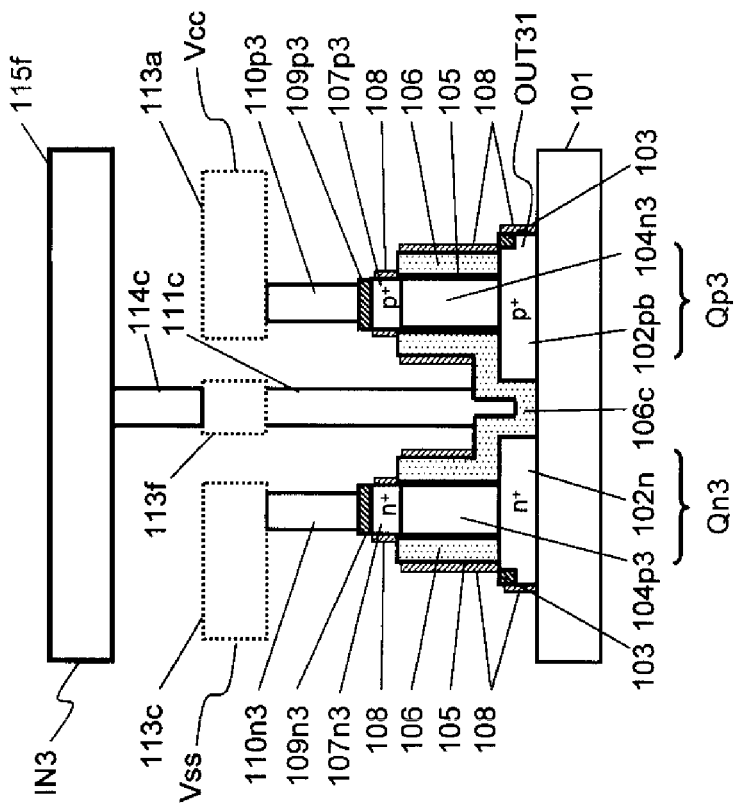
FIG. 14F is a cross-sectional view of the NOR circuit according to the eighth embodiment of the present invention.

FIG. 14A, FIG. 14B, FIG. 14C, FIG. 14D, FIG. 14E, and FIG. 14F illustrate an eighth embodiment. An equivalent circuit is as illustrated in FIG. 1. FIG. 14A is a plan view of a layout (arrangement) of a 3-input NOR circuit according to the eighth embodiment of the present invention, FIG. 14B is a cross-sectional view taken along a cut-line A-A', FIG. 14C is a cross-sectional view taken along a cut-line B-B', FIG. 14D is a cross-sectional view taken along a cut-line C-C', FIG. 14E is a cross-sectional view taken along a cut-line D-D', and FIG. 14F is a cross-sectional view taken along a cut-line E-E'.

The difference from FIG. 2A (the first embodiment) is that the eighth embodiment (FIG. 14A) of the present invention uses second metal lines as lines for input signals and output signals. In the eighth embodiment, the second metal lines extend in a direction perpendicular to the first metal lines, namely, the power supply line Vcc and the reference power supply line Vss.

In FIG. 14A, FIG. 14B, FIG. 14C, FIG. 14D, FIG. 14E, and FIG. 14F, the same or substantially the same structures as those illustrated in FIG. 2A, FIG. 2B, FIG. 2C, FIG. 2D, and FIG. 2E are denoted by equivalent reference numerals in the 100s.

An insulating film such as a buried oxide (BOX) film layer 101 disposed on a substrate has formed thereon planar silicon layers 102n, 102pa, and 102pb. The planar silicon layers 102n, 102pa, and 102pb are formed as an n+ diffusion layer, a p+ diffusion layer, and a p+ diffusion layer, respectively, through impurity implantation or the like. A silicide layer 103 disposed on surfaces of the planar silicon layers (102n, 102pa, and 102pb) connects the planar silicon layers 102n and 102pa to one another. Reference numerals 104n1, 104n2, and 104n3 denote n-type silicon pillars, and reference numerals 104p1, 104p2, and 104p3 denote p-type silicon pillars. Reference numeral 105 denotes a gate insulating film that surrounds each of the silicon pillars 104n1, 104n2, 104n3, 104p1, 104p2, and 104p3. Reference numeral 106 denotes a gate electrode, and reference numerals 106a, 106b, and 106c denote each a gate line. P+ diffusion layers 107p1, 107p2, and 107p3 are formed on top portions of the silicon pillars 104n1, 104n2, and 104n3, respectively, through impurity implantation or the like, and n+ diffusion layers 107n1, 107n2, and 107n3 are formed on top portions of the silicon pillars 104p1, 104p2, and 104p3, respectively, through impurity implantation or the like. Reference numeral 108 denotes a silicon nitride film for protection of the gate insulating film 105. Reference numerals 109p1, 109p2, 109p3, 109n1, 109n2, and 109n3 denote silicide layers connected to the p+ diffusion layers 107p1, 107p2, and 107p3 and the n+ diffusion layers 107n1, 107n2, and 107n3, respectively. Reference numerals 110p1 and 110p2 denote contacts that connect the silicide layers 109p1 and 109p2 to a first metal line 113g, reference numeral 110p3 denotes a contact that connects the silicide layer 109p3 to a first metal line 113a, and reference numerals 110n1, 110n2, and 110n3 denote contacts that connect the silicide layers 109n1, 109n2, and 109n3 to a first metal line 113c. Reference numeral 111a denotes a contact that connects the gate line 106a to a first metal line 113d, reference numeral 111b denotes a contact that connects the gate line 106b to a first metal line 113e, and reference numeral 111c denotes a contact that connects the gate line 106c to a first metal line 113f. In the following, the planar silicon layers 102n, 102pa, and 102pb are also referred to as the lower diffusion layers 102n, 102pa, and 102pb, and the diffusion layers 107p1, 107p2, 107p3, 107n1, 107n2, and 107n3 are also referred to as the upper diffusion layers 107p1, 107p2, 107p3, 107n1, 107n2, and 107n3.

Further, reference numeral 112A denotes contacts (three contacts) that connect the silicide layer 103 which connects the lower diffusion layer 102n and the lower diffusion layer 102pa to one another to a first metal line 113b.

Reference numeral 114a denotes a contact that connects the first metal line 113d to a second metal line 115b, reference numeral 114b denotes a contact that connects the first metal line 113e to a second metal line 115d, reference numeral 114c denotes a contact that connects the first metal line 113f to a second metal line 115f, and reference numeral 114d denotes a contact that connects the first metal line 113b to a second metal line 115a. Further, reference numerals 115*c* and 115*e* denote second metal lines that are not connected to any element in the drawings.

The silicon pillar 104*n*1, the lower diffusion layer 102*pa*, the upper diffusion layer 107*p*1, the gate insulating film 105, and the gate electrode 106 constitute the PMOS transistor Qp1. The silicon pillar 104*n*2, the lower diffusion layer 102*pb*, the upper diffusion layer 107*p*2, the gate insulating film 105, and the gate electrode 106 constitute the PMOS transistor Qp2. The silicon pillar 104*n*3, the lower diffusion layer 102*pb*, the upper diffusion layer 107*p*3, the gate insulating film 105, and the gate electrode 106 constitute the PMOS transistor Qp3. The silicon pillar 104*p*1, the lower diffusion layer 102*n*, the upper diffusion layer 107*n*1, the gate insulating film 105, and the gate electrode 106 constitute the NMOS transistor Qn1. The silicon pillar 104*p*2, the lower diffusion layer 102*n*, the upper diffusion layer 107*n*2, the gate insulating film 105, and the gate electrode 106 constitute the NMOS transistor Qn2. The silicon pillar 104*p*3, the lower diffusion layer 102*n*, the upper diffusion layer 107*n*3, the gate insulating film 105, and the gate electrode 106 constitute the NMOS transistor Qn3.

In addition, the gate line 106*a* is connected to the gate electrode 106 of the PMOS transistor Qp1 and the gate electrode 106 of the NMOS transistor Qn1, the gate line 106*b* is connected to the gate electrode 106 of the PMOS transistor Qp2 and the gate electrode 106 of the NMOS transistor Qn2, and the gate line 106*c* is connected to the gate electrode 106 of the PMOS transistor Qp3 and the gate electrode 106 of the NMOS transistor Qn3.

The lower diffusion layers 102*n* and 102*pa* serve as a common drain of the NMOS transistors Qn1, Qn2, and Qn3 and the PMOS transistor Qp1 via the silicide layer 103, and are connected to the first metal line 113*b* via the contact 112*a*. The first metal line 113*b* is connected to the second metal line 115*a* via the contact 114*d* to serve as the output OUT31. The upper diffusion layer 107*n*1, which is a source of the NMOS transistor Qn1, is connected to the first metal line 113*c* via the silicide layer 109*n*1 and the contact 110*n*1, and the first metal line 113*c* is supplied with the reference power supply Vss. The upper diffusion layer 107*n*2, which is a source of the NMOS transistor Qn2, is connected to the first metal line 113*c* via the silicide layer 109*n*2 and the contact 110*n*2. Further, the upper diffusion layer 107*n*3, which is a source of the NMOS transistor Qn3, is connected to the first metal line 113*c* via the silicide layer 109*n*3 and the contact 110*n*3. The upper diffusion layer 107*p*1, which is a source of the PMOS transistor Qp1, is connected to the first metal line 113*g* via the silicide layer 109*p*1 and the contact 110*p*1. The upper diffusion layer 107*p*2, which is a drain of the PMOS transistor Qp2, is connected to the first metal line 113*g* via the silicide layer 109*p*2 and the contact 110*p*2. Here, the source of the PMOS transistor Qp1 and the drain of the PMOS transistor Qp2 are connected to one another via the first metal line 113*g*. Further, a source of the PMOS transistor Qp2 is connected to a drain of the PMOS transistor Qp3 via the lower diffusion layer 102*pb* and the silicide layer 103, and a source of the PMOS transistor Qp3 is connected to the first metal line 113*a* via the contact 110*p*3, and the first metal line 113*a* is supplied with the power supply Vcc.

The input signal IN1 is supplied to the second metal line 115*b*, and is connected to the first metal line 113*d* via the contact 114*a*. The input signal IN1 is further connected to the gate line 106*a* via the contact 111*a*, and is supplied to the gate electrode 106 of the PMOS transistor Qp1 and the gate electrode 106 of the NMOS transistor Qn1.

The input signal IN2 is supplied to the second metal line 115*d*, and is connected to the first metal line 113*e* via the contact 114*b*. The input signal IN2 is further connected to the gate line 106*b* via the contact 111*b*, and is supplied to the gate electrode 106 of the PMOS transistor Qp2 and the gate electrode 106 of the NMOS transistor Qn2.

The input signal IN3 is supplied to the second metal line 115*f*, and is connected to the first metal line 113*f* via the contact 114*c*. The input signal IN3 is further connected to the gate line 106*c* via the contact 111*c*, and is supplied to the gate electrode 106 of the PMOS transistor Qp3 and the gate electrode 106 of the NMOS transistor Qn3.

In addition, the second metal lines 115*c* and 115*e* are supplied with signals DUM1 and DUM2, respectively, which are used for other blocks. Thus, the second metal lines 115*c* and 115*e* extend through this block as dummy lines not connected to any elements in this block.

In this embodiment, the output signal line 115*a* (OUT31) and the input signal lines 115*b* (IN1), 115*d* (IN2), and 115*f* (IN3) are arranged using second metal lines in a vertical direction so as to extend perpendicular to the power supply line 113*a* (Vcc) and the reference power supply line 113*c* (Vss) which are formed as first metal lines extending in the row direction, providing a layout which eliminates the use of unnecessary wiring regions and whose area is significantly reduced. In addition, signal lines used for other blocks are permitted to extend across a spare region, which enables efficient wiring of lines in the arrangement of a plurality of blocks.

The block according to this embodiment, which includes the power supply line Vcc (113*a*) and the reference power supply line Vss (113*c*), is defined as a block BL312.

Further, as in the first embodiment (FIG. 2A), the distance between the power supply line 113*a* and the reference power supply line 113*c* is represented by Ly (the distance between the power supply line and the reference power supply line (both inclusive)).

This embodiment enables six SGTs constituting a 3-input NOR circuit to be arranged in two rows and three columns, without using any unnecessary lines or contact regions, and can provide a semiconductor device with a reduced area.

Ninth Embodiment

Figure 15B:
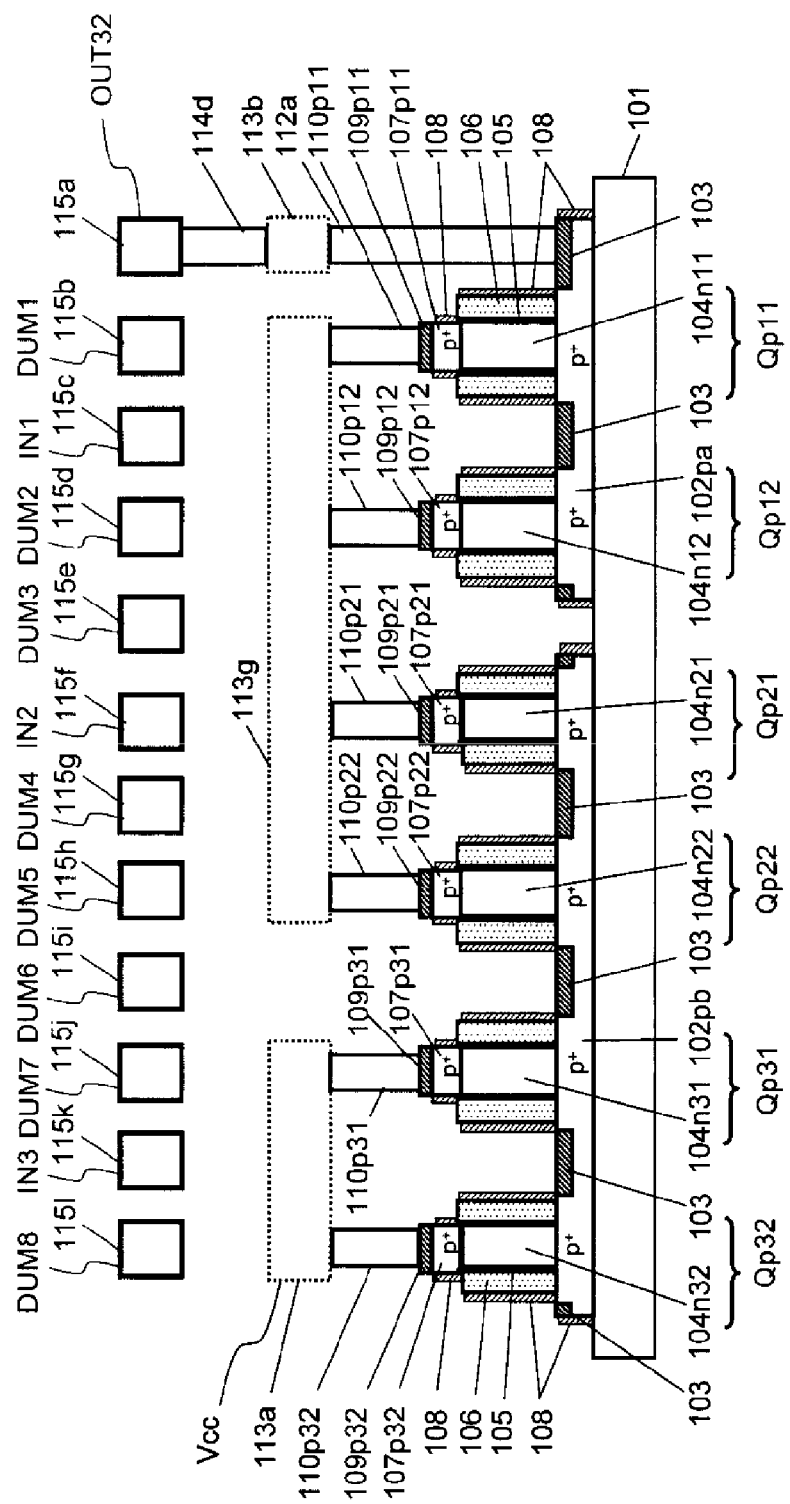
FIG. 15B is a cross-sectional view of the NOR circuit according to the ninth embodiment of the present invention.
Figure 15C:
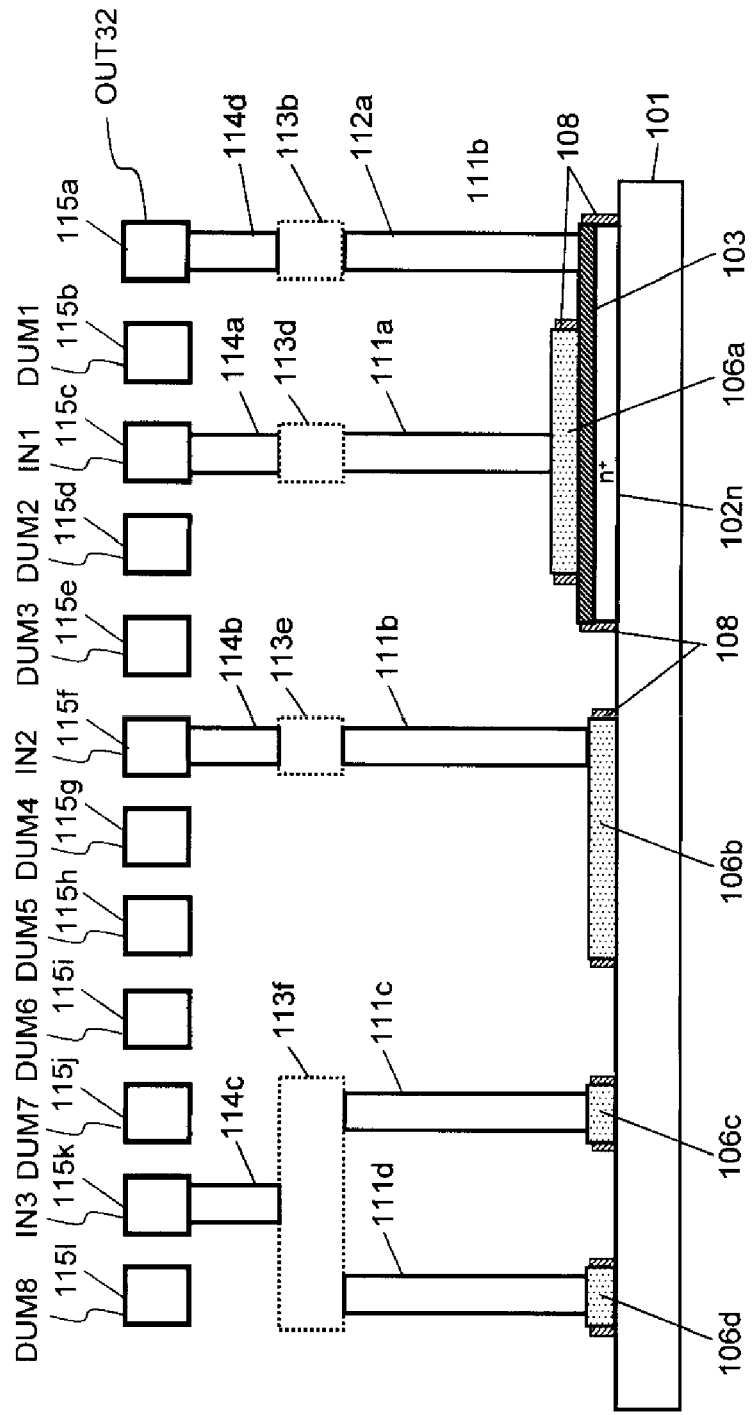
FIG. 15C is a cross-sectional view of the NOR circuit according to the ninth embodiment of the present invention.
Figure 15D:
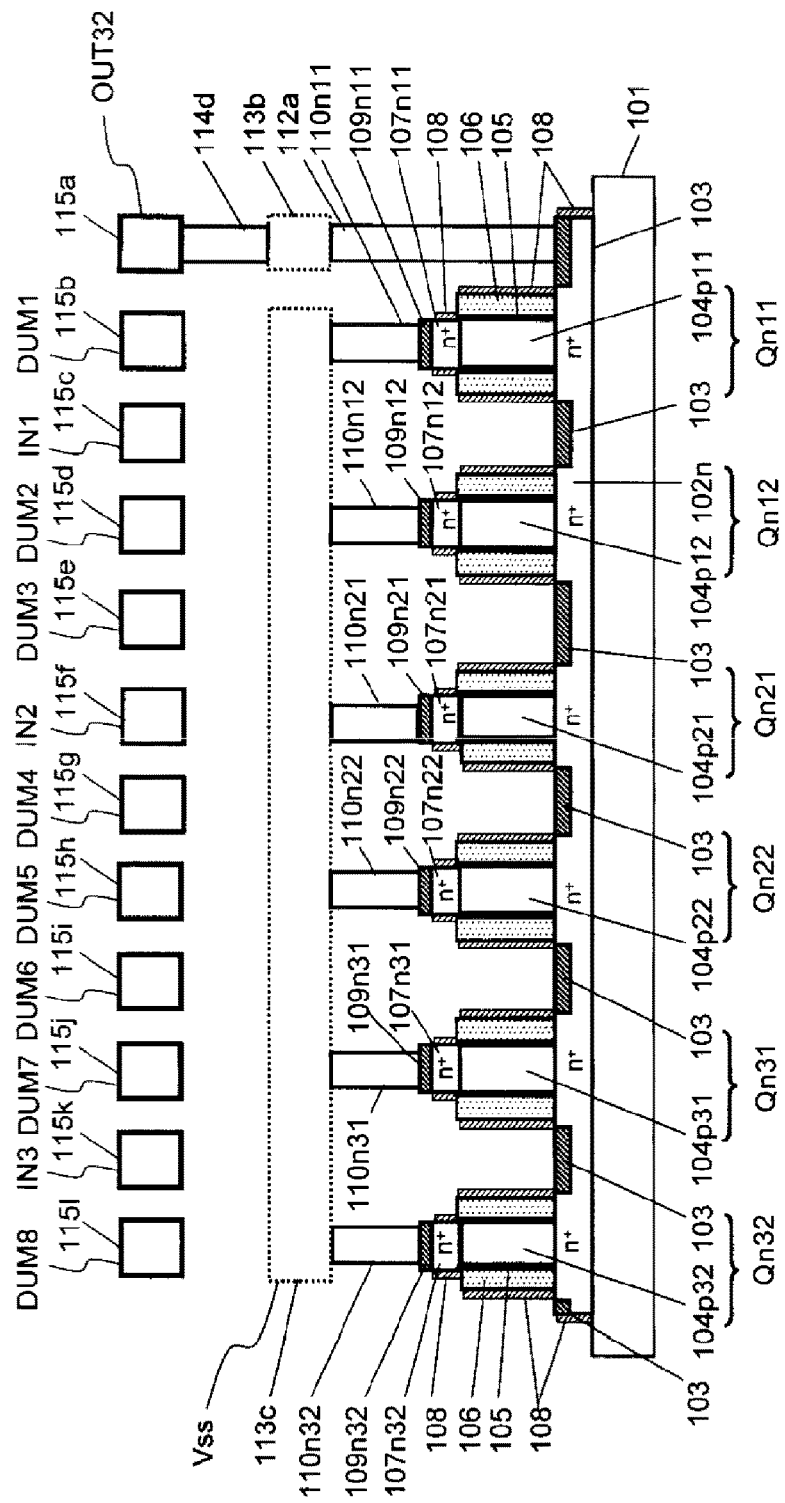
FIG. 15D is a cross-sectional view of the NOR circuit according to the ninth embodiment of the present invention.

FIG. 15A, FIG. 15B, FIG. 15C, and FIG. 15D illustrate a ninth embodiment. An equivalent circuit is as illustrated in FIG. 7. FIG. 15A is a plan view of a layout (arrangement) of a 3-input NOR circuit according to the ninth embodiment of the present invention, FIG. 15B is a cross-sectional view taken along a cut-line A-A', FIG. 15C is a cross-sectional view taken along a cut-line B-B', and FIG. 15D is a cross-sectional view taken along a cut-line C-C'.

The difference from the fourth embodiment (FIG. 8A) is that the ninth embodiment (FIG. 15A) of the present invention uses second metal lines as lines for input signals and output signals, as in the eighth embodiment (FIG. 14A). In this embodiment, the second metal lines extend in a direction perpendicular to the first metal lines, namely, the power supply line Vcc and the reference power supply line Vss.

Cross-sectional views taken along vertical lines (the cut-lines D-D' and E-E' in FIG. 14A) are equivalent to those illustrated in FIG. 14E and FIG. 14F, and are not illustrated. In FIG. 15A, FIG. 15B, FIG. 15C, and FIG. 15D, the same or substantially the same structural portions as those illustrated in FIG. 8A, FIG. 8B, and FIG. 8C or FIG. 14A, FIG. 14B, FIG. 14C, and FIG. 14D are denoted by equivalent reference numerals in the 100s.

An insulating film such as a buried oxide (BOX) film layer 101 disposed on a substrate has formed thereon planar silicon layers 102n, 102pa, and 102pb. The planar silicon layers 102n, 102pa, and 102pb are formed as an n+ diffusion layer, a p+ diffusion layer, and a p+ diffusion layer, respectively, through impurity implantation or the like. A silicide layer 103 disposed on surfaces of the planar silicon layers (102n, 102pa, and 102pb) connects the planar silicon layers 102n and 102pa to one another. Reference numerals 104n11, 104n12, 104n21, 104n22, 104n31, and 104n32 denote n-type silicon pillars, and reference numerals 104p11, 104p12, 104p21, 104p22, 104p31, and 104p32 denote p-type silicon pillars. Reference numeral 105 denotes a gate insulating film that surrounds each of the silicon pillars 104n11, 104n12, 104n21, 104n22, 104n31, 104n32, 104p11, 104p12, 104p21, 104p22, 104p31, and 104p32. Reference numeral 106 denotes a gate electrode, and reference numerals 106a, 106b, 106c, and 106d denote each a gate line. P+ diffusion layers 107p11, 107p12, 107p21, 107p22, 107p31, and 107p32 are formed on top portions of the silicon pillars 104n11, 104n12, 104n21, 104n22, 104n31, and 104n32, respectively, through impurity implantation or the like, and n+ diffusion layers 107n11, 107n12, 107n21, 107n22, 107n31, and 107n32 are formed on top portions of the silicon pillars 104p11, 104p12, 104p21, 104p22, 104p31, and 104p32, respectively, through impurity implantation or the like. Reference numeral 108 denotes a silicon nitride film for protection of the gate insulating film 105. Reference numerals 109p11, 109p12, 109p21, 109p22, 109p31, 109p32, 109n11, 109n12, 109n21, 109n22, 109n31, and 109n32 denote silicide layers connected to the p+ diffusion layers 107p11, 107p12, 107p21, 107p22, 107p31, and 107p32 and the n+ diffusion layers 107n11, 107n12, 107n21, 107n22, 107n31, and 107n32, respectively. Reference numerals 110p11, 110p12, 110p21, and 110p22 denote contacts that connect the silicide layers 109p11, 109p12, 109p21, and 109p22 to a first metal line 113g, reference numerals 110p31 and 110p32 denote contacts that connect the silicide layers 109p31 and 109p32 to a first metal line 113a, and reference numerals 110n11, 110n12, 110n21, 110n22, 110n31, and 110n32 denote contacts that connect the silicide layers 109n11, 109n12, 109n21, 109n22, 109n31, and 109n32 to a first metal line 113c. Reference numeral 111a denotes a contact that connects the gate line 106a to a first metal line 113d, reference numeral 111b denotes a contact that connects the gate line 106b to a first metal line 113e, reference numeral 111c denotes a contact that connects the gate line 106c to a first metal line 113f, and reference numeral 111d denotes a contact that connects the gate line 106d to the first metal line 113f. In the following, the planar silicon layers 102n, 102pa, and 102pb are also referred to as the lower diffusion layers 102n, 102pa, and 102pb, and the diffusion layers 107p11, 107p12, 107p21, 107p22, 107p31, 107p32, 107n11, 107n12, 107n21, 107n22, 107n31, and 107n32 are also referred to as the upper diffusion layers 107p11, 107p12, 107p21, 107p22, 107p31, 107p32, 107n11, 107n12, 107n21, 107n22, 107n31, and 107n32.

Reference numeral 112A denotes contacts (three contacts) that connect the silicide layer 103 which connects the lower diffusion layer 102n and the lower diffusion layer 102pa to one another to a first metal line 113b.

Reference numeral 114a denotes a contact that connects the first metal line 113d to a second metal line 115c, reference numeral 114b denotes a contact that connects the first metal line 113e to a second metal line 115f, reference numeral 114c denotes a contact that connects the first metal line 113f to a second metal line 115k, and reference numeral 114d denotes a contact that connects the first metal line 113b to a second metal line 115a. Further, reference numerals 115b, 115d, 115e, 115g, 115h, 115i, 115j, and 115l denote second metal lines that are not connected to any element in the drawings.

The silicon pillar 104n11, the lower diffusion layer 102pa, the upper diffusion layer 107p11, the gate insulating film 105, and the gate electrode 106 constitute the PMOS transistor Qp11. The silicon pillar 104n12, the lower diffusion layer 102pa, the upper diffusion layer 107p12, the gate insulating film 105, and the gate electrode 106 constitute the PMOS transistor Qp12. The silicon pillar 104n21, the lower diffusion layer 102pb, the upper diffusion layer 107p21, the gate insulating film 105, and the gate electrode 106 constitute the PMOS transistor Qp21. The silicon pillar 104n22, the lower diffusion layer 102pb, the upper diffusion layer 107p22, the gate insulating film 105, and the gate electrode 106 constitute the PMOS transistor Qp22. The silicon pillar 104n31, the lower diffusion layer 102pb, the upper diffusion layer 107p31, the gate insulating film 105, and the gate electrode 106 constitute the PMOS transistor Qp31. The silicon pillar 104n32, the lower diffusion layer 102pb, the upper diffusion layer 107p32, the gate insulating film 105, and the gate electrode 106 constitute the PMOS transistor Qp32. The silicon pillar 104p11, the lower diffusion layer 102n, the upper diffusion layer 107n11, the gate insulating film 105, and the gate electrode 106 constitute the NMOS transistor Qn11. The silicon pillar 104p12, the lower diffusion layer 102n, the upper diffusion layer 107n12, the gate insulating film 105, and the gate electrode 106 constitute the NMOS transistor Qn12. The silicon pillar 104p21, the lower diffusion layer 102n, the upper diffusion layer 107n21, the gate insulating film 105, and the gate electrode 106 constitute the NMOS transistor Qn21. The silicon pillar 104p22, the lower diffusion layer 102n, the upper diffusion layer 107n22, the gate insulating film 105, and the gate electrode 106 constitute the NMOS transistor Qn22. The silicon pillar 104p31, the lower diffusion layer 102n, the upper diffusion layer 107n31, the gate insulating film 105, and the gate electrode 106 constitute the NMOS transistor Qn31. The silicon pillar 104p32, the lower diffusion layer 102n, the upper diffusion layer 107n32, the gate insulating film 105, and the gate electrode 106 constitute the NMOS transistor Qn32.

In addition, the gate line 106a is connected to the gate electrodes 106 of the PMOS transistors Qp11 and Qp12 and the gate electrodes 106 of the NMOS transistors Qn11 and Qn12. The gate line 106b is connected to the gate electrodes 106 of the PMOS transistors Qp21 and Qp22 and the gate electrodes 106 of the NMOS transistors Qn21 and Qn22. The gate line 106c is connected to the gate electrode 106 of the PMOS transistor Qp31 and the gate electrode 106 of the NMOS transistor Qn31. The gate line 106d is connected to the gate electrode 106 of the PMOS transistor Qp32 and the gate electrode 106 of the NMOS transistor Qn32.

The lower diffusion layers 102n and 102pa serve as a common drain of the NMOS transistors Qn11, Qn12, Qn21, Qn22, Qn31, and Qn32 and the PMOS transistors Qp11 and Qp12 via the silicide layer 103, and are connected to the first metal line 113b via the contact 112a. The first metal line 113b is connected to the second metal line 115a via the contact 114d to serve as the output OUT32.

The upper diffusion layer 107n11, which is a source of the NMOS transistor Qn11, is connected to the first metal line 113c via the silicide layer 109n11 and the contact 110n11, and the first metal line 113c is supplied with the reference power supply Vss. The upper diffusion layer 107n12, which is a source of the NMOS transistor Qn12, is connected to the first metal line 113c via the silicide layer 109n12 and the contact 110n12. The upper diffusion layer 107n21, which is a source of the NMOS transistor Qn21, is connected to the first metal line 113c via the silicide layer 109n21 and the contact 110n21. The upper diffusion layer 107n22, which is a source of the NMOS transistor Qn22, is connected to the first metal line 113c via the silicide layer 109n22 and the contact 110n22. The upper diffusion layer 107n31, which is a source of the NMOS transistor Qn31, is connected to the first metal line 113c via the silicide layer 109n31 and the contact 110n31. The upper diffusion layer 107n32, which is a source of the NMOS transistor Qn32, is connected to the first metal line 113c via the silicide layer 109n32 and the contact 110n32. The upper diffusion layer 107p11, which is a source of the PMOS transistor Qp11, is connected to the first metal line 113g via the silicide layer 109p11 and the contact 110p11. The upper diffusion layer 107p12, which is a source of the PMOS transistor Qp12, is connected to the first metal line 113g via the silicide layer 109p12 and the contact 110p12. The upper diffusion layer 107p21, which is a drain of the PMOS transistor Qp21, is connected to the first metal line 113g via the silicide layer 109p21 and the contact 110p21. The upper diffusion layer 107p22, which is a drain of the PMOS transistor Qp22, is connected to the first metal line 113g via the silicide layer 109p22 and the contact 110p22. Here, the sources of the PMOS transistors Qp11 and Qp12 and the drains of the PMOS transistors Qp21 and Qp22 are connected to one another via the first metal line 113g. Further, sources of the PMOS transistors Qp21 and Qp22 are connected to drains of the PMOS transistors Qp31 and Qp32 via the lower diffusion layer 102pb and the silicide layer 103, and sources of the PMOS transistors Qp31 and Qp32 are connected to the first metal line 113a via the contacts 110p31 and 110p32, respectively. The first metal line 113a is supplied with the power supply Vcc.

The input signal IN1 is supplied to the second metal line 115c, and is connected to the first metal line 113d via the contact 114a. The input signal IN1 is further connected to the gate line 106a via the contact 111a, and is supplied to the gate electrodes 106 of the PMOS transistors Qp11 and Qp12 and the gate electrodes 106 of the NMOS transistors Qn11 and Qn12.

The input signal IN2 is supplied to the second metal line 115f, and is connected to the first metal line 113e via the contact 114b. The input signal IN2 is further connected to the gate line 106b via the contact 111b, and is supplied to the gate electrodes 106 of the PMOS transistors Qp21 and Qp22 and the gate electrodes 106 of the NMOS transistors Qn21 and Qn22.

The input signal IN3 is supplied to the second metal line 115k, and is connected to the first metal line 113f via the contact 114c. The input signal IN3 is further connected to the gate line 106c via the contact 111c, and is supplied to the gate electrode 106 of the PMOS transistor Qp31 and the gate electrode 106 of the NMOS transistor Qn31. Further, the first metal line 113f is connected to the gate line 106d via the contact 111d, and the input signal IN3 is supplied to the gate electrode 106 of the PMOS transistor Qp32 and the gate electrode 106 of the NMOS transistor Qn32.

In addition, the second metal lines 115b, 115d, 105e, 105g, 105h, 105i, 105j, and 105l are supplied with signals DUM1, DUM2, DUM3, DUM4, DUM5, DUM6, DUM7, and DUM8, respectively, which are used for other blocks. Thus, the second metal lines 115b, 115d, 105e, 105g, 105h, 105i, 105j, and 105l extend through this block as dummy lines not connected to any elements in this block.

In this embodiment, the output signal line 115a (OUT32) and the input signal lines 115c (IN1), 115f (1N2), and 115k (1N3) are arranged using second metal lines in a vertical direction so as to extend perpendicular to the power supply line 113a (Vcc) and the reference power supply line 113c (Vss) which are formed as first metal lines extending in the row direction, providing a layout which eliminates the use of unnecessary wiring regions and whose area is significantly reduced. In addition, signal lines used for other blocks are permitted to extend across a spare region, which enables efficient wiring of lines in the arrangement of a plurality of blocks.

The block according to this embodiment, which includes the power supply line Vcc (113a) and the reference power supply line Vss (113c), is defined as a block BL322.

Further, as in the first embodiment (FIG. 2A), the distance between the power supply line 113a and the reference power supply line 113c is represented by Ly (the distance between the power supply line and the reference power supply line (both inclusive)).

This embodiment enables twelve SGTs constituting a 3-input NOR circuit in which two NMOS transistors are connected in parallel and two PMOS transistors are connected in parallel at each input to be arranged in two rows and six columns, without using any unnecessary lines or contact regions, and, in addition, with the use of second metal lines, can provide a semiconductor device with a reduced area.

In this embodiment, the numbers of transistors connected in parallel are each two. Alternatively, more than two transistors may be connected in parallel. In a case where, for example, three transistors are connected in parallel, the additional transistor may further be arranged laterally to achieve an arrangement of two rows and nine columns. Although not illustrated, the method using second metal lines described in this embodiment is also applicable to the sixth embodiment (FIG. 11A) or the seventh embodiment (FIG. 13A).

Tenth Embodiment

Figure 16A:
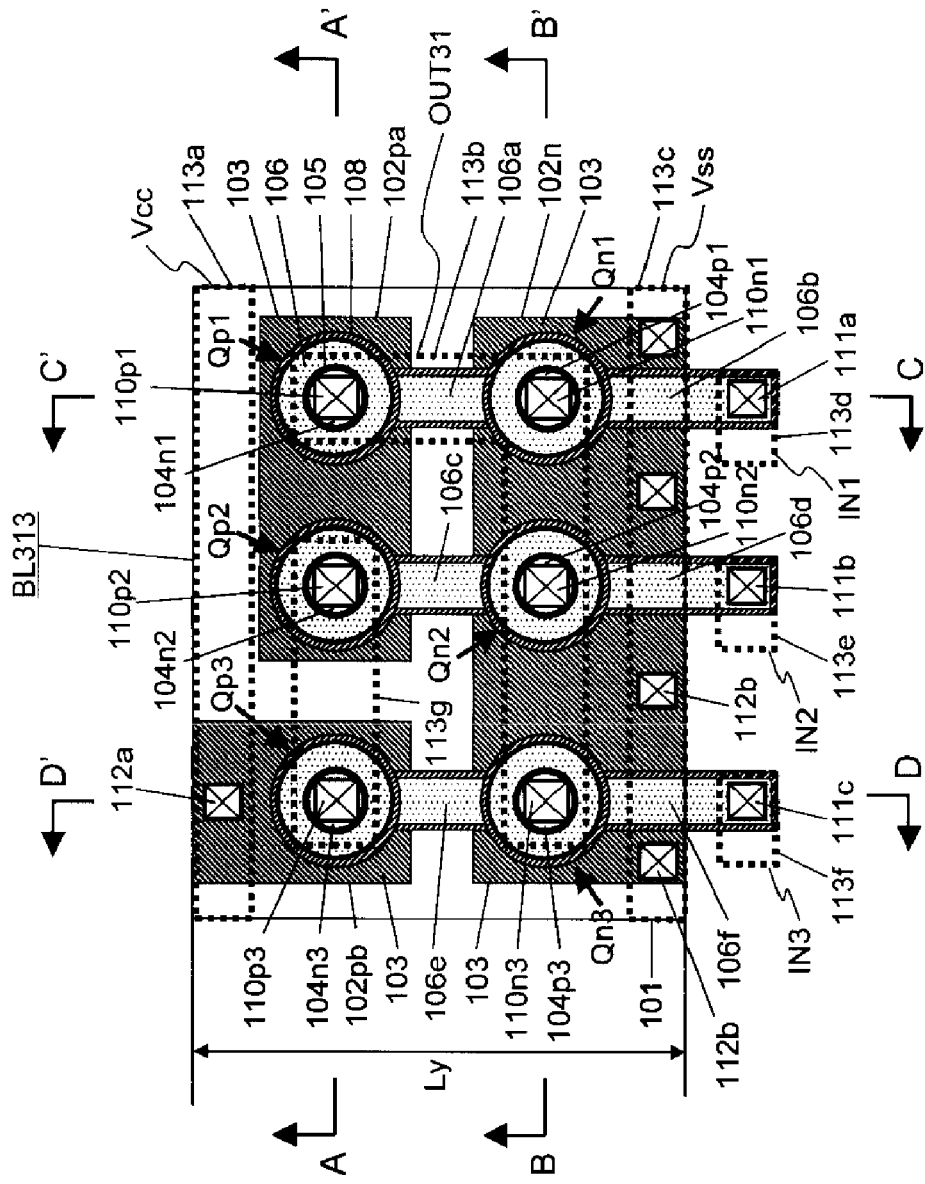
FIG. 16A is a plan view of a NOR circuit according to a tenth embodiment of the present invention.
Figure 16B:
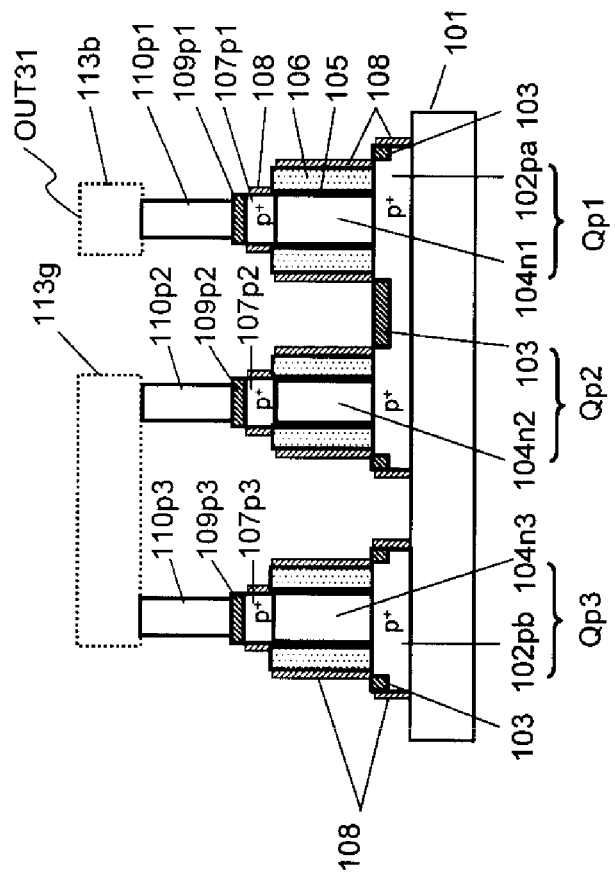
FIG. 16B is a cross-sectional view of the NOR circuit according to the tenth embodiment of the present invention.
Figure 16C:
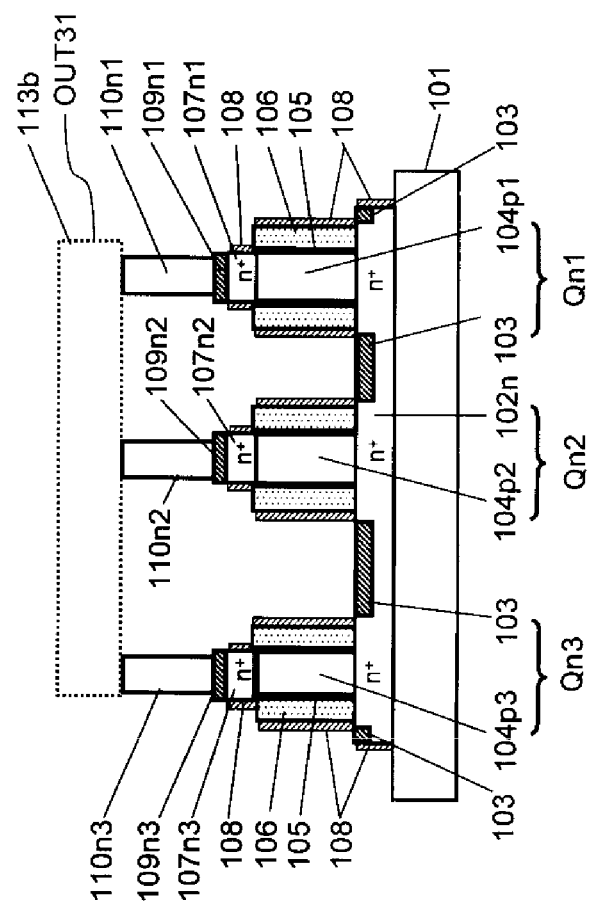
FIG. 16C is a cross-sectional view of the NOR circuit according to the tenth embodiment of the present invention.
Figure 16D:
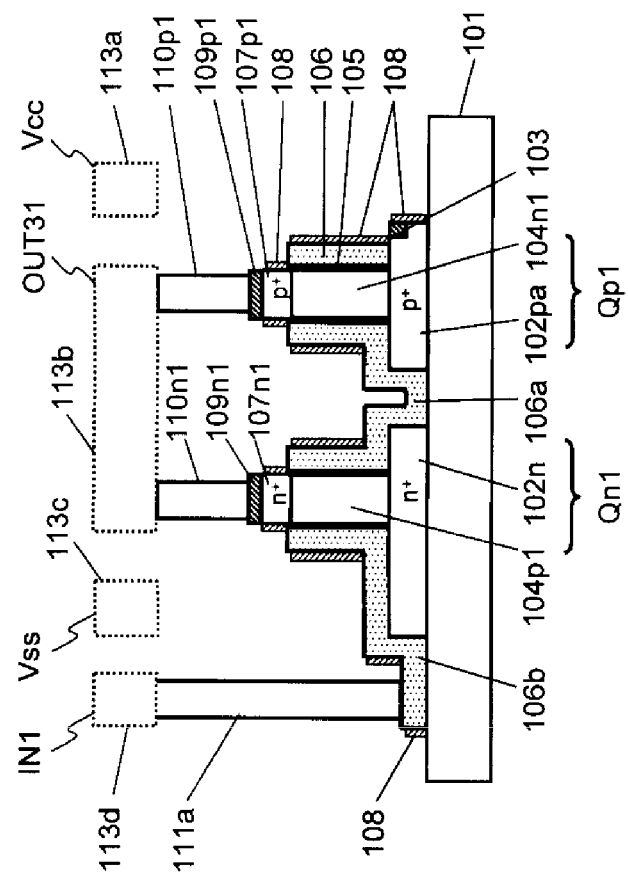
FIG. 16D is a cross-sectional view of the NOR circuit according to the tenth embodiment of the present invention.
Figure 16E:
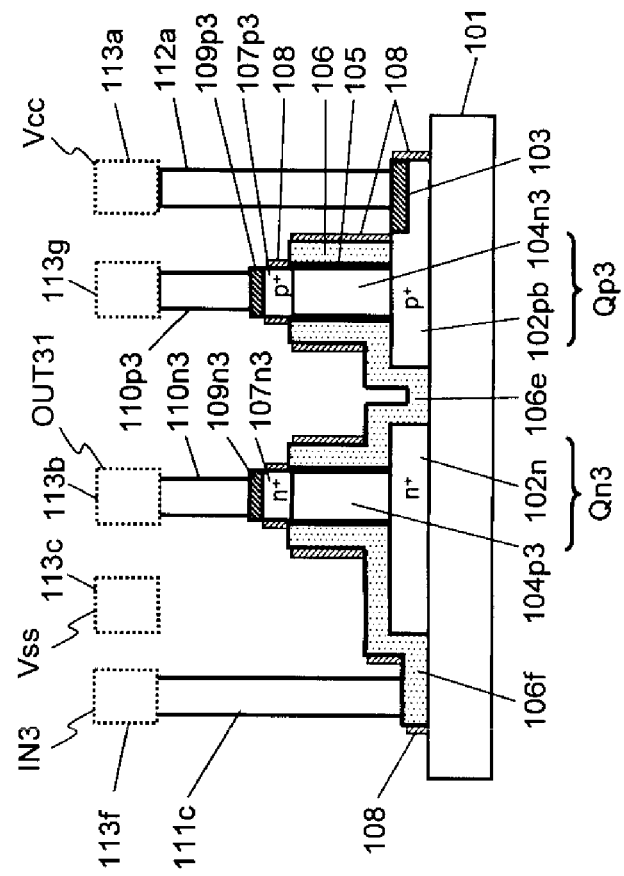
FIG. 16E is a cross-sectional view of the NOR circuit according to the tenth embodiment of the present invention.

FIG. 16A, FIG. 16B, FIG. 16C, FIG. 16D, and FIG. 16E illustrate a tenth embodiment. An equivalent circuit is as illustrated in FIG. 1. FIG. 16A is a plan view of a layout (arrangement) of a 3-input NOR circuit according to the tenth embodiment of the present invention, FIG. 16B is a cross-sectional view taken along a cut-line A-A', FIG. 16C is a cross-sectional view taken along a cut-line B-B', FIG. 16D is a cross-sectional view taken along a cut-line C-C', and FIG. 16E is a cross-sectional view taken along a cut-line D-D'.

The difference between this embodiment and FIG. 2A (the first embodiment) is that, in this embodiment, the NMOS transistors Qn1, Qn2, and Qn3 and the PMOS transistors Qp1, Qp2, and Qp3 are arranged so that the sources and drains are turned upside down and the respective drains of the NMOS transistors Qn1, Qn2, and Qn3 and the drain of the PMOS transistor Qp1 are commonly connected via contacts.

In FIG. 16A, FIG. 16B, FIG. 16C, FIG. 16D, and FIG. 16E, the same or substantially the same structures as those illustrated in FIG. 2A, FIG. 2B, FIG. 2C, FIG. 2D, and FIG. 2E are denoted by equivalent reference numerals in the 100s.

An insulating film such as a buried oxide (BOX) film layer 101 disposed on a substrate has formed thereon planar silicon layers 102*n*, 102*pa*, and 102*pb*. The planar silicon layers 102*n*, 102*pa*, and 102*pb* are formed as an n+ diffusion layer, a p+ diffusion layer, and a p+ diffusion layer, respectively, through impurity implantation or the like. A silicide layer 103 is disposed on surfaces of the planar silicon layers (102*n*, 102*pa*, and 102*pb*). Reference numerals 104*n*1, 104*n*2, and 104*n*3 denote n-type silicon pillars, and reference numerals 104*p*1, 104*p*2, and 104*p*3 denote p-type silicon pillars. Reference numeral 105 denotes a gate insulating film that surrounds each of the silicon pillars 104*n*1, 104*n*2, 104*n*3, 104*p*1, 104*p*2, and 104*p*3. Reference numeral 106 denotes a gate electrode, and reference numerals 106*a*, 106*b*, 106*c*, 106*d*, 106*e*, and 106*f* denote each a gate line. P+ diffusion layers 107*p*1, 107*p*2, and 107*p*3 are formed on top portions of the silicon pillars 104*n*1, 104*n*2, and 104*n*3, respectively, through impurity implantation or the like, and n+ diffusion layers 107*n*1, 107*n*2, and 107*n*3 are formed on top portions of the silicon pillars 104*p*1, 104*p*2, and 104*p*3, respectively, through impurity implantation or the like. Reference numeral 108 denotes a silicon nitride film for protection of the gate insulating film 105. Reference numerals 109*p*1, 109*p*2, 109*p*3, 109*n*1, 109*n*2, and 109*n*3 denote silicide layers connected to the p+ diffusion layers 107*p*1, 107*p*2, and 107*p*3 and the n+ diffusion layers 107*n*1, 107*n*2, and 107*n*3, respectively. Reference numerals 110*p*1, 110*n*1, 110*n*2, and 110*n*3 denote contacts that connect the silicide layers 109*p*1, 109*n*1, 109*n*2, and 109*n*3 to a first metal line 113*b*, and reference numerals 110*p*2 and 110*p*3 denote contacts that connect the silicide layers 109*p*2 and 109*p*3 to a first metal line 113*g*. Reference numeral 111*a* denotes a contact that connects the gate line 106*b* to a first metal line 113*d*, reference numeral 111*b* denotes a contact that connects the gate line 106*d* to a first metal line 113*e*, and reference numeral 111*c* denotes a contact that connects the gate line 106*f* to a first metal line 113*f*. In the following, the planar silicon layers 102*n*, 102*pa*, and 102*pb* are also referred to as the lower diffusion layers 102*n*, 102*pa*, and 102*pb*, and the diffusion layers 107*p*1, 107*p*2, 107*p*3, 107*n*1, 107*n*2, and 107*n*3 are also referred to as the upper diffusion layers 107*p*1, 107*p*2, 107*p*3, 107*n*1, 107*n*2, and 107*n*3.

Further, reference numeral 112*a* denotes a contact that connects the silicide layer 103 which covers the lower diffusion layer 102*pb* to a first metal line 113*a*, and reference numeral 112*b* denotes contacts (in FIG. 16A, four contacts) that connect the silicide layer 103 which covers the lower diffusion layer 102*n* to a first metal line 113*c*.

The silicon pillar 104*n*1, the lower diffusion layer 102*pa*, the upper diffusion layer 107*p*1, the gate insulating film 105, and the gate electrode 106 constitute the PMOS transistor Qp1. The silicon pillar 104*n*2, the lower diffusion layer 102*pa*, the upper diffusion layer 107*p*2, the gate insulating film 105, and the gate electrode 106 constitute the PMOS transistor Qp2. The silicon pillar 104*n*3, the lower diffusion layer 102*pb*, the upper diffusion layer 107*p*3, the gate insulating film 105, and the gate electrode 106 constitute the PMOS transistor Qp3. The silicon pillar 104*p*1, the lower diffusion layer 102*n*, the upper diffusion layer 107*n*1, the gate insulating film 105, and the gate electrode 106 constitute the NMOS transistor Qn1. The silicon pillar 104*p*2, the lower diffusion layer 102*n*, the upper diffusion layer 107*n*2, the gate insulating film 105, and the gate electrode 106 constitute the NMOS transistor Qn2. The silicon pillar 104*p*3, the lower diffusion layer 102*n*, the upper diffusion layer 107*n*3, the gate insulating film 105, and the gate electrode 106 constitute the NMOS transistor Qn3.

In addition, the gate line 106*a* is connected to the gate electrode 106 of the PMOS transistor Qp1, the gate line 106*c* is connected to the gate electrode 106 of the PMOS transistor Qp2, and the gate line 106*e* is connected to the gate electrode 106 of the PMOS transistor Qp3. The gate lines 106*a* and 106*b* are connected to the gate electrode 106 of the NMOS transistor Qn1, the gate lines 106*c* and 106*d* are connected to the gate electrode 106 of the NMOS transistor Qn2, and the gate lines 106*e* and 106*f* are connected to the gate electrode 106 of the NMOS transistor Qn3.

Sources of the NMOS transistors Qn1, Qn2, and Qn3 serve as the lower diffusion layer 102*n*, and are connected to the silicide layer 103 and the first metal line 113*c* via the contacts 112*b*, and the first metal line 113*c* is supplied with the reference power supply Vss. The upper diffusion layer 107*n*1, which is a drain of the NMOS transistor Qn1, is connected to the first metal line 113*b* via the silicide layer 109*n*1 and the contact 110*n*1, and the first metal line 113*b* serves as the output OUT31. The upper diffusion layer 107*n*2, which is a drain of the NMOS transistor Qn2, is connected to the first metal line 113*b* via the silicide layer 109*n*2 and the contact 110*n*2. Further, the upper diffusion layer 107*n*3, which is a drain of the NMOS transistor Qn3, is connected to the first metal line 113*b* via the silicide layer 109*n*3 and the contact 110*n*3. The upper diffusion layer 107*p*1, which is a drain of the PMOS transistor Qp1, is connected to the first metal line 113*b* via the silicide layer 109*p*1 and the contact 110*p*1. As described above, the drains of the NMOS transistors Qn1, Qn2, and Qn3 and the drain of the PMOS transistor Qp1 are connected commonly to the first metal line 113*b* via the contacts 110*n*1, 110*n*2, 110*n*3, and 110*p*1, respectively. The lower diffusion layer 102*pa* serving as the source of the PMOS transistor Qp1 is connected to a drain of the PMOS transistor Qp2 via the silicide layer 103. The upper diffusion layer 107*p*2, which is a source of the PMOS transistor Qp2, is connected to the first metal line 113*g* via the silicide layer 109*p*2 and the contact 110*p*2. Further, the upper diffusion layer 107*p*3, which is a drain of the PMOS transistor Qp3, is connected to the first metal line 113*g* via the silicide layer 109*p*3 and the contact 110*p*3. Here, the source of the PMOS transistor Qp2 and the drain of the PMOS transistor Qp3 are connected to one another via the first metal line 113*g*. Further, a source of the PMOS transistor Qp3 is connected to the first metal line 113*a* via the lower diffusion layer 102*pb*, the silicide layer 103, and the contact 112*a*, and the first metal line 113*a* is supplied with the power supply Vcc.

The input signal IN1 is supplied to the first metal line 113*d*, connected to the gate line 106*b* via the contact 111*a*, and supplied to the gate electrode 106 of the NMOS transistor Qn1. The input signal IN1 is further supplied to the gate electrode 106 of the PMOS transistor Qp1 via the gate line 106*a*.

The input signal IN2 is supplied to the first metal line 113*e*, connected to the gate line 106*d* via the contact 111*b*, and supplied to the gate electrode 106 of the NMOS transistor Qn2. The input signal IN2 is further supplied to the gate electrode 106 of the PMOS transistor Qp2 via the gate line 106*c*.

The input signal IN3 is supplied to the first metal line 113*f*, connected to the gate line 106*f* via the contact 111*c*, and supplied to the gate electrode 106 of the NMOS transistor Qn3. The input signal IN3 is further supplied to the gate electrode 106 of the PMOS transistor Qp3 via the gate line 106*e*.

In a transistor arrangement method according to this embodiment, the power supply line Vcc (113*a*), the PMOS transistors Qp1, Qp2, and Qp3 arranged in the second row, the NMOS transistors Qn1, Qn2, and Qn3 arranged in the first row, and the reference power supply line Vss (113c) are arranged in this order from top to bottom in FIG. 16A. The 3-input NOR circuit having the configuration described above, which includes the power supply line Vcc (113a) and the reference power supply line Vss (113c), is defined as a block BL313.

Further, letting the distance between the power supply line 113a and the reference power supply line 113c be Ly (the distance between the power supply line and the reference power supply line (both inclusive)), the standardization is carried out. Such standardization advantageously facilitates connection of a power supply line and a reference power supply line merely by arranging the block BL313 according to this embodiment and other blocks side by side.

This embodiment enables six SGTs constituting a 3-input NOR circuit to be arranged in two rows and three columns, without using any unnecessary lines or contact regions, and can provide a semiconductor device with a reduced area.

Eleventh Embodiment

Figure 17B:
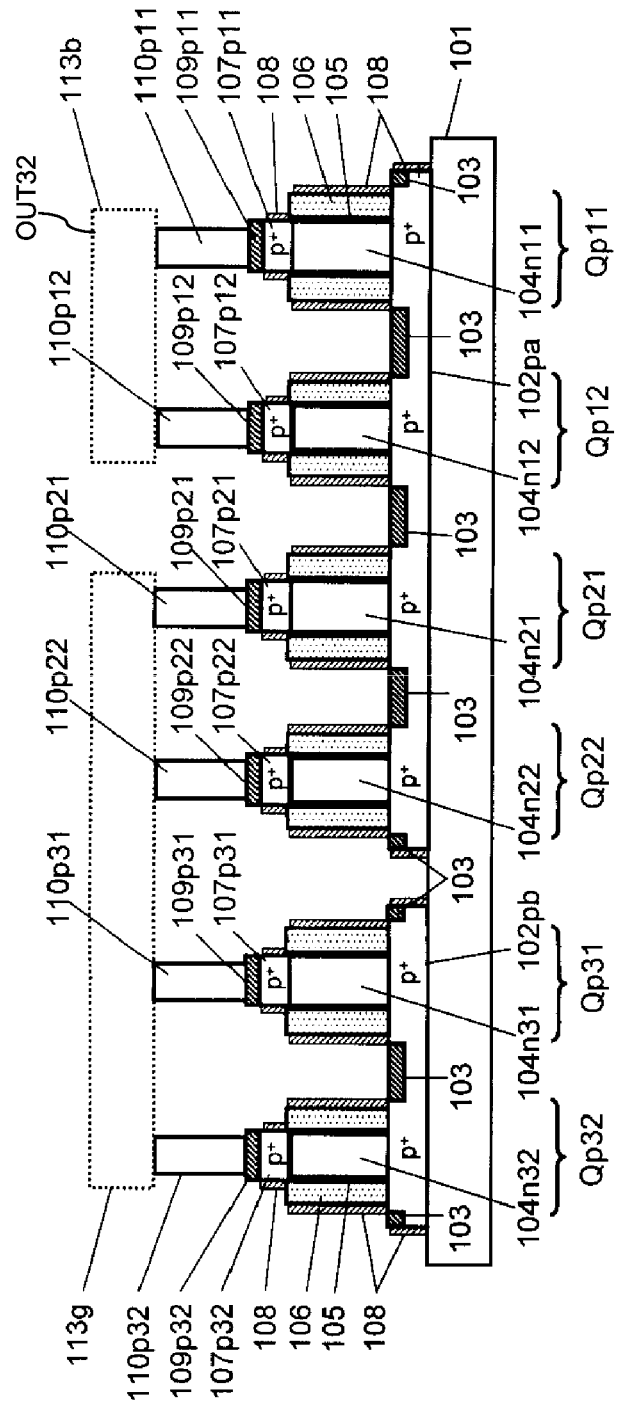
FIG. 17B is a cross-sectional view of the NOR circuit according to the eleventh embodiment of the present invention.
Figure 17C:
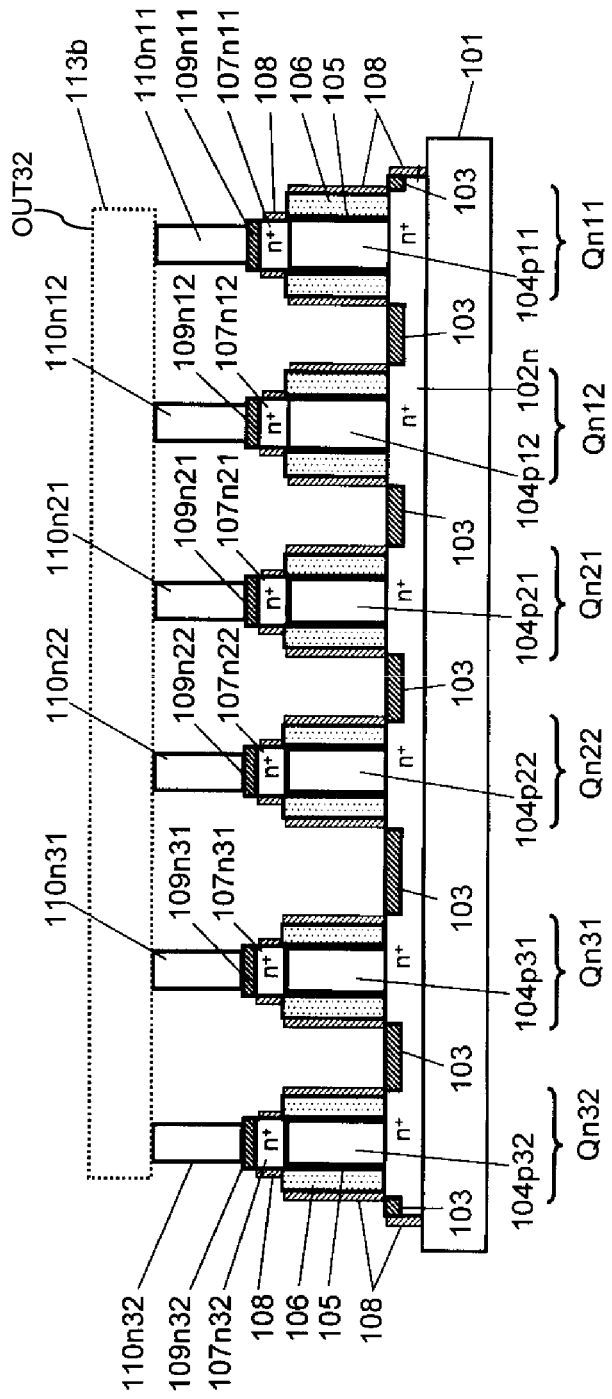
FIG. 17C is a cross-sectional view of the NOR circuit according to the eleventh embodiment of the present invention.

FIG. 17A, FIG. 17B, and FIG. 17C illustrate an eleventh embodiment. An equivalent circuit diagram is as illustrated in FIG. 7. FIG. 17A is a plan view of a layout (arrangement) of a 3-input NOR circuit according to the eleventh embodiment of the present invention, FIG. 17B is a cross-sectional view taken along a cut-line A-A', and FIG. 17C is a cross-sectional view taken along a cut-line B-B'. Cross-sectional views taken along vertical lines are equivalent to those illustrated in FIG. 16D and FIG. 16E, and are not illustrated.

In FIG. 17A, the NMOS transistors Qn11, Qn12, Qn21, Qn22, Qn31, and Qn32 of the NOR circuit illustrated in FIG. 7 are arranged in the first row (the bottom row in FIG. 17A) in order from right to left in FIG. 17A, and the PMOS transistors Qp11, Qp12, Qp21, Qp22, Qp31, and Qp32 are arranged in the second row (the top row in FIG. 17A) in order from right to left in FIG. 17A.

The difference from FIG. 16A is that the PMOS transistors Qp11 and Qp12 connected in parallel are arranged adjacent to one another, and the NMOS transistors Qn11 and Qn12 connected in parallel are also arranged adjacent to one another. The other transistors also have similar arrangements.

In FIG. 17A, FIG. 17B, and FIG. 17C, the same or substantially the same structures as those illustrated in FIG. 16A, FIG. 16B, and FIG. 16C are denoted by the same reference numerals in the 100s.

An insulating film such as a buried oxide (BOX) film layer 101 disposed on a substrate has formed thereon planar silicon layers 102n, 102pa, and 102pb. The planar silicon layers 102n, 102pa, and 102pb are formed as an n+ diffusion layer, a p+ diffusion layer, and a p+ diffusion layer, respectively, through impurity implantation or the like. A silicide layer 103 is disposed on surfaces of the planar silicon layers (102n, 102pa, and 102pb). Reference numerals 104n11, 104n12, 104n21, 104n22, 104n31, and 104n32 denote n-type silicon pillars, and reference numerals 104p11, 104p12, 104p21, 104p22, 104p31, and 104p32 denote p-type silicon pillars. Reference numeral 105 denotes a gate insulating film that surrounds each of the silicon pillars 104n11, 104n12, 104n21, 104n22, 104n31, 104n32, 104p11, 104p12, 104p21, 104p22, 104p31, and 104p32. Reference numeral 106 denotes a gate electrode, and reference numerals 106a, 106b, 106c, 106d, 106e, 106f, 106g, 106h, 106i, 106j, 106k, and 106l denote each a gate line. P+ diffusion layers 107p11, 107p12, 107p21, 107p22, 107p31, and 107p32 are formed on top portions of the silicon pillars 104n11, 104n12, 104n21, 104n22, 104n31, and 104n32, respectively, through impurity implantation or the like, and n+ diffusion layers 107n11, 107n12, 107n21, 107n22, 107n31, and 107n32 are formed on top portions of the silicon pillars 104p11, 104p12, 104p21, 104p22, 104p31, and 104p32, respectively, through impurity implantation or the like. Reference numeral 108 denotes a silicon nitride film for protection of the gate insulating film 105. Reference numerals 109p11, 109p12, 109p21, 109p22, 109p31, 109p32, 109n11, 109n12, 109n21, 109n22, 109n31, and 109n32 denote silicide layers connected to the p+ diffusion layers 107p11, 107p12, 107p21, 107p22, 107p31, and 107p32 and the n+ diffusion layers 107n11, 107n12, 107n21, 107n22, 107n31, and 107n32, respectively. Reference numerals 110p11, 110p12, 110n11, 110n12, 110n21, 110n22, 110n31, and 110n32 denote contacts that connect the silicide layers 109p11, 109p12, 109n11, 109n12, 109n21, 109n22, 109n31, and 109n32 to a first metal line 113b, and reference numerals 110p21, 110p22, 110p31, and 110p32 denote contacts that connect the silicide layers 109p21, 109p22, 109p31, and 109p32 to a first metal line 113g. Reference numeral 111a denotes a contact that connects the gate line 106b to a first metal line 113d, reference numeral 111b denotes a contact that connects the gate line 106d to the first metal line 113d, reference numeral 111c denotes a contact that connects the gate line 106f to a first metal line 113e, reference numeral 111d denotes a contact that connects the gate line 106h to the first metal line 113e, reference numeral 111e denotes a contact that connects the gate line 106j to a first metal line 113f, and reference numeral 111f denotes a contact that connects the gate line 106l to the first metal line 113f. In the following, the planar silicon layers 102n, 102pa, and 102pb are also referred to as the lower diffusion layers 102n, 102pa, and 102pb, and the diffusion layers 107p11, 107p12, 107p21, 107p22, 107p31, 107p32, 107n11, 107n12, 107n21, 107n22, 107n31, and 107n32 are also referred to as the upper diffusion layers 107p11, 107p12, 107p21, 107p22, 107p31, 107p32, 107n11, 107n12, 107n21, 107n22, 107n31, and 107n32.

Reference numeral 112a denotes contacts (in FIG. 17A, three contacts) that connect the silicide layer 103 which covers the lower diffusion layer 102pb to a first metal line 113a, and reference numeral 112b denotes contacts (in FIG. 17A, seven contacts) that connect the silicide layer 103 which covers the lower diffusion layer 102n to a first metal line 113c.

The silicon pillar 104n11, the lower diffusion layer 102pa, the upper diffusion layer 107p11, the gate insulating film 105, and the gate electrode 106 constitute the PMOS transistor Qp11. The silicon pillar 104n12, the lower diffusion layer 102pa, the upper diffusion layer 107p12, the gate insulating film 105, and the gate electrode 106 constitute the PMOS transistor Qp12. The silicon pillar 104n21, the lower diffusion layer 102pa, the upper diffusion layer 107p21, the gate insulating film 105, and the gate electrode 106 constitute the PMOS transistor Qp21. The silicon pillar 104n22, the lower diffusion layer 102pa, the upper diffusion layer 107p22, the gate insulating film 105, and the gate electrode 106 constitute the PMOS transistor Qp22. The silicon pillar 104n31, the lower diffusion layer 102pb, the upper diffusion layer 107p31, the gate insulating film 105, and the gate electrode 106 constitute the PMOS transistor Qp31. The silicon pillar 104n32, the lower diffusion layer 102pb, the upper diffusion layer 107p32, the gate insulating film 105, and the gate electrode 106 constitute the PMOS transistor Qp32. The silicon pillar 104p11, the lower diffusion layer 102*n*, the upper diffusion layer 107*n*11, the gate insulating film 105, and the gate electrode 106 constitute the NMOS transistor Qn11. The silicon pillar 104*p*12, the lower diffusion layer 102*n*, the upper diffusion layer 107*n*12, the gate insulating film 105, and the gate electrode 106 constitute the NMOS transistor Qn12. The silicon pillar 104*p*21, the lower diffusion layer 102*n*, the upper diffusion layer 107*n*21, the gate insulating film 105, and the gate electrode 106 constitute the NMOS transistor Qn21. The silicon pillar 104*p*22, the lower diffusion layer 102*n*, the upper diffusion layer 107*n*22, the gate insulating film 105, and the gate electrode 106 constitute the NMOS transistor Qn22. The silicon pillar 104*p*31, the lower diffusion layer 102*n*, the upper diffusion layer 107*n*31, the gate insulating film 105, and the gate electrode 106 constitute the NMOS transistor Qn31. The silicon pillar 104*p*32, the lower diffusion layer 102*n*, the upper diffusion layer 107*n*32, the gate insulating film 105, and the gate electrode 106 constitute the NMOS transistor Qn32.

In addition, the gate line 106*a* is connected to the gate electrode 106 of the PMOS transistor Qp11, the gate line 106*c* is connected to the gate electrode 106 of the PMOS transistor Qp12, the gate line 106*e* is connected to the gate electrode 106 of the PMOS transistor Qp21, the gate line 106*g* is connected to the gate electrode 106 of the PMOS transistor Qp22, the gate line 106*i* is connected to the gate electrode 106 of the PMOS transistor Qp31, and the gate line 106*k* is connected to the gate electrode 106 of the PMOS transistor Qp32. The gate lines 106*a* and 106*b* are connected to the gate electrode 106 of the NMOS transistor Qn11, the gate lines 106*c* and 106*d* are connected to the gate electrode 106 of the NMOS transistor Qn12, the gate lines 106*e* and 106*f* are connected to the gate electrode 106 of the NMOS transistor Qn21, the gate lines 106*g* and 106*h* are connected to the gate electrode 106 of the NMOS transistor Qn22, the gate lines 106*i* and 106*j* are connected to the gate electrode 106 of the NMOS transistor Qn31, and the gate lines 106*k* and 106*l* are connected to the gate electrode 106 of the NMOS transistor Qn32.

Sources of the NMOS transistors Qn11, Qn12, Qn21, Qn22, Qn31, and Qn32 serve as the lower diffusion layer 102*n*, and are connected to the first metal line 113*c* via the silicide layer 103 and the contacts 112*b*, and the first metal line 113*c* is supplied with the reference power supply Vss. The upper diffusion layer 107*n*11, which is a drain of the NMOS transistor Qn11, is connected to the first metal line 113*b* via the silicide layer 109*n*11 and the contact 110*n*11, and the first metal line 113*b* serves as the output OUT32. The upper diffusion layer 107*n*12, which is a drain of the NMOS transistor Qn12, is connected to the first metal line 113*b* via the silicide layer 109*n*12 and the contact 110*n*12. Further, the upper diffusion layer 107*n*21, which is a drain of the NMOS transistor Qn21, is connected to the first metal line 113*b* via the silicide layer 109*n*21 and the contact 110*n*21. The upper diffusion layer 107*n*22, which is a drain of the NMOS transistor Qn22, is connected to the first metal line 113*b* via the silicide layer 109*n*22 and the contact 110*n*22. The upper diffusion layer 107*n*31, which is a drain of the NMOS transistor Qn31, is connected to the first metal line 113*b* via the silicide layer 109*n*31 and the contact 110*n*31. Further, the upper diffusion layer 107*n*32, which is a drain of the NMOS transistor Qn32, is connected to the first metal line 113*b* via the silicide layer 109*n*32 and the contact 110*n*32. The upper diffusion layer 107*p*11, which is a drain of the PMOS transistor Qp11, is connected to the first metal line 113*b* via the silicide layer 109*p*11 and the contact 110*p*11. The upper diffusion layer 107*p*12, which is a drain of the PMOS transistor Qp12, is connected to the first metal line 113*b* via the silicide layer 109*p*12 and the contact 110*p*12.

As described above, the drains of the NMOS transistors Qn11, Qn12, Qn21, Qn22, Qn31, and Qn32, the drain of the PMOS transistor Qp11, and the drain of the PMOS transistor Qp12 are connected commonly to the first metal line 113*b* via the contacts 110*n*11, 110*n*12, 110*n*21, 110*n*22, 110*n*31, 110*n*32, 110*p*11, and 110*p*12, respectively, and the first metal line 113*b* serves as the output OUT32. The lower diffusion layer 102*pa* serving as the sources of the PMOS transistors Qp11 and Qp12 is connected to the drains of the PMOS transistors Qp21 and Qp22 via the silicide layer 103. The upper diffusion layer 107*p*21, which is a source of the PMOS transistor Qp21, is connected to the first metal line 113*g* via the silicide layer 109*p*21 and the contact 110*p*21. The upper diffusion layer 107*p*22, which is a source of the PMOS transistor Qp22, is also connected to the first metal line 113*g* via the silicide layer 109*p*22 and the contact 110*p*22. The upper diffusion layer 107*p*31, which is a drain of the PMOS transistor Qp31, is connected to the first metal line 113*g* via the silicide layer 109*p*31 and the contact 110*p*31. The upper diffusion layer 107*p*32, which is a drain of the PMOS transistor Qp32, is also connected to the first metal line 113*g* via the silicide layer 109*p*32 and the contact 110*p*32. Here, the sources of the PMOS transistors Qp21 and Qp22 and the drains of the PMOS transistors Qp31 and Qp32 are connected to one another via the first metal line 113*g*. Further, sources of the PMOS transistors Qp31 and Qp32 are connected to the first metal line 113*a* via the lower diffusion layer 102*pb*, the silicide layer 103, and the contacts 112*a*, and the first metal line 113*a* is supplied with the power supply Vcc.

The input signal IN1 is supplied to the first metal line 113*d*, connected to the gate line 106*b* via the contact 111*a*, and supplied to the gate electrode 106 of the NMOS transistor Qn11. The input signal IN1 is further supplied to the gate electrode 106 of the PMOS transistor Qp11 via the gate line 106*a*. Further, the first metal line 113*d* is connected to the gate line 106*d* via the contact 111*b*, and the input signal IN1 is supplied to the gate electrode 106 of the NMOS transistor Qn12. The input signal IN1 is further supplied to the gate electrode 106 of the PMOS transistor Qp12 via the gate line 106*c*.

The input signal IN2 is supplied to the first metal line 113*e*, connected to the gate line 106*f* via the contact 111*c*, and supplied to the gate electrode 106 of the NMOS transistor Qn21. The input signal IN2 is further supplied to the gate electrode 106 of the PMOS transistor Qp21 via the gate line 106*e*. Further, the first metal line 113*e* is connected to the gate line 106*h* via the contact 111*d*, and the input signal IN2 is supplied to the gate electrode 106 of the NMOS transistor Qn22. The input signal IN2 is further supplied to the gate electrode 106 of the PMOS transistor Qp22 via the gate line 106*g*.

The input signal IN3 is supplied to the first metal line 113*f*, connected to the gate line 106*j* via the contact 111*e*, and supplied to the gate electrode 106 of the NMOS transistor Qn31. The input signal IN3 is further supplied to the gate electrode 106 of the PMOS transistor Qp31 via the gate line 106*i*. Further, the first metal line 113*f* is connected to the gate line 106*l* via the contact 111*f*, and the input signal IN3 is supplied to the gate electrode 106 of the NMOS transistor Qn32. The input signal IN3 is further supplied to the gate electrode 106 of the PMOS transistor Qp32 via the gate line 106*k*.

The 3-input NOR circuit having the configuration described above, which includes the power supply line Vcc (113*a*) and the reference power supply line Vss (113*c*), is defined as a block BL323.

Further, as in the first embodiment (FIG. 2A), the distance between the power supply line 113*a* and the reference power supply line 113*c* is represented by Ly (the distance between the power supply line and the reference power supply line (both inclusive)).

This embodiment enables twelve SGTs in a 3-input NOR circuit having a configuration in which two NMOS transistors are connected in parallel and two PMOS transistors are connected in parallel at each input to be arranged in two rows and six columns, without using any unnecessary lines or contact regions, and can provide a semiconductor device with a reduced area.

In this embodiment, the numbers of transistors connected in parallel are each two. Alternatively, more than two transistors may be connected in parallel. In a case where, for example, three transistors are connected in parallel, the additional transistor may further be arranged laterally to achieve an arrangement of two rows and nine columns.

Twelfth Embodiment

In the embodiments described above, an arrangement has been described using an example of a process in which planar silicon layers are arranged on top of an insulating film such as a buried oxide (BOX) film layer disposed on a substrate. Alternatively, a bulk CMOS process may be used. By way of example, FIGS. 18A to 18E illustrate a twelfth embodiment in which the arrangement in the embodiment illustrated in FIGS. 2A to 2E is based on a bulk CMOS process.

Figure 18A:
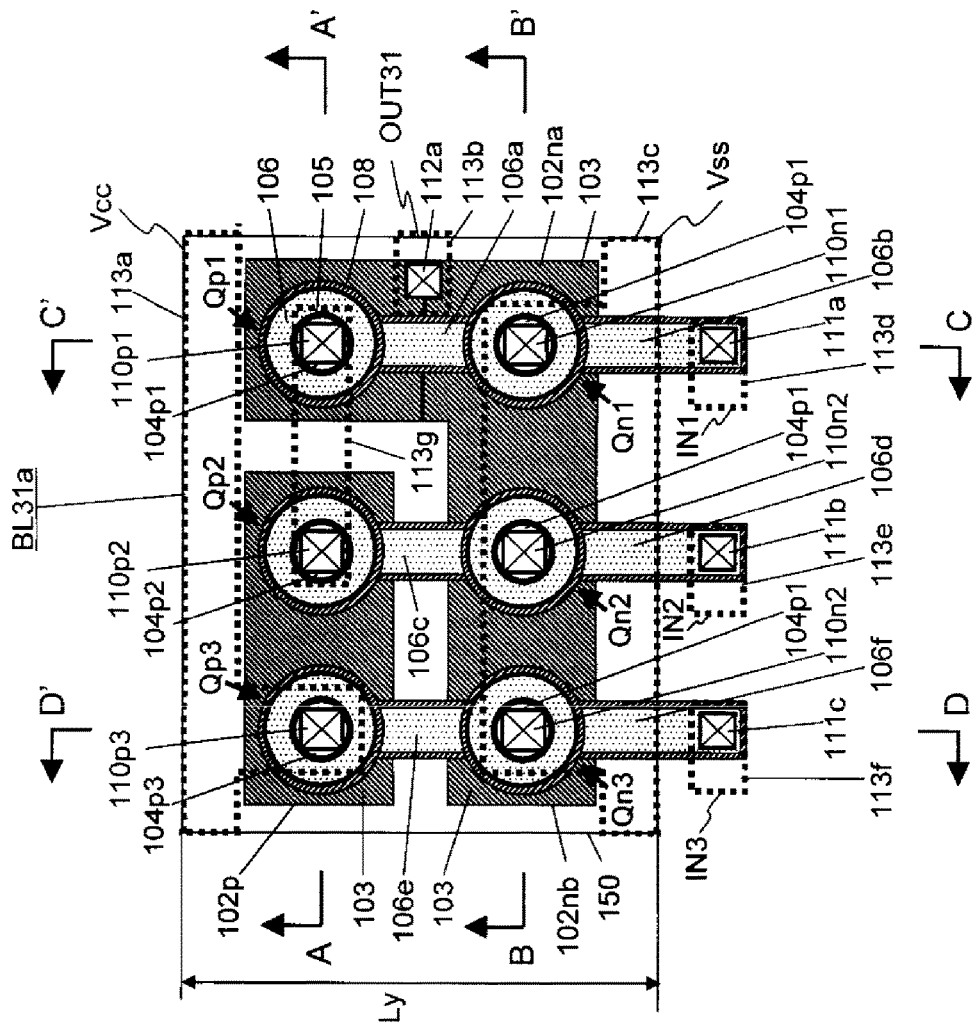
FIG. 18A is a plan view of a NOR circuit according to a twelfth embodiment of the present invention.
Figure 18B:
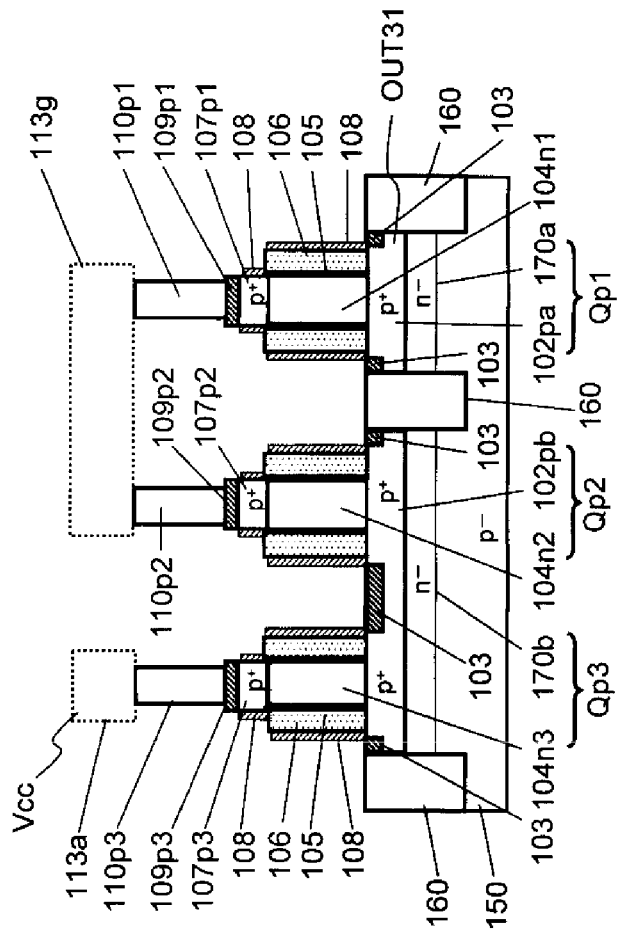
FIG. 18B is a cross-sectional view of the NOR circuit according to the twelfth embodiment of the present invention.
Figure 18C:
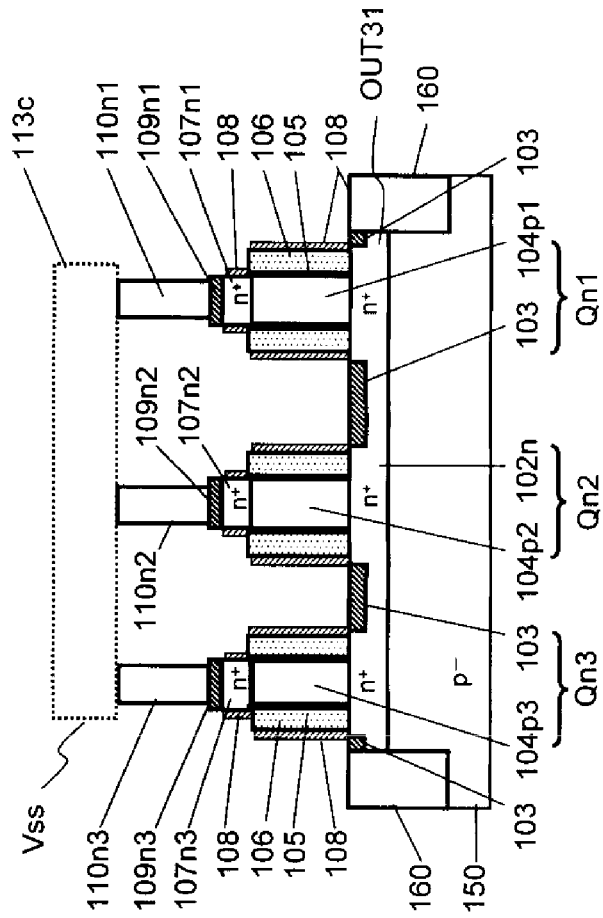
FIG. 18C is a cross-sectional view of the NOR circuit according to the twelfth embodiment of the present invention.
Figure 18D:
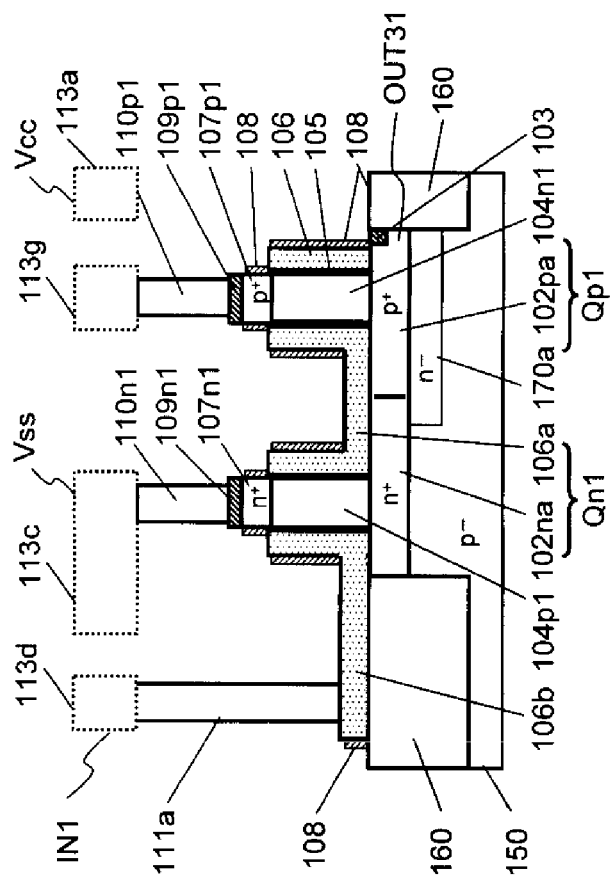
FIG. 18D is a cross-sectional view of the NOR circuit according to the twelfth embodiment of the present invention.
Figure 18E:
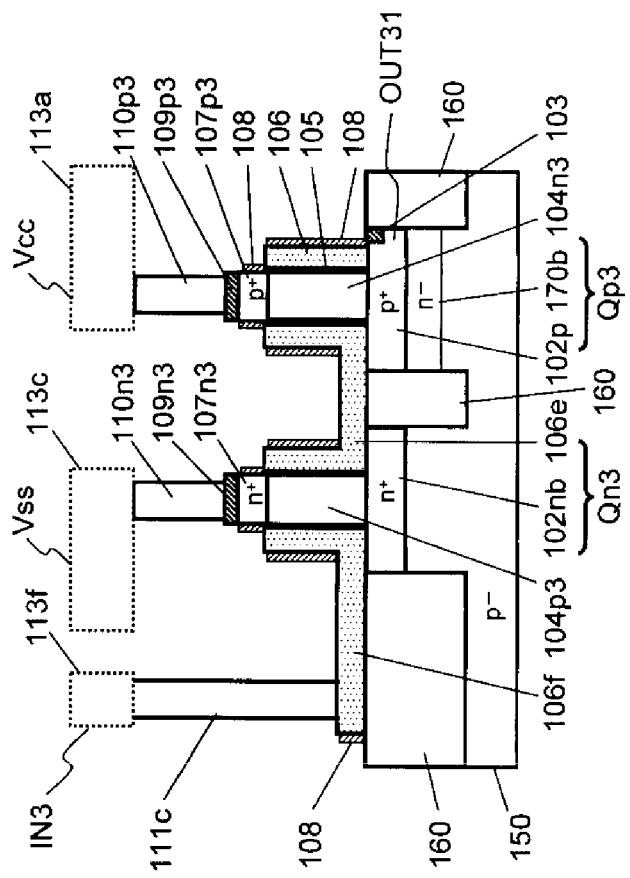
FIG. 18E is a cross-sectional view of the NOR circuit according to the twelfth embodiment of the present invention.
Figure 19:
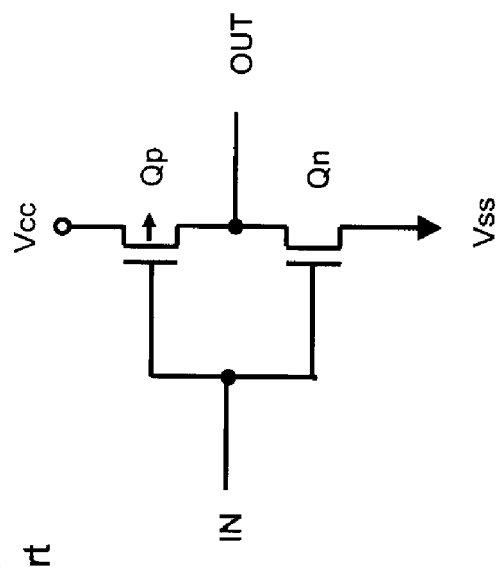
FIG. 19 illustrates an equivalent circuit of an inverter circuit according to the prior art.

FIG. 18A is a plan view of a layout (arrangement) of a 3-input NOR circuit according to the twelfth embodiment of the present invention, FIG. 18B is a cross-sectional view taken along a cut-line A-A', FIG. 18C is a cross-sectional view taken along a cut-line B-B', FIG. 18D is a cross-sectional view taken along a cut-line C-C', and FIG. 18E is a cross-sectional view taken along a cut-line D-D'.

In FIG. 18A, FIG. 18B, FIG. 18C, FIG. 18D, and FIG. 18E, the same or substantially the same structural portions as those illustrated in FIG. 2A, FIG. 2B, FIG. 2C, FIG. 2D, and FIG. 2E are denoted by equivalent reference numerals in the 100s.

Referring to Japanese Patent No. 4756221, there is substantially no difference between the plan view in FIG. 2A for the BOX process and that in FIG. 18A for the bulk CMOS process but there is a difference between the cross-sectional views in FIG. 18B, FIG. 18C, FIG. 18D, and FIG. 18E for the bulk CMOS process and those in FIG. 2B, FIG. 2C, FIG. 2D, and FIG. 2E for the BOX process. In FIG. 18B, reference numeral 150 denotes a p-type silicon substrate. Reference numeral 160 denotes an element-isolation insulator. Further, reference numeral 170 denotes an n-region which serves as a leakage-preventing isolation layer. The processes and structures of elements above the lower diffusion layers, other than the p-type silicon substrate 150, the element-isolation insulator 160, and the leakage-preventing isolation layer 170, are the same, and the first to eleventh embodiments of the present invention are implementable using the bulk CMOS process.

While the first to twelfth embodiments have been described, in addition to the drawings for the respective embodiments, the area reduction method using second metal lines according to the eighth embodiment (FIG. 14A) is also applicable to the tenth embodiment (FIG. 16A). In addition, an arrangement of m rows and n columns in the sixth embodiment (FIG. 11A) or the seventh embodiment (FIG. 13A) is also applicable to an example of second metal lines in the eleventh embodiment (FIG. 17A).

In the embodiments disclosed herein, the silicon pillar of a PMOS transistor is defined as an n-type silicon layer, and the silicon pillar of an NMOS transistor is defined as a p-type silicon layer, for convenience of description. In a process for miniaturization, however, densities obtained through impurity implantation are difficult to control. Thus, a so-called neutral (or intrinsic) semiconductor with no impurity implantation is used for both the silicon pillar of a PMOS transistor and the silicon pillar of an NMOS transistor, and differences in work function which is unique to a metal gate material may be used for channel control, that is, thresholds of PMOS and NMOS transistors.

In the embodiments disclosed herein, furthermore, lower diffusion layers or upper diffusion layers are covered with silicide layers. Silicide is used to make resistance low and is not intended to be limiting in any sense. Any other low-resistance material or metal may be used.

A centrally important feature of the present invention is to reduce an area by commonly connecting drains of transistors, which are connected to an output terminal, via lower diffusion layers, or to reduce an area by commonly connecting drains of transistors, which are connected to an output terminal, via upper diffusion layers and contacts. Any wiring method and wiring positions of gate lines, any wiring method and wiring positions of metal lines, and so forth that are achievable in accordance with the arrangements of the transistors given in the essence of the present invention, other than those illustrated in the drawings for the respective embodiments, also fall within the technical scope of the present invention.

The invention claimed is:

1. A semiconductor device, comprising:
a plurality of transistors arranged in two rows and n columns on a substrate, where n≥2, to constitute a NOR circuit, each of the plurality of transistors having a source, a drain, and a gate arranged in layers in a direction perpendicular to the substrate,
each of the plurality of transistors including:
a silicon pillar,
an insulator that surrounds a side surface of the silicon pillar,
a gate surrounding the insulator,
a source region disposed on an upper portion or a lower portion of the silicon pillar, and
a drain region disposed on an upper portion or a lower portion of the silicon pillar, the drain region being located on a side of the silicon pillar opposite to a side of the silicon pillar on which the source region is located;
the plurality of transistors including:
n n-channel MOS transistors arranged in one row and n columns, and
n p-channel MOS transistors arranged in one row and n columns,
wherein the n n-channel MOS transistors and the n p-channel MOS transistors are arranged such that
an n-channel MOS transistor in a k-th column and a p-channel MOS transistor in the k-th column form a pair, where k=1 to n, the gate of the n-channel MOS transistor in the k-th column and the gate of the p-channel MOS transistor in the k-th column being connected to one another, the drain regions of the n n-channel MOS transistors and the drain region of a p-channel MOS transistor in a first column are located on a side of the silicon pillars close to the substrate, the drain regions of the n n-channel MOS transistors and the drain region of the p-channel MOS transistor in the first column being connected to one another via a silicide region, and the source region of a p-channel MOS transistor in an s-th column and the drain region of a p-channel MOS transistor in an (s+1)-th column are connected to one another, where s=1 to n−1.

2. The semiconductor device according to claim 1, wherein:

the source regions of the n n-channel MOS transistors are connected to a reference power supply line extending along a row, and the source region of a p-channel MOS transistor in an n-th column is connected to a power supply line extending along a row.

3. The semiconductor device according to claim 1, wherein the n p-channel MOS transistors are arranged such that the source region of a p-channel MOS transistor in an even-numbered column is located on the side of the silicon pillar close to the substrate.

4. The semiconductor device according to claim 1, wherein n input signals are connected to gates of n pairs of transistors whose gates are connected to one another so that each of the n input signals corresponds to gates of one of the n pairs of transistors.

5. The semiconductor device according to claim 4, wherein:

the source regions of the n n-channel MOS transistors are connected to a reference power supply line extending along a row, and the source region of a p-channel MOS transistor in an n-th column is connected to a power supply line extending along a row, each of the power supply line and the reference power supply line comprises a first metal line, and each of the n input signals comprises a second metal line extending in a direction perpendicular to the power supply line and the reference power supply line.

\* \* \* \* \*